United States Patent
Kusano

(10) Patent No.: US 9,160,318 B2
(45) Date of Patent: Oct. 13, 2015

(54) DATA PROCESSING CIRCUIT AND SOLID-STATE IMAGING DEVICE

(71) Applicant: OLYMPUS CORPORATION, Tokyo (JP)

(72) Inventor: Yosuke Kusano, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 204 days.

(21) Appl. No.: 14/030,225

(22) Filed: Sep. 18, 2013

(65) Prior Publication Data

US 2014/0084140 A1 Mar. 27, 2014

(30) Foreign Application Priority Data

Sep. 24, 2012 (JP) ................................. 2012-209541

(51) Int. Cl.
*H03K 3/86* (2006.01)
*H01L 27/146* (2006.01)
*H04N 5/378* (2011.01)

(52) U.S. Cl.
CPC ............ *H03K 3/86* (2013.01); *H01L 27/14601* (2013.01); *H04N 5/378* (2013.01)

(58) Field of Classification Search
CPC ..... H03K 3/86; H01L 27/14601; H04N 5/378

USPC .......................................... 250/208.1, 214 DC
See application file for complete search history.

(56) References Cited

U.S. PATENT DOCUMENTS

| 5,384,494 A * | 1/1995 | Henson et al. ................. 327/202 |
| 7,292,672 B2 * | 11/2007 | Isono .............................. 377/64 |
| 8,291,201 B2 * | 10/2012 | Schwinn et al. ............... 712/229 |
| 2006/0082400 A1 * | 4/2006 | Isono ............................ 327/141 |

FOREIGN PATENT DOCUMENTS

| JP | 2010-258806 A | 11/2010 |
| JP | 2011-166235 A | 8/2011 |

* cited by examiner

*Primary Examiner* — Seung C Sohn
(74) *Attorney, Agent, or Firm* — Westerman, Hattori, Daniels & Adrian, LLP

(57) ABSTRACT

A data processing circuit that holds a state of a clock signal of each phase of an input multi-phase clock at a timing of an input latch clock, the multi-phase clock including clock signals of a plurality of phases sequentially shifted at certain intervals determined in advance, and generates a digital signal obtained by digitizing the states of the phases of the multi-phase clock at a timing at which the latch clock is input, the data processing circuit including: a latch portion including n latch unit groups (n is an integer of a power of 2) including the same number and a plurality of latch units, each latch unit holding the state of the clock signal of the corresponding phase of the multi-phase clock and outputting an output signal indicating the held state of the clock signal.

15 Claims, 25 Drawing Sheets

FIG. 4

| STATE NO. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| OUTPUT SIGNAL OF LATCH CIRCUIT DO[7:0] [0] | 0 | 1 | 1 | 1 | 1 | 1 | 1 | 1 | 1 | 0 | 0 | 0 | 0 | 0 | 0 | 0 |
| [1] | 0 | 0 | 1 | 1 | 1 | 1 | 1 | 1 | 1 | 1 | 0 | 0 | 0 | 0 | 0 | 0 |
| [2] | 0 | 0 | 0 | 1 | 1 | 1 | 1 | 1 | 1 | 1 | 1 | 0 | 0 | 0 | 0 | 0 |
| [3] | 0 | 0 | 0 | 0 | 1 | 1 | 1 | 1 | 1 | 1 | 1 | 1 | 0 | 0 | 0 | 0 |
| [4] | 0 | 0 | 0 | 0 | 0 | 1 | 1 | 1 | 1 | 1 | 1 | 1 | 1 | 0 | 0 | 0 |
| [5] | 0 | 0 | 0 | 0 | 0 | 0 | 1 | 1 | 1 | 1 | 1 | 1 | 1 | 1 | 0 | 0 |
| [6] | 0 | 0 | 0 | 0 | 0 | 0 | 0 | 1 | 1 | 1 | 1 | 1 | 1 | 1 | 1 | 0 |
| [7] | 0 | 0 | 0 | 0 | 0 | 0 | 0 | 0 | 1 | 1 | 1 | 1 | 1 | 1 | 1 | 1 |
| SWITCH OF DATA SELECTION UNIT (=DO[3]⊕DO[7]) | 0(L) SELECT DO[3:0] | | | | 1(H) SELECT DO[7:4] | | | | 0(L) SELECT DO[3:0] | | | | 1(H) SELECT DO[7:4] | | | |
| SWITCH OF EDGE DETECTION UNIT (=DO[7]) | 0(L) SELECT RCLK | | | | | | | | 1(H) SELECT FCLK | | | | | | | |
| DIGITAL SIGNAL DOUT[3:0] (BINARY NUMBER) [0] | 0 | 1 | 0 | 1 | 0 | 1 | 0 | 1 | 0 | 1 | 0 | 1 | 0 | 1 | 0 | 1 |
| [1] | 0 | 0 | 1 | 1 | 0 | 0 | 1 | 1 | 0 | 0 | 1 | 1 | 0 | 0 | 1 | 1 |
| [2] | 0 | 0 | 0 | 0 | 1 | 1 | 1 | 1 | 0 | 0 | 0 | 0 | 1 | 1 | 1 | 1 |
| [3] | 0 | 0 | 0 | 0 | 0 | 0 | 0 | 0 | 1 | 1 | 1 | 1 | 1 | 1 | 1 | 1 |
| DIGITAL SIGNAL DOUT[3:0] (DECIMAL NUMBER) | 0 | 1 | 2 | 3 | 4 | 5 | 6 | 7 | 8 | 9 | 10 | 11 | 12 | 13 | 14 | 15 |

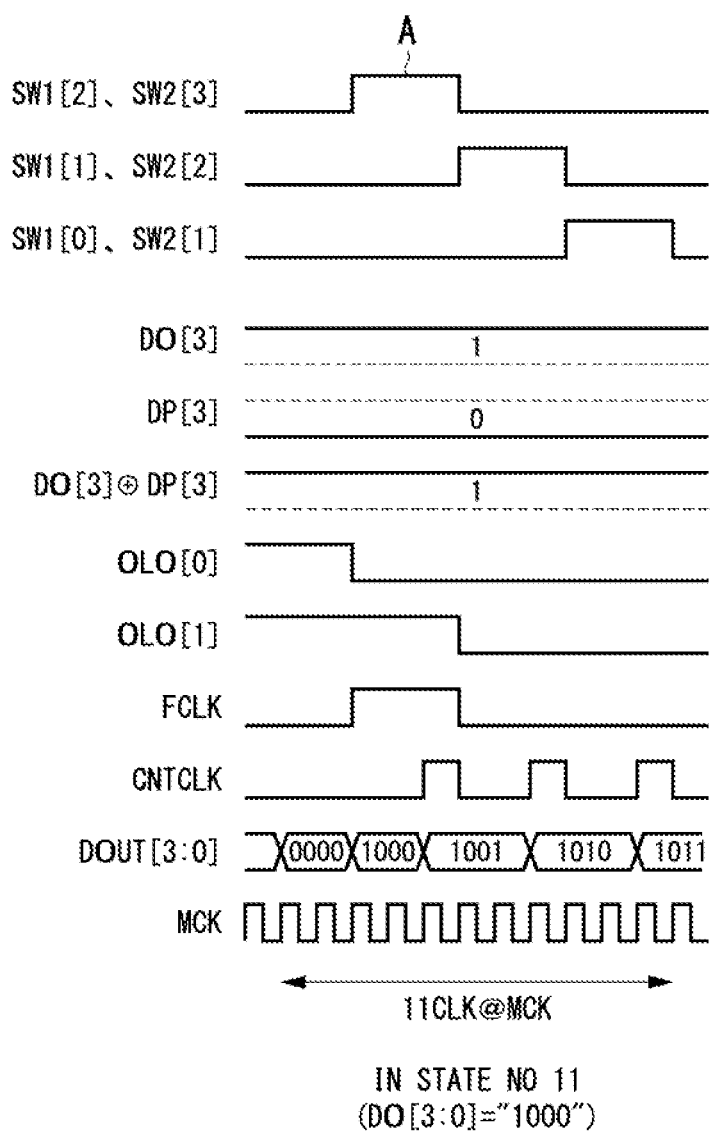

FIG. 8

| STATE NO. | | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| OUTPUT SIGNAL OF LATCH CIRCUIT DO[3:0] | [0] | 0 | 1 | 1 | 1 | 1 | 1 | 1 | 1 | 0 | 0 | 0 | 0 | 0 | 0 | 0 | 0 |
| | [1] | 0 | 0 | 1 | 1 | 1 | 1 | 1 | 1 | 1 | 1 | 0 | 0 | 0 | 0 | 0 | 0 |
| | [2] | 0 | 0 | 0 | 1 | 1 | 1 | 1 | 1 | 1 | 1 | 1 | 1 | 0 | 0 | 0 | 0 |
| | [3] | 0 | 0 | 0 | 0 | 1 | 1 | 1 | 1 | 1 | 1 | 1 | 1 | 1 | 1 | 1 | 0 |
| OUTPUT SIGNAL OF LATCH CIRCUIT DP[3:0] | [0] | 1 | 1 | 1 | 1 | 1 | 1 | 1 | 0 | 0 | 0 | 0 | 0 | 0 | 0 | 1 | 1 |
| | [1] | 1 | 1 | 1 | 1 | 1 | 1 | 0 | 0 | 0 | 0 | 0 | 0 | 0 | 1 | 1 | 1 |
| | [2] | 1 | 1 | 1 | 1 | 1 | 0 | 0 | 0 | 0 | 0 | 0 | 0 | 1 | 1 | 1 | 1 |
| | [3] | 1 | 1 | 1 | 1 | 0 | 0 | 0 | 0 | 0 | 0 | 0 | 1 | 1 | 1 | 1 | 1 |
| SWITCH OF DATA SELECTION UNIT (=DO[3]⊕DP[3]) | | 1(H) SELECT DO[3:0] | | | | 0(L) SELECT DP[3:0] | | | | 1(H) SELECT DO[3:0] | | | | 0(L) SELECT DP[3:0] | | | |
| SWITCH OF EDGE DETECTION UNIT (=DO[3]) | | 0(L) SELECT RCLK | | | | 1(H) SELECT FCLK | | | | 1(H) SELECT FCLK | | | | 0(L) SELECT RCLK | | | |
| DIGITAL SIGNAL DOUT[3:0] (BINARY NUMBER) | [0] | 0 | 1 | 0 | 1 | 0 | 1 | 0 | 1 | 0 | 1 | 0 | 1 | 0 | 1 | 0 | 1 |
| | [1] | 0 | 0 | 1 | 1 | 0 | 0 | 1 | 1 | 0 | 0 | 1 | 1 | 0 | 0 | 1 | 1 |
| | [2] | 0 | 0 | 0 | 0 | 1 | 1 | 1 | 1 | 0 | 0 | 0 | 0 | 1 | 1 | 1 | 1 |
| | [3] | 0 | 0 | 0 | 0 | 0 | 0 | 0 | 0 | 1 | 1 | 1 | 1 | 1 | 1 | 1 | 1 |
| DIGITAL SIGNAL DOUT[3:0] (DECIMAL NUMBER) | | 0 | 1 | 2 | 3 | 4 | 5 | 6 | 7 | 8 | 9 | 10 | 11 | 12 | 13 | 14 | 15 |

FIG. 10

| STATE NO. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| OUTPUT SIGNAL OF LATCH CIRCUIT DO[15:0] [0] | 0 | 1 | 1 | 1 | 1 | 1 | 1 | 1 | 1 | 0 | 0 | 0 | 0 | 0 | 0 | 0 |
| [1] | 0 | 0 | 1 | 1 | 1 | 1 | 1 | 1 | 1 | 1 | 0 | 0 | 0 | 0 | 0 | 0 |
| [2] | 0 | 0 | 0 | 1 | 1 | 1 | 1 | 1 | 1 | 1 | 1 | 0 | 0 | 0 | 0 | 0 |
| [3] | 0 | 0 | 0 | 0 | 1 | 1 | 1 | 1 | 1 | 1 | 1 | 1 | 0 | 0 | 0 | 0 |
| [4] | 0 | 0 | 0 | 0 | 0 | 1 | 1 | 1 | 1 | 1 | 1 | 1 | 1 | 0 | 0 | 0 |
| [5] | 0 | 0 | 0 | 0 | 0 | 0 | 1 | 1 | 1 | 1 | 1 | 1 | 1 | 1 | 0 | 0 |
| [6] | 0 | 0 | 0 | 0 | 0 | 0 | 0 | 1 | 1 | 1 | 1 | 1 | 1 | 1 | 1 | 0 |
| [7] | 0 | 0 | 0 | 0 | 0 | 0 | 0 | 0 | 1 | 1 | 1 | 1 | 1 | 1 | 1 | 1 |
| [8] | 1 | 1 | 1 | 1 | 1 | 1 | 1 | 1 | 0 | 0 | 0 | 0 | 0 | 0 | 0 | 1 |
| [9] | 1 | 0 | 1 | 1 | 1 | 1 | 1 | 1 | 0 | 0 | 0 | 0 | 0 | 0 | 0 | 1 |
| [10] | 1 | 1 | 1 | 1 | 1 | 1 | 1 | 1 | 0 | 0 | 0 | 0 | 0 | 0 | 1 | 1 |
| [11] | 1 | 1 | 1 | 1 | 1 | 1 | 1 | 1 | 0 | 0 | 0 | 0 | 0 | 1 | 1 | 1 |
| [12] | 1 | 1 | 1 | 1 | 1 | 1 | 1 | 1 | 0 | 0 | 0 | 0 | 1 | 1 | 1 | 1 |
| [13] | 1 | 1 | 1 | 1 | 1 | 1 | 1 | 1 | 0 | 0 | 0 | 1 | 1 | 1 | 1 | 1 |
| [14] | 1 | 1 | 1 | 1 | 1 | 1 | 1 | 1 | 0 | 0 | 1 | 1 | 1 | 1 | 1 | 1 |
| [15] | 1 | 1 | 1 | 1 | 1 | 1 | 1 | 1 | 0 | 1 | 1 | 1 | 1 | 1 | 1 | 0 |
| SWITCH OF DATA SELECTION UNIT (=DO[7]) | 0(L) | | | | | | | | 1(H) | | | | | | | |
| | SELECT DO[7:0] | | | | | | | | SELECT DO[15:8] | | | | | | | |
| DIGITAL SIGNAL DOUT[3:0] (BINARY NUMBER) [0] | 0 | 1 | 0 | 1 | 0 | 1 | 0 | 1 | 0 | 1 | 0 | 1 | 0 | 1 | 0 | 1 |
| [1] | 0 | 0 | 1 | 1 | 0 | 0 | 1 | 1 | 0 | 0 | 1 | 1 | 0 | 0 | 1 | 1 |
| [2] | 0 | 0 | 0 | 0 | 1 | 1 | 1 | 1 | 0 | 0 | 0 | 0 | 1 | 1 | 1 | 1 |
| [3] | 0 | 0 | 0 | 0 | 0 | 0 | 0 | 0 | 1 | 1 | 1 | 1 | 1 | 1 | 1 | 1 |
| DIGITAL SIGNAL DOUT[3:0] (DECIMAL NUMBER) | 0 | 1 | 2 | 3 | 4 | 5 | 6 | 7 | 8 | 9 | 10 | 11 | 12 | 13 | 14 | 15 |

FIG. 12

| STATE NO. | | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| OUTPUT SIGNAL OF LATCH CIRCUIT DO[7:0] | [0] | 0 | 1 | 1 | 1 | 1 | 1 | 1 | 1 | 1 | 0 | 0 | 0 | 0 | 0 | 0 | 0 |
| | [1] | 0 | 0 | 1 | 1 | 1 | 1 | 1 | 1 | 1 | 1 | 0 | 0 | 0 | 0 | 0 | 0 |
| | [2] | 0 | 0 | 0 | 1 | 1 | 1 | 1 | 1 | 1 | 1 | 1 | 0 | 0 | 0 | 0 | 0 |
| | [3] | 0 | 0 | 0 | 0 | 1 | 1 | 1 | 1 | 1 | 1 | 1 | 1 | 0 | 0 | 0 | 0 |
| | [4] | 0 | 0 | 0 | 0 | 0 | 1 | 1 | 1 | 1 | 1 | 1 | 1 | 1 | 0 | 0 | 0 |
| | [5] | 0 | 0 | 0 | 0 | 0 | 0 | 1 | 1 | 1 | 1 | 1 | 1 | 1 | 1 | 0 | 0 |
| | [6] | 0 | 0 | 0 | 0 | 0 | 0 | 0 | 1 | 1 | 1 | 1 | 1 | 1 | 1 | 1 | 0 |
| | [7] | 0 | 0 | 0 | 0 | 0 | 0 | 0 | 0 | 1 | 1 | 1 | 1 | 1 | 1 | 1 | 1 |
| OUTPUT SIGNAL OF LATCH CIRCUIT DP[7:0] | [0] | 0 | 1 | 1 | 1 | 1 | 1 | 1 | 1 | 1 | 0 | 0 | 0 | 0 | 0 | 0 | 0 |
| | [1] | 1 | 1 | 1 | 1 | 1 | 1 | 1 | 1 | 0 | 0 | 0 | 0 | 0 | 0 | 0 | 1 |
| | [2] | 1 | 1 | 1 | 1 | 1 | 1 | 1 | 0 | 0 | 0 | 0 | 0 | 0 | 0 | 1 | 1 |
| | [3] | 1 | 1 | 1 | 1 | 1 | 1 | 0 | 0 | 0 | 0 | 0 | 0 | 0 | 1 | 1 | 1 |
| | [4] | 1 | 1 | 1 | 1 | 1 | 0 | 0 | 0 | 0 | 0 | 0 | 0 | 1 | 1 | 1 | 1 |
| | [5] | 1 | 1 | 1 | 1 | 0 | 0 | 0 | 0 | 0 | 0 | 0 | 1 | 1 | 1 | 1 | 1 |
| | [6] | 1 | 1 | 1 | 0 | 0 | 0 | 0 | 0 | 0 | 0 | 1 | 1 | 1 | 1 | 1 | 1 |
| | [7] | 1 | 1 | 0 | 0 | 0 | 0 | 0 | 0 | 0 | 1 | 1 | 1 | 1 | 1 | 1 | 0 |
| SWITCH OF DATA SELECTION UNIT (=DO[7]) | | 0 (L) | | | | | | | | 1 (H) | | | | | | | |
| | | SELECT DO[7:0] | | | | | | | | SELECT DP[7:0] | | | | | | | |
| DIGITAL SIGNAL DOUT[3:0] (BINARY NUMBER) | [0] | 0 | 1 | 0 | 1 | 0 | 1 | 0 | 1 | 0 | 1 | 0 | 1 | 0 | 1 | 0 | 1 |
| | [1] | 0 | 0 | 1 | 1 | 0 | 0 | 1 | 1 | 0 | 0 | 1 | 1 | 0 | 0 | 1 | 1 |
| | [2] | 0 | 0 | 0 | 0 | 1 | 1 | 1 | 1 | 0 | 0 | 0 | 0 | 1 | 1 | 1 | 1 |
| | [3] | 0 | 0 | 0 | 0 | 0 | 0 | 0 | 0 | 1 | 1 | 1 | 1 | 1 | 1 | 1 | 1 |
| DIGITAL SIGNAL DOUT[3:0] (DECIMAL NUMBER) | | 0 | 1 | 2 | 3 | 4 | 5 | 6 | 7 | 8 | 9 | 10 | 11 | 12 | 13 | 14 | 15 |

FIG. 16

| STATE NO. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| OUTPUT SIGNAL OF LATCH CIRCUIT DO[7:0] [0] | 0 | 1 | 1 | 1 | 1 | 1 | 1 | 1 | 1 | 0 | 0 | 0 | 0 | 0 | 0 | 0 |
| [1] | 0 | 0 | 1 | 1 | 1 | 1 | 1 | 1 | 1 | 1 | 0 | 0 | 0 | 0 | 0 | 0 |
| [2] | 0 | 0 | 0 | 1 | 1 | 1 | 1 | 1 | 1 | 1 | 1 | 0 | 0 | 0 | 0 | 0 |
| [3] | 0 | 0 | 0 | 0 | 1 | 1 | 1 | 1 | 1 | 1 | 1 | 1 | 0 | 0 | 0 | 0 |
| [4] | 0 | 0 | 0 | 0 | 0 | 1 | 1 | 1 | 1 | 1 | 1 | 1 | 1 | 0 | 0 | 0 |
| [5] | 0 | 0 | 0 | 0 | 0 | 0 | 1 | 1 | 1 | 1 | 1 | 1 | 1 | 1 | 0 | 0 |
| [6] | 0 | 0 | 0 | 0 | 0 | 0 | 0 | 1 | 1 | 1 | 1 | 1 | 1 | 1 | 1 | 0 |
| [7] | 0 | 0 | 0 | 0 | 0 | 0 | 0 | 0 | 1 | 1 | 1 | 1 | 1 | 1 | 1 | 1 |
| SWITCH 54 (=DO[3]⊕DO[7]) | 0(L) SELECT DO[1] | | | | 1(H) SELECT DO[5] | | | | 0(L) SELECT DO[1] | | | | 1(H) SELECT DO[5] | | | |
| SWITCH GROUP 5021 (=DO[3]⊕DO[7]) | 0(L) SELECT DO[1] | | 0(H) SELECT DO[3] | | 1(H) SELECT DO[5] | | 1(H) SELECT DO[7] | | 0(L) SELECT DO[1] | | 1(H) SELECT DO[3] | | 1(H) SELECT DO[5] | | 1(H) SELECT DO[7] | |
| SWITCH GROUP 5022 (=DO[1]⊕DO[5], OR =DO[5]⊕DO[7]) | 0(L) SELECT DO[1] | | 1(H) SELECT DO[3] | | 0(L) SELECT DO[5] | | 1(H) SELECT DO[7] | | 0(L) SELECT DO[1] | | 1(H) SELECT DO[3] | | 0(L) SELECT DO[5] | | 1(H) SELECT DO[7] | |
| OUTPUT SIGNAL OF DATA SELECTION UNIT | DO[0] DO[1] | | DO[2] DO[3] | | DO[4] DO[5] | | DO[6] DO[7] | | DO[0] DO[1] | | DO[2] DO[3] | | DO[4] DO[5] | | DO[6] DO[7] | |
| SWITCH OF EDGE DETECTION UNIT (=DO[7]) | 0(L) SELECT RCLK | | | | | | | | 1(H) SELECT FCLK | | | | | | | |
| DIGITAL SIGNAL DOUT[3:0] (BINARY NUMBER) [0] | 0 | 1 | 0 | 1 | 0 | 1 | 0 | 1 | 0 | 1 | 0 | 1 | 0 | 1 | 0 | 1 |
| [1] | 0 | 0 | 1 | 1 | 0 | 0 | 1 | 1 | 0 | 0 | 1 | 1 | 0 | 0 | 1 | 1 |
| [2] | 0 | 0 | 0 | 0 | 1 | 1 | 1 | 1 | 0 | 0 | 0 | 0 | 1 | 1 | 1 | 1 |
| [3] | 0 | 0 | 0 | 0 | 0 | 0 | 0 | 0 | 1 | 1 | 1 | 1 | 1 | 1 | 1 | 1 |
| DIGITAL SIGNAL DOUT[3:0] (DECIMAL NUMBER) | 0 | 1 | 2 | 3 | 4 | 5 | 6 | 7 | 8 | 9 | 10 | 11 | 12 | 13 | 14 | 15 |

FIG. 18

| STATE NO. | | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| DO[1:0] | [0] | 0 | 0 | 1 | 1 | 1 | 1 | 1 | 1 | 1 | 1 | 0 | 0 | 0 | 0 | 0 | 0 |
| | [1] | 0 | 0 | 0 | 0 | 0 | 0 | 0 | 0 | 1 | 1 | 1 | 1 | 1 | 1 | 1 | 1 |
| DP[1:0] | [0] | 1 | 1 | 1 | 0 | 0 | 0 | 0 | 1 | 1 | 1 | 0 | 1 | 1 | 1 | 1 | 1 |
| | [1] | 1 | 1 | 1 | 1 | 1 | 0 | 0 | 0 | 0 | 0 | 0 | 0 | 1 | 1 | 1 | 1 |
| DQ[1:0] | [0] | 1 | 1 | 1 | 1 | 1 | 1 | 0 | 0 | 0 | 0 | 0 | 0 | 0 | 1 | 1 | 1 |
| | [1] | 1 | 1 | 1 | 1 | 1 | 1 | 1 | 0 | 0 | 0 | 0 | 0 | 0 | 0 | 0 | 1 |
| DR[1:0] | [0] | 1 | 1 | 1 | 1 | 1 | 1 | 1 | 1 | 0 | 0 | 0 | 0 | 0 | 0 | 0 | 0 |
| | [1] | 1 | 0 | 1 | 1 | 1 | 1 | 1 | 1 | 1 | 1 | 0 | 0 | 0 | 0 | 0 | 0 |
| SWITCH 64 (=DP[1]⊕DR[1]) | | 0(L) | | SELECT DO[1] | | 1(H) | | SELECT DQ[1] | | 0(L) | | SELECT DO[1] | | 1(H) | | SELECT DQ[1] | |
| SWITCH GROUP 6051 (=DO[1]⊕DR[1], or =DQ[1]⊕DR[1]) | | 1(H) | | 0(L) | | 1(H) | | 1(H) | | 0(L) | | 1(H) | | 0(L) | | 1(H) | |
| OUTPUT SIGNAL OF DATA SELECTION UNIT | | DO[0] DO[1] | | DP[0] DP[1] | | DQ[0] DQ[1] | | DR[0] DR[1] | | DO[0] DO[1] | | DP[0] DP[1] | | DQ[0] DQ[1] | | DR[0] DR[1] | |
| SWITCH OF EDGE DETECTION UNIT (=DO[1]) | | 0(L) | | | | SELECT FCLK | | | | 1(H) | | | | SELECT RCLK | | | |
| DIGITAL SIGNAL DOUT[3:0] (BINARY NUMBER) | [0] | 0 | 1 | 0 | 1 | 0 | 1 | 0 | 1 | 0 | 1 | 0 | 1 | 0 | 1 | 0 | 1 |
| | [1] | 0 | 0 | 1 | 1 | 0 | 0 | 1 | 1 | 0 | 0 | 1 | 1 | 0 | 0 | 1 | 1 |
| | [2] | 0 | 0 | 0 | 0 | 1 | 1 | 1 | 1 | 0 | 0 | 0 | 0 | 1 | 1 | 1 | 1 |
| | [3] | 0 | 0 | 0 | 0 | 0 | 0 | 0 | 0 | 1 | 1 | 1 | 1 | 1 | 1 | 1 | 1 |
| DIGITAL SIGNAL DOUT[3:0] (DECIMAL NUMBER) | | 0 | 1 | 2 | 3 | 4 | 5 | 6 | 7 | 8 | 9 | 10 | 11 | 12 | 13 | 14 | 15 |

DATA PROCESSING CIRCUIT AND SOLID-STATE IMAGING DEVICE

BACKGROUND OF THE INVENTION

1. Field of the Invention

The present invention relates to a data processing circuit and a solid-state imaging device.

Priority is claimed on Japanese Patent Application No. 2012-209541, filed Sep. 24, 2012, the content of which is incorporated herein by reference.

2. Description of Related Art

In recent years, a CMOS (Complementary Metal Oxide Semiconductor) image sensor has attracted attention and has been put to practical use as a solid-state imaging device. A CCD (Charge Coupled Device) image sensor is manufactured through a dedicated manufacturing process whereas a CMOS image sensor can be manufactured using a general semiconductor manufacturing process. Based on this, in the CMOS image sensor, for example, many functions can be realized by incorporating various functional circuits in the sensor like an SOC (System On Chip).

Also, in recent years, examples in which a solid-state imaging device including an analog-to-digital converter (hereinafter referred to as an "A/D conversion circuit") is used as a solid-state imaging device having a digital camera, a digital video camera or an endoscope mounted thereon are increasing. In such an A/D conversion circuit included in the solid-state imaging device, a ramp type A/D conversion circuit may be used. When the A/D conversion circuit is described in the following description, the A/D conversion circuit is assumed to indicate a ramp type A/D) conversion circuit.

A solid-state imaging device includes a plurality of A/D conversion circuits having the same configuration, each including a comparator, an upper counter, a data processing circuit, and a memory. In each A/D) conversion circuit, the comparator performs a comparison (hereinafter referred to as a "comparison process") of a voltage value of a pixel signal (an analog signal) with a voltage value of a reference signal in a ramp shape (ramp wave). Also, each A/D conversion circuit generates a digital signal corresponding to a size of each input pixel signal by the upper counter and the data processing circuit digitizing (binarizing) a time from a timing of an initial value of the ramp wave to a timing at which the comparison process is completed, as an upper-bit signal and a lower-bit signal of the digital signal, respectively, and the memory holding the digitized digital signal (see Japanese Patent Laid-Open Publication No. 2011-166235 and Japanese Patent Laid-Open Publication No. 2010-258806).

FIG. 20 is a block diagram illustrating a schematic configuration of a data processing circuit included in a conventional A/D conversion circuit. The conventional data processing circuit 900 illustrated in FIG. 20 includes a latch portion 901 and a digital generation unit 902.

The data processing circuit 900 generates and outputs the binarized digital signal by the latch portion 901 holding states of phases of a plurality of clock signals having different phases at certain intervals (hereinafter referred to as a "multi-phase clock") at a timing at which the comparator has completed the comparison process, and the digital generation unit 902 digitizing the held states of the phases of the multi-phase clock. In the following description, numbers shown in brackets ("[ ]") subsequent to a reference sign indicates the bit of each signal. For example, a signal of a second bit is indicated as "[1]" and a signal of a sixteenth bit is indicated as "[15]."

The latch portion 901 is a circuit that latches (holds) the state of the clock signal of each phase of the multi-phase clock DU, and includes the same number of latch circuits 91 as the number of multi-phase clocks DU.

A case in which the latch portion 901 included in the data processing circuit 900 illustrated in FIG. 20 includes sixteen latch circuits 91 (LAT[15:0]) corresponding to the respective phases of the multi-phase clock DU[15:0] of sixteen phases is shown.

In the latch portion 901 illustrated in FIG. 20, "LAT" is given as a reference sign of the latch circuit 91 and a number indicating each phase of the multi-phase clock DU is shown in brackets ("[ ]") subsequent to the reference sign "LAT" in order to indicate the latch circuit 91 corresponding to each phase corresponding to a bit in the multi-phase clock DU, thereby indicating a bit of the latch circuit 91. For example, a fifteenth phase of the multi-phase clock DU is indicated by a multi-phase clock DU[14], and the latch circuit 91 corresponding to the multi-phase clock DU[14] is indicated by a latch circuit LAT[14].

Each latch circuit 91 latches (holds) a state of "high" or "low" of the clock signal of each phase of the corresponding multi-phase clock DU at a timing of a falling edge (or a rising edge) of the latch clock LATCLK indicating that the voltage value of the pixel signal (analog signal) and the voltage value of the reference signal in a ramp shape (ramp wave) match in the comparison process of the comparator, namely, indicating that the comparator has completed the comparison process.

Also, the latch portion 901 sequentially outputs an output signal DO[15:0] indicating states of clock signals of respective phases of the multi-phase clock DU latched in the latch circuits 91 to the readout line OL[1:0] according to a timing of readout switch signals SW1[14:0] and SW2[15:1] corresponding to the respective latch circuits 91.

The digital generation unit 902 is a circuit that binarizes the states of the phases of the multi-phase clock DU when the comparator has completed the comparison process based on the output signal DO[15:0] sequentially output from the latch portion 901 to the readout line OL[1:0] to generate a 4-bit digital signal DOUT[3:0], and includes, for example, an encoder 92 and a lower counter 93, as illustrated in FIG. 20.

The encoder 92 includes a general logic circuit, and generates a count clock CNTCLK to be counted by the lower counter 93, according to a signal of any 2 bits of the output signal DO[15:0] input by the readout line OL[1:0]. The lower counter 93 generates a binarized 4-bit digital signal DOUT [3:0] by counting the number of instances of "high" of the count clock CNTCLK.

FIG. 21 is a timing chart illustrating an example of a timing of the multi-phase clock and the latch clock input to the data processing circuit included in the conventional A/D conversion circuit. In FIG. 21, an example of the multi-phase clock DU[15:0] of sixteen phases having a phase difference of Ts/16 when a period of the clock signal of each phase of the multi-phase clock DU is a period Ts is illustrated.

As illustrated in FIG. 21, when the respective latch circuits 91 of the latch portion 901 latch the states of the clock signals of the respective phases of the corresponding multi-phase clock DU at a timing at which the latch clock LATCLK is inverted, the output signal DO[15:0] indicating the states of the clock signals of the respective phases of the multi-phase clock DU is "0000011111111000." The data processing circuit 900 generates a 4-bit digital signal DOUT[3:0]="1011" ("11" in decimal notation) by the digital generation unit 902 binarizing the states of the phases of the multi-phase clock DU based on the output signal DO[15:0].

Here, an operation when the digital generation unit 902 binarizes the states of the phases of the multi-phase clock DU will be described. FIG. 22 is a timing chart illustrating an example of a timing of an operation of binarizing states of phases of the multi-phase clock in the data processing circuit included in the conventional A/D conversion circuit.

The output signal DO[15:0] is sequentially output to the readout line OL[1:0] by 2 bits based on the readout switch signals SW1[14:0] and SW2[15:1], as illustrated in FIG. 22. In this case, the encoder 92 detects the state of the phase of the multi-phase clock DU, more specifically, a position of the bit of the latch circuit 91 in which there is a timing of a rising edge of the multi-phase clock DU, based on the readout line OL[1:0].

Also, the encoder 92 initiates generation of the count clock CNTCLK when the timing of the rising edge of the multi-phase clock DU is detected. When the output signal DO[15:0] of each latch circuit 91 of the latch portion 901 is "0000011111111000," the encoder 92 generates a count clock CNTCLK which becomes "high" eleven times until reading of all bits of the output signal DO[15:0] ends, as illustrated in FIG. 22.

The data processing circuit 900 outputs a digital signal DOUT[3:0]="1011" ("11" in decimal notation) obtained by binarizing the states of the phases of the multi-phase clock DU, as a lower-bit signal in the digital signals subjected to analog-to-digital conversion in the A/D conversion circuit, by the lower counter 93 counting the number of instances of "high" of the count clock CNTCLK.

SUMMARY OF THE INVENTION

According to a first aspect of the present invention, a data processing circuit is a data processing circuit that holds a state of a clock signal of each phase of an input multi-phase clock at a timing of an input latch clock, the multi-phase clock including clock signals of a plurality of phases sequentially shifted at certain intervals determined in advance, and generates a digital signal obtained by digitizing the states of the phases of the multi-phase clock at a timing at which the latch clock is input the data processing circuit including: a latch portion including n latch unit groups (n is an integer of a power of 2) including the same number and a plurality of latch units, each latch unit holding the state of the clock signal of the corresponding phase of the multi-phase clock and outputting an output signal indicating the held state of the clock signal, a data selection unit that acquires the output signal output by at least one of the latch units in at least one of the latch unit groups included in the latch portion, and selects the latch unit group holding the states of the clock signals of a plurality of consecutive phases used for generation of the digital signal based on the acquired output signal; and a digital generation unit that generates the digital signal based on the respective output signals output from the respective latch units included in the latch unit group selected by the data selection unit.

According to a second aspect of the present invention, in the first aspect, the data processing circuit may further include an edge detection unit that detects a timing of an edge at which the state of the clock signals of two adjacent phases in the multi-phase clock changes from a first state to a second state based on the respective output signals indicating the states of the clock signals of a plurality of consecutive phases sequentially output from the respective latch units included in the latch unit group selected by the data selection unit, and outputs a signal indicating the detected timing of the edge, wherein the digital generation unit may generate the digital signal based on the signal indicating the timing of the edge output from the edge detection unit.

According to a third aspect of the present invention, in the first aspect, the predetermined latch unit group in the latch portion may hold the states of some of the clock signals of a plurality of consecutive phases in the multi-phase clock, and the latch unit group different from the predetermined latch unit group may hold states of the clock signals of the plurality of consecutive phases from the clock signals of the phases subsequent to the clock signal most delayed in phase whose state is held in the latch unit of a last stage included in the predetermined latch unit group.

According to a fourth aspect of the present invention, in the second aspect, the predetermined latch unit group in the latch portion may hold the states of some of the clock signals of a plurality of consecutive phases in the multi-phase clock, and the latch unit group different from the predetermined latch unit group may hold states of the clock signals of the plurality of consecutive phases from the clock signals of the phases subsequent to the clock signal most delayed in phase whose state is held in the latch unit of a last stage included in the predetermined latch unit group.

According to a fifth aspect of the present invention, in the third aspect, n may be 2, the latch portion may include a first latch unit group and a second latch unit group, the first latch unit group may hold states of one half of the clock signals of the plurality of consecutive phases in the multi-phase clock, and the second latch unit group may hold states of the other half of the clock signals of the plurality of consecutive phases in the multi-phase clock.

According to a sixth aspect of the present invention, in the fourth aspect, n may be 2, the latch portion may include a first latch unit group and a second latch unit group, the first latch unit group may hold states of one half of the clock signals of the plurality of consecutive phases in the multi-phase clock, and the second latch unit group may hold states of the other half of the clock signals of the plurality of consecutive phases in the multi-phase clock.

According to a seventh aspect of the present invention, in the first aspect, the data processing circuit may further include (n−1) delay units that sequentially delay the latch clock by a certain delay time determined in advance based on the number of latch units included in the latch unit group and the number of states of phases of the multi-phase clock generated by the data processing circuit.

According to a eighth aspect of the present invention, in the second aspect, the data processing circuit may further include (n−1) delay units that sequentially delay the latch clock by a certain delay time determined in advance based on the number of latch units included in the latch unit group and the number of states of phases of the multi-phase clock generated by the data processing circuit.

According to a ninth aspect of the present invention, in the seventh aspect, a first of the latch unit groups in the latch portion may hold the states of the clock signals of all phases of the multi-phase clock at a timing of the latch clock, and a second of the latch unit groups may hold the states of the clock signals of all phases of the multi-phase clock at a timing of the latch clock delayed by the delay unit.

According to a tenth aspect of the present invention, in the eighth aspect, a first of the latch unit groups in the latch portion may hold the states of the clock signals of all phases of the multi-phase clock at a timing of the latch clock, and a second of the latch unit groups may hold the states of the clock signals of all phases of the multi-phase clock at a timing of the latch clock delayed by the delay unit.

According to a eleventh aspect of the present invention, in the ninth aspect, n may be 2, the delay unit may include a first delay unit, and when the delay time is Td, the latch portion may include a first latch unit group and a second latch unit group, the first latch unit group may hold states of the clock signals of all phases of the multi-phase clock at a timing of the latch clock, and the second latch unit group may hold the states of the clock signals of all phases of the multi-phase clock at a timing of the latch clock delayed by Td by the first delay unit.

According to twelfth aspect of the present invention, in the tenth aspect, n may be 2, the delay unit may include a first delay unit, and when the delay time is Td, the latch portion may include a first latch unit group and a second latch unit group, the first latch unit group may hold states of the clock signals of all phases of the multi-phase clock at a timing of the latch clock, and the second latch unit group may hold the states of the clock signals of all phases of the multi-phase clock at a timing of the latch clock delayed by Td by the first delay unit.

According to an thirteenth aspect of the present invention, in the ninth aspect, n may be 4, the delay unit may include a first delay unit, a second delay unit and a third delay unit, and when the delay time is Td, the latch portion may include a first latch unit group, a second latch unit group, a third latch unit group and a fourth latch unit group, the first latch unit group may hold the states of the clock signals of all phases of the multi-phase clock at a timing of the latch clock, the second latch unit group may hold the states of the clock signals of all phases of the multi-phase clock at a timing of the latch clock delayed by Td by the first delay unit, the third latch unit group may hold the states of the clock signals of all phases of the multi-phase clock at a timing of the latch clock delayed by 2Td by the second delay unit, and the fourth latch unit group may hold the states of the clock signals of all phases of the multi-phase clock at a timing of the latch clock delayed by 3Td by the third delay unit.

According to an fourteenth aspect of the present invention, in the tenth aspect, n may be 4, the delay unit may include a first delay unit, a second delay unit and a third delay unit, and when the delay time is Td, the latch portion may include a first latch unit group, a second latch unit group, a third latch unit group and a fourth latch unit group, the first latch unit group may hold the states of the clock signals of all phases of the multi-phase clock at a timing of the latch clock, the second latch unit group may hold the states of the clock signals of all phases of the multi-phase clock at a timing of the latch clock delayed by Td by the first delay unit, the third latch unit group may hold the states of the clock signals of all phases of the multi-phase clock at a timing of the latch clock delayed by 2Td by the second delay unit, and the fourth latch unit group may hold the states of the clock signals of all phases of the multi-phase clock at a timing of the latch clock delayed by 3Td by the third delay unit.

According to a fifteenth aspect of the present invention, a solid-state imaging device includes: a pixel unit in which a plurality of pixels are arranged in a two-dimensional matrix form, the pixels outputting photoelectric conversion signals corresponding to an amount of incident light; a reference signal generation unit that generates a reference signal decreasing or increasing at a certain rate over time; a clock generation unit that generates a multi-phase clock including clock signals of a plurality of phases sequentially shifted at certain intervals determined in advance; and an analog-to-digital converter arranged in each column or plurality of columns of the pixel unit, an analog signal according to the photoelectric conversion signal output from the pixel of the corresponding column being input to the analog-to-digital converter every row of the pixel unit, wherein the analog-to-digital converter includes a comparison unit that compares the analog signal with the reference signal and outputs a latch clock at a timing at which a voltage value of the analog signal and a voltage value of the reference signal match; and a data processing circuit that generates a digital signal obtaining by digitizing the states of the phases of the multi-phase clock at a timing at which the latch clock is input, and the data processing circuit is a data processing circuit that holds a state of the clock signal of each phase of the input multi-phase clock at a timing of the input latch clock, the multi-phase clock including clock signals of a plurality of phases sequentially shifted at certain intervals determined in advance, and generates the digital signal obtained by digitizing the states of the phases of the multi-phase clock at a timing at which the latch clock is input, the data processing circuit including: a latch portion including n latch unit groups (n is an integer of a power of 2) including the same number and a plurality of latch units, each latch unit holding the state of the clock signal of the corresponding phase of the multi-phase clock and outputting an output signal indicating the held state of the clock signal; a data selection unit that acquires the output signal output by at least one of the latch units in at least one of the latch unit groups included in the latch portion, and selects the latch unit group holding the states of the clock signals of a plurality of consecutive phases used for generation of the digital signal based on the acquired output signal; and a digital generation unit that generates the digital signal based on the respective output signals output from the respective latch units included in the latch unit group selected by the data selection unit.

BRIEF DESCRIPTION OF THE DRAWINGS

FIG. 4 is a truth table indicating a relationship between an output of a latch circuit and an output of each component included in the data processing circuit of the first embodiment;

FIG. 7A is a timing chart illustrating an example of a timing of an operation of binarizing a state of a phase of the multi-phase clock in the data processing circuit of the second embodiment;

FIG. 8 is a truth table indicating a relationship between an output of a latch circuit and an output of each component included in the data processing circuit of the second embodiment;

FIG. 10 is a truth table indicating a relationship between an output of a latch circuit and an output of each component included in the data processing circuit of the third embodiment:

FIG. 12 is a truth table indicating a relationship between an output of a latch circuit and an output of each component included in the data processing circuit of the fourth embodiment;

FIG. 16 is a truth table indicating a relationship between an output of a latch circuit and an output of each component included in the data processing circuit of the fifth embodiment;

FIG. 18 is a truth table indicating a relationship between an output of a latch circuit and an output of each component included in the data processing circuit of the sixth embodiment;

DETAILED DESCRIPTION OF THE INVENTION

Hereinafter, embodiments of the present invention will be described with reference to the drawings. The following description of the embodiments of the present invention is merely intended to concretely explain inventions defined in attached claims and their equivalents, and it is apparent to those skilled in the art based on this disclosure that the description is not intended to limit the inventions and the equivalents.

First Embodiment

Hereinafter, a first embodiment of the present invention will be described with reference to drawings. In the following description, a plurality of clock signals having different phases at certain intervals determined in advance, namely, a plurality of clock signals whose phases are sequentially shifted at certain intervals determined in advance, are referred to as a "multi-phase clock." In the following description, a bit of each component or each signal is indicated by a number shown in brackets ("[ ]") subsequent to each reference sign. For example, a component of a second bit and a signal of a second bit are indicated by "[1]," and a component of an eighth bit and a signal of an eighth bit are indicated "[7]."

Figure 1:
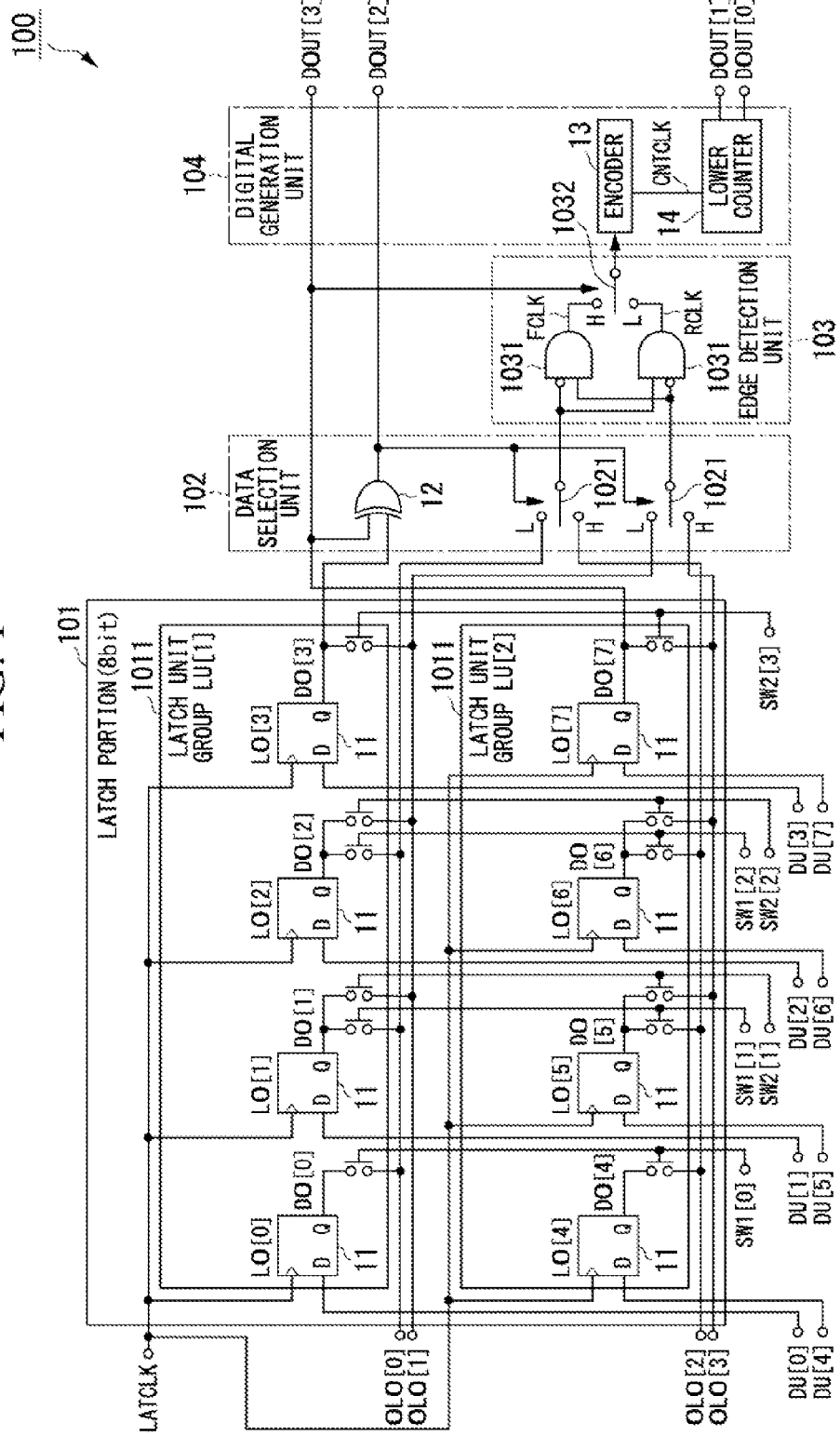
FIG. 1 is a block diagram illustrating a schematic configuration of a data processing circuit in a first embodiment of the present invention.

FIG. 1 is a block diagram illustrating a schematic configuration of a data processing circuit of the first embodiment. The data processing circuit 100 illustrated in FIG. 1 includes a latch portion 101, a data selection unit 102, an edge detection unit 103, and a digital generation unit 104. The data processing circuit 100 illustrated in FIG. 1 is a data processing circuit that holds states of phases of a multi-phase clock DU of eight phases in the latch portion 101 at a predetermined timing, e.g., a timing at which a comparator (not illustrated) has completed a comparison process using two latch unit groups, and digitizes the held states of the phases of the multi-phase clock DU using the digital generation unit 104 to generate and output a binarized 4-bit digital signal DOUT[3:0].

The latch portion 101 is a circuit that latches (holds) the states of the clock signals of respective phases of the multi-phase clock DU of eight phases, and includes, as latch unit groups, two (n=2) latch unit groups 1011 each including four latch circuits (latch units) 11. The latch portion 101 includes a switch corresponding to each latch circuit 1 in order to read the state of the clock signal of each phase of the multi-phase clock DU of eight phases latched in each latch circuit 11 included in the latch portion 101. In FIG. 1. "LU" is given as a reference sign of the latch unit group 1011, "LO" is given as a reference sign of the latch circuit 11, and a bit of each of the latch unit groups 1011 and the latch circuit 11 is indicated by a number inside "[ ]: parenthesis" subsequent to each reference sign. More specifically, the latch portion 101 includes a latch unit group LU[1] and a latch unit group LU[2]. The latch unit group LU[1] includes four latch circuits LO[0], LO[1], . . . , LO[3], and the latch unit group LU[2] includes four latch circuits LO[4], LO[5], . . . , LO[7]. Each bit of the latch circuit LO[7:0] corresponds to each phase of the multi-phase clock DU[7:0] of eight phases. For example, the latch circuit LO[2] corresponds to a multi-phase clock DU[2] of a third phase of the multi-phase clock DU, and the latch circuit LO[5] corresponds to a multi-phase clock DU[5] of a sixth phase of the multi-phase clock DU.

Each latch circuit 11 in the latch unit group 1011 latches a state of "high" or "low" of the clock signal of each phase of the corresponding multi-phase clock DU at a predetermined timing, e.g., at a timing of a falling edge of a latch clock LATCLK indicating that a voltage value of a pixel signal (analog signal) matches a voltage value of a reference signal in a ramp shape (ramp wave) in the comparison process of the comparator (not illustrated), i.e., indicating that the comparator (not illustrated) has completed the comparison process.

More specifically, the respective latch circuits LO[0], LO[1], ..., LO[3] in the latch unit group LU[1] latch a state of high or low of the multi-phase clocks DU[0], DU[1], ..., DU[3] at a timing of the falling edge of the latch clock LATCLK. The respective latch circuits LO[4], LO[5], ..., LO[7] in the latch unit group LU[2] latch a state of high or low of the respective multi-phase clocks DU[4], DU[5], ..., DU[7] at a timing of the falling edge of the latch clock LATCLK.

Also, each latch unit group 1011 sequentially outputs an output signal DO[7:0] indicating a state of the clock signal of each phase of the multi-phase clock DU latched in each latch circuit 11 to any of the readout lines OLO[3:0] according to a timing of readout switch signals SW1[2:0] and SW2[3:1] corresponding to each latch circuit 11.

More specifically, the respective latch circuits LO[0], LO[1], ..., LO[3] in the latch unit group LU[1] sequentially output output signals DO[0], DO[1], ..., DO[3] to the readout lines OLO[0] and OLO[1] according to a timing of readout switch signals SW1[0], SW1[1], SW1[2], SW2[1], SW2[2] and SW2[3]. The respective latch circuits LO[4], LO[5], ..., LO[7] in the latch unit group LU[2] sequentially output output signals DO[4], DO[5], ..., DO[7] to the readout lines OLO[2] and OLO[3] according to a timing of the readout switch signals SW1[0], SW1[1], SW1[2], SW2[1], SW2[2] and SW2[3].

The data selection unit 102 is a circuit which selects a signal of any 2 bits of the output signal DO[7:0] sequentially output from each of the latch unit groups 1011 included in the latch portion 101 to the readout line OLO[3:0], and includes an EXOR circuit 12 that performs an EXOR operation, and two switches 1021. The data selection unit 102 outputs an output signal DO of 2 bits of any one of the output signal DO[3:0] of each latch circuit 11 in the latch unit group LU[1] and the output signal DO[7:4] of each latch circuit 11 in the latch unit group LU[2] to the edge detection unit 103 by selecting any one of the readout line OLO[1:0] and the readout line OLO[3:2].

The selection of the output signal DO to be output to the edge detection unit 103 by the data selection unit 102 is performed based on the values of the output signal DO[3] of the latch circuit LO[3] in the latch unit group LU[1] and the output signal DO[7] of the latch circuit LO[7] in the latch unit group LU[2]. More specifically, the EXOR circuit 12 performs the EXOR operation of the value of the output signal DO[3] and the value of the output signal DO[7] and each switch 1021 selects the readout line OLO to be connected to the edge detection unit 103 based on a result of the EXOR operation. Also, when an operational result of the EXOR circuit 12 is "low," namely, when the value of the output signal DO[3] and the value of the output signal DO[7] are the same values, the readout line OLO[1:0] is connected to the edge detection unit 103, and when the operational result of the EXOR circuit 12 is "high," namely, when the value of the output signal DO[3] and the value of the output signal DO[7] are different values, the readout line OLO[3:2] is connected to the edge detection unit 103.

In other words, the data selection unit 102 outputs a state of any one of the held multi-phase clock DU[3:0] and the held multi-phase clock DU[7:4] to the edge detection unit 103 according to the states of the multi-phase clock DU[3] and the multi-phase clock DU[7] latched at a timing of the falling edge of the latch clock LATCLK. In other words, when the states of the multi-phase clock DU[3] and the multi-phase clock DU[7] are the same states, the state of the phase of the multi-phase clock DU[3:0] is output to the edge detection unit 103, and when the states of the multi-phase clock DU[3] and the multi-phase clock DU[7] are different states, the state of the phase of the multi-phase clock DU[7:4] is output to the edge detection unit 103.

The data selection unit 102 outputs, to the digital generation unit 104, a result of the EXOR circuit 12 performing the EXOR operation of the value of the output signal DO[3] of the latch circuit LO[3] in the latch unit group LU[1] and the value of the output signal DO[7] of the latch circuit LO[7] in the latch unit group LU[2].

The edge detection unit 103 is a circuit that detects a timing of a rising edge and a falling edge of the multi-phase clock DU based on the signal of the readout line OLO connected to the data selection unit 102, and includes two AND gates 1031 that perform an OR operation, and a switch 1032. The edge detection unit 103 outputs any one of a signal indicating a timing of the rising edge of the multi-phase clock DU included in the output signal DO[3:0] or the output signal D[7:4] input from the data selection unit 102 and a signal indicating a timing of the falling edge of the multi-phase clock DU to the digital generation unit 104 based on the value of the output signal DO[7] of the latch circuit LO[7] in the latch unit group LU[2].

More specifically, each AND gate 1031 generates a clock RCLK indicating a timing of the rising edge of the multi-phase clock DU and a clock FCLK indicating a timing of the falling edge of the multi-phase clock DU based on the signal of the connected readout line OLO. Also, the switch 1032 selects any one of the clock RCLK and the clock FCLK based on the value of the output signal DO[7] of the latch circuit LO[7] in the latch unit group LU[2], and outputs the selected clock to the digital generation unit 104. In other words, when the value of the output signal DO[7] is "low," the edge detection unit 103 outputs the clock RCLK generated based on the rising edge of the multi-phase clock DU included in the output signal DO[3:0] or the output signal DO[7:4] to the digital generation unit 104. When the value of the output signal DO[7] is "high," the edge detection unit 103 outputs the clock FCLK generated based on the falling edge of the multi-phase clock DU included in the output signal DO[3:0] or the output signal DO[7:4] to the digital generation unit 104.

The digital generation unit 104 is a circuit that binarizes the state of the phase of the multi-phase clock DU at a predetermined timing based on the signal indicating a timing of the rising edge or the falling edge of the multi-phase clock DU input from the edge detection unit 103 to generate a 4-bit digital signal DOUT[3:0], and includes, for example, an encoder 13 and a lower counter 14. In the digital generation unit 104 illustrated in FIG. 1, the digital signal DOUT[3] is generated based on the output signal DO[7] output from the latch portion 101, and the digital signal DOUT[2] is generated based on the EXOR operational result of the EXOR circuit 12 input from the data selection unit 102. The digital signal DOUT[1:0] is generated by the encoder 13 and the lower counter 14.

The encoder 13 includes a general logic circuit, and generates a count clock CNTCLK to be counted by the lower counter 14 according to the signal indicating the timing of the rising edge or the falling edge of the multi-phase clock DU input from the edge detection unit 103.

The lower counter 14 generates a binarized digital signal DOUT[1:0] of 2 bits by counting the number of instances of "high" of the count clock CNTCLK. The encoder 13 and the lower counter 14 differ from the conventional data processing circuit (e.g., the encoder 92 and the lower counter 93 illustrated in FIG. 20) in the number of bits of the generated digital signal DOUT, but an operation thereof is the same as an operation of the conventional data processing circuit.

Through such a configuration, the data processing circuit 100 generates and outputs the binarized 4-bit digital signal DOUT[3:0] by digitizing the states of the phases of the multi-phase clock DU of eight phases.

While the configuration when the digital generation unit 104 generates the digital signal DOUT[1:0] using the encoder 13 and the lower counter 14 has been shown in the data processing circuit 100 of the first embodiment, a configuration used to generate the digital signal DOUT[1:0] is not limited to the configuration described above and the digital signal DOUT[1:0] may be generated using any configuration or method.

Figure 2A:
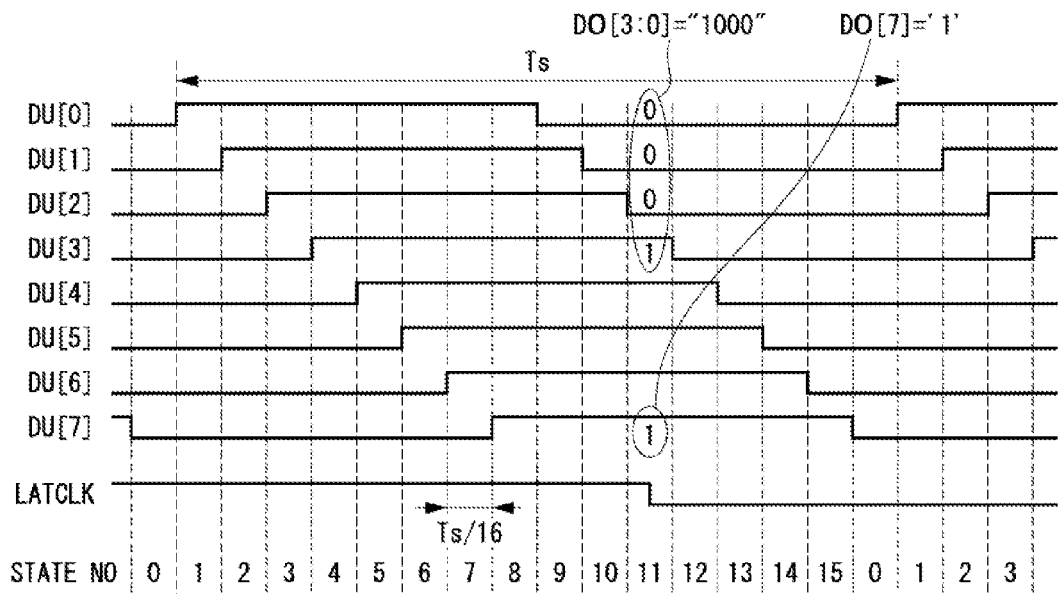
FIG. 2A is a timing chart illustrating an example of a timing of a multi-phase clock and a latch clock input to the data processing circuit of the first embodiment.
Figure 2B:
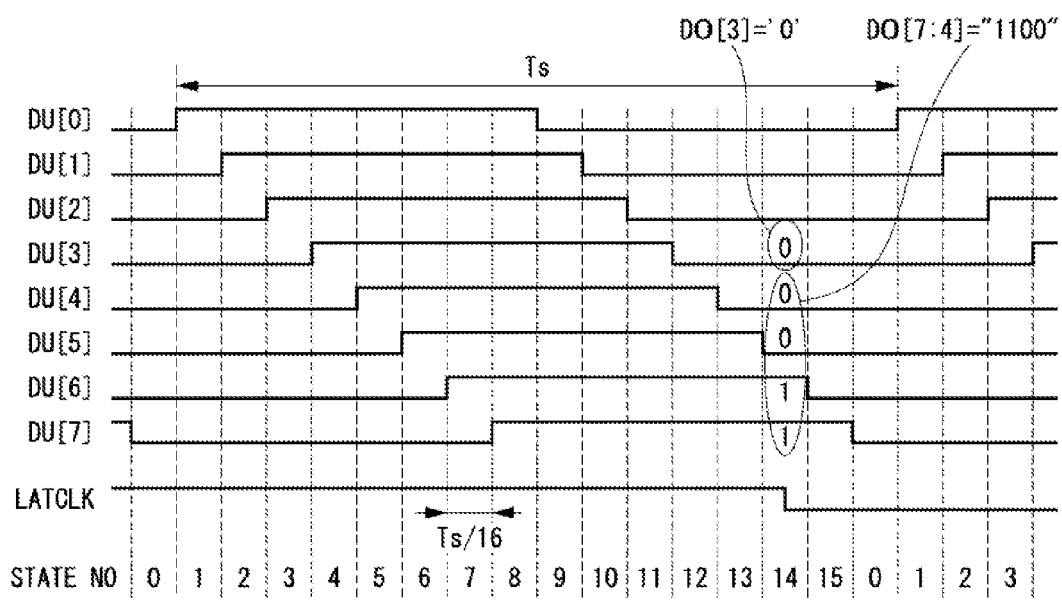
FIG. 2B is a timing chart illustrating an example of a timing of a multi-phase clock and a latch clock input to the data processing circuit of the first embodiment.
Figure 3A:
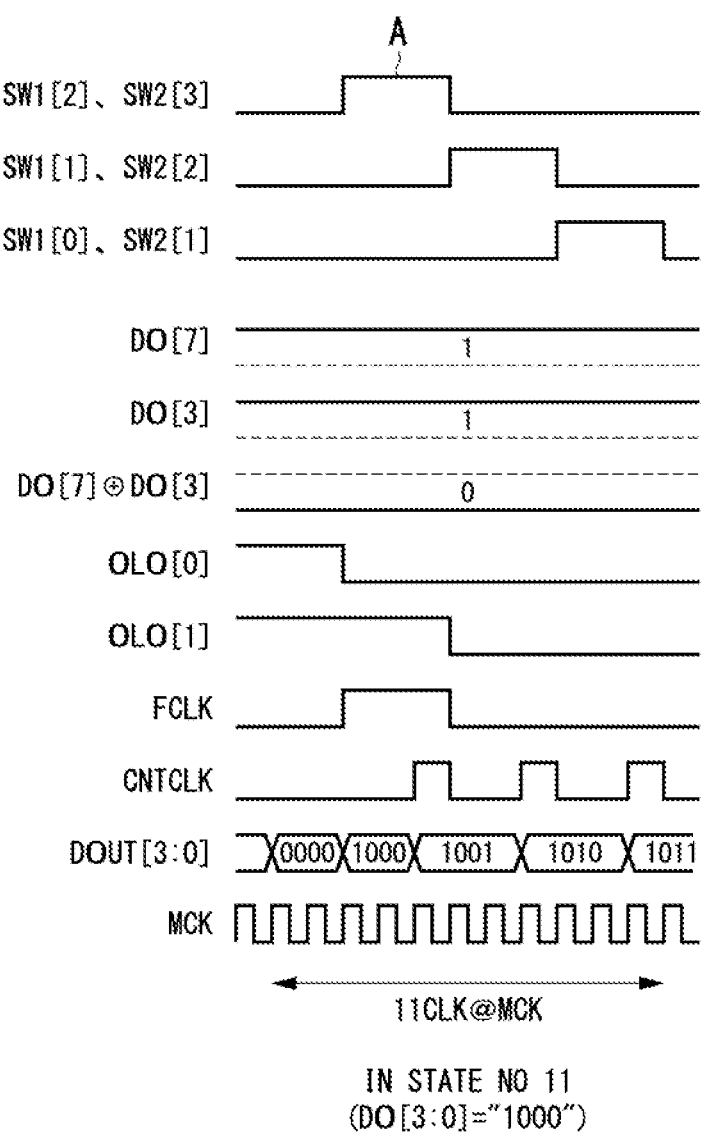
FIG. 3A is a timing chart illustrating an example of a timing of an operation of binarizing a state of a phase of the multi-phase clock in the data processing circuit of the first embodiment.
Figure 3B:
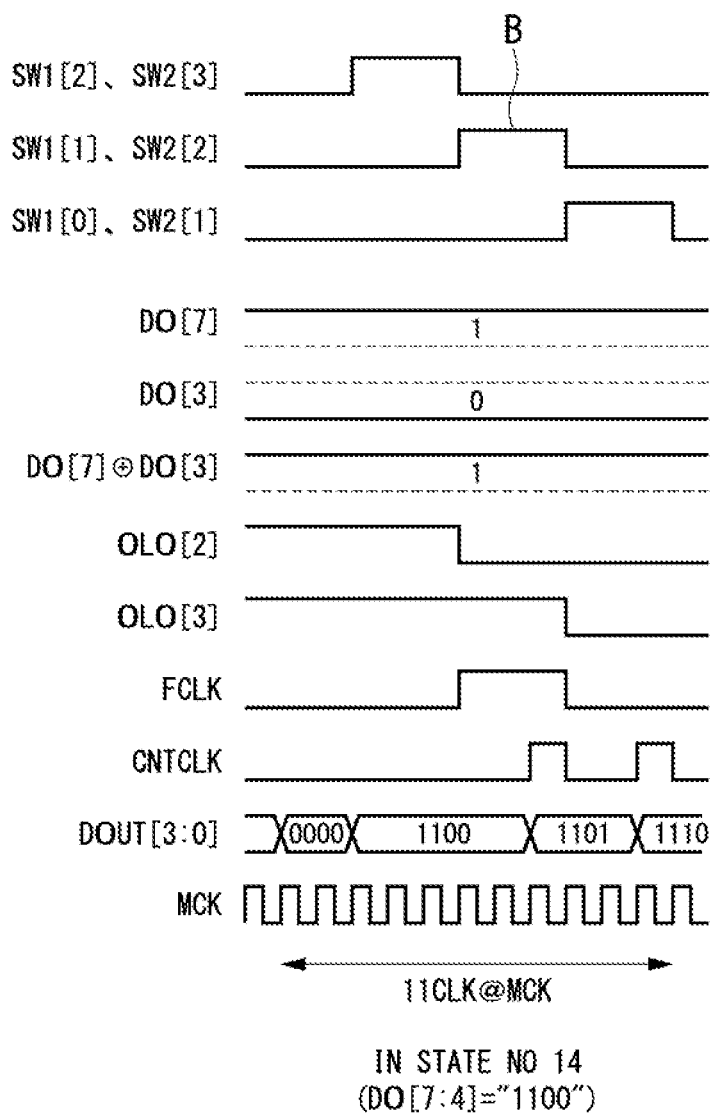
FIG. 3B is a timing chart illustrating an example of a timing of an operation of binarizing a state of a phase of the multi-phase clock in the data processing circuit of the first embodiment.

Next, a data processing method when the data processing circuit 100 of the first embodiment generates the digital signal DOUT[3:0] will be described. FIGS. 2A and 2B are timing charts illustrating an example of a timing of the multi-phase clock DU and the latch clock LATCLK input to the data processing circuit 100 of the first embodiment. In FIGS. 2A and 2B, an example of the multi-phase clock DU[7:0] of eight phases having a phase difference of Ts/16 when a period of the clock signal of each phase of the multi-phase clock DU is a period Ts is illustrated. FIGS. 3A and 3B are timing charts illustrating an example of a timing of an operation of binarizing the states of the phases of the multi-phase clock DU in the data processing circuit 100 of the first embodiment.

In FIGS. 2A and 2B, state No indicating the state of the phase of the multi-phase clock DU of each phase is illustrated to distinguish a total of sixteen states of "high" or "low" of the multi-phase clock DU[7:0] generated by varying the period by Ts/16. The state of the phase of the multi-phase clock DU is repeated as a state No=0, 1, 2, . . . , 14, 15, 0, 1, 2, . . . over time. Even in FIGS. 3A and 3B, the same state No corresponding to the state No illustrated in FIGS. 2A and 2B is illustrated.

Each latch circuit 11 in the latch unit group 1011 latches the state of the clock signal of each phase of the corresponding multi-phase clock DU at a timing at which the latch clock LATCLK is inverted (a timing of the falling edge thereof), as illustrated in FIGS. 2A and 2B. Also, the data selection unit 102 selects any one of the readout line OLO[1:0] and the readout line OLO[3:2] to be connected to the edge detection unit 103, based on the value of the output signal DO[3] of the latch circuit LO[3] in the latch unit group LU[1] and the value of the output signal DO[7] of the latch circuit LO[7] in the latch unit group LU[2].

The timing in which the latch clock LATCLK is inverted in state No 11 is illustrated in FIG. 2A, and the timing in which the latch clock LATCLK is inverted in state No 14 is illustrated in FIG. 2B. A timing chart of an operation of the data processing circuit 100 corresponding to FIG. 2A is illustrated in FIG. 3A, and a timing chart of an operation of the data processing circuit 100 corresponding to FIG. 2B is illustrated in FIG. 3B.

In state No 11 illustrated in FIG. 2A, the value of the output signal DO[3] of the latch circuit LO[3] and the value of the output signal DO[7] of the latch circuit LO[7] at a timing at which the latch clock LATCLK is inverted (falls) are both "1." Therefore, the EXOR circuit 12 outputs "low"="0" as a result of performing the EXOR operation of the value of the output signal DO[3] and the value of the output signal DO[7], and each switch 1021 selects the readout line OLO[1:0]. Accordingly, the data selection unit 102 outputs the output signal DO[3:0]="1000" latched in the latch circuit LO[3:0] of the latch unit group LU[1] to the edge detection unit 103. Since the value of the output signal DO[7] of the latch circuit LO[7] at a timing of the falling edge of the latch clock LATCLK is "1," the switch 1032 selects the clock FCLK indicating the timing of the falling edge of the multi-phase clock DU.

Also, the output signal DO[3:0] is sequentially output by 2 bits to the readout line OLO[1:0] based on the readout switch signals SW1[2:0] and SW2[3:1], as illustrated in FIG. 3A. In this case, the AND gate 1031 generating the clock FCLK in the edge detection unit 103 generates the clock FCLK based on the signal of the connected readout line OLO[1:0]. Since the output signal DO[3:0] in state No 11 is "1000" as illustrated in FIG. 3A, a clock FCLK that becomes "high" when the output signal DO[2] is output to the readout line OLO[0] and the output signal DO[3] is output to the readout line OLO[1] (at a timing A illustrated in FIG. 3A) is generated by the AND gate 1031.

Also, the encoder 13 initiates generation of a count clock CNTCLK when the clock FCLK is input. When the output signal DO[3:0] is "1000," the encoder 13 generates the count clock CNTCLK that becomes "high" three times before reading of all bits of the output signal DO[3:0] ends, as illustrated in FIG. 3A.

The lower counter 14 generates a binarized 2-bit digital signal DOUT[1:0]="11" by counting the number of instances of "high" of the count clock CNTCLK. The digital generation unit 104 outputs, as the digital signal DOUT[3], the output signal DO[7]="1" output from the latch portion 101 and outputs, as a digital signal DOUT[2], "low"="0" output as a result of the EXOR circuit 12 performing the EXOR operation. Thus, the data processing circuit 100 generates and outputs the digital signal DOUT[3:0]="1011" ("11" in decimal notation) as the 4-bit digital signal obtained by binarizing the states of the phases of the multi-phase clock DU of eight phases in state No 11.

In state No 14 illustrated in FIG. 2B, the value of the output signal DO[3] of the latch circuit LO[3] is "0" and the value of the output signal DO[7] of the latch circuit LO[7] is "1" at a timing of the falling edge of the latch clock LATCLK. Therefore, the EXOR circuit 12 outputs "high"="1" as a result of performing the EXOR operation of the value of the output signal DO[3] and the value of the output signal DO[7] and each switch 1021 selects the readout line OLO[3:2]. Accordingly, the data selection unit 102 outputs the output signal DO[7:4]="1100" latched in the latch circuit LO[7:4] of the latch unit group LU[2] to the edge detection unit 103. Since the value of the output signal DO[7] of the latch circuit LO[7] at a timing of the falling edge of the latch clock LATCLK is "1," the switch 1032 selects the clock FCLK indicating the timing of the falling edge of the multi-phase clock DU.

Also, the output signal DO[7:4] is sequentially output by 2 bits to the readout line OLO[3:2] based on the readout switch signals SW1[2:0] and SW2[3:1], as illustrated in FIG. 3B. In this case, the AND gate 1031 generating the clock FCLK in the edge detection unit 103 generates the clock FCLK based on the signal of the connected readout line OLO[3:2]. Since the output signal DO[7:4] in state No 14 is "1100" as illustrated in FIG. 3B, the clock FCLK that becomes "high" when the output signal DO[5] is output to the readout line OLO[2] and the output signal DO[6] is output to the readout line OLO[3] at a timing B illustrated in FIG. 3B) is generated by the AND gate 1031.

Also, the encoder 13 initiates generation of the count clock CNTCLK when the clock FCLK is input, similar to state No 11 illustrated in FIG. 3A. When the output signal DO[7:4] is "1100," the encoder 13 generates the count clock CNTCLK that becomes "high" twice before the reading of all bits of the output signal DO[7:4] ends, as illustrated in FIG. 3B.

The lower counter 14 generates a binarized 2-bit digital signal DOUT[1:0]="10" by counting the number of instances of "high" of the count clock CNTCLK. The digital generation unit 104 outputs, as the digital signal DOUT[3], the output signal DO[7]="1" output from the latch portion 101 and outputs, as the digital signal DOUT[2], "high"="1" output as a result of the EXOR circuit 12 performing the EXOR operation. Thus, the data processing circuit 100 generates and outputs the digital signal DOUT[3:0]="1110" ("14" in decimal notation) as the 4-bit digital signal obtained by binarizing the states of the phases of the multi-phase clock DU of eight phases in state No 14.

Thus, in the data processing circuit 100, the readout line OLO and a clock indicating the timing of the edge of the multi-phase clock DU used to generate the digital signal DOUT[1:0] of 2 bits are selected based on the state of the multi-phase clock DU[3] of the fourth phase and the state of the multi-phase clock DU[7] of the eighth phase in the multi-phase clock DU of eight phases. Also, in the data processing circuit 100, the state of the multi-phase clock DU[7] of the eighth phase is the digital signal DOUT[3], the result of the EXOR circuit 12 performing the EXOR operation is the digital signal DOUT[2], and the digital signal DOUT[3] and the digital signal DOUT[2] are combined with the digital signal DOUT[1:0], which are output as the 4-bit digital signal DOUT[3:0] obtained by digitizing (binarizing) states of the phases of the multi-phase clock DU of eight phases.

While the cases of state No 11 and state No 14 have been described above, a total of sixteen digital signals DOUT[3:0] can be output in data processing of the data processing circuit 100 by considering the same in other state Nos.

Here, the sixteen digital signals DOUT[3:0] generated in the data processing of the data processing circuit 100 will be described. FIG. 4 is a truth table indicating a relationship between an output of the latch circuit 11 and an output of each component included in the data processing circuit 100 of the first embodiment. In FIG. 4, a relationship among the output signal DO of the latch circuit 1, a state of the switch 1021 in the data selection unit 102, a state of the switch 1032 in the edge detection unit 103, and the digital signal DOUT[3:0] in each of a total of sixteen states of the multi-phase clocks DU[7:0] input to the data processing circuit 100 is illustrated.

As illustrated in FIG. 4, the state of the switch 1032 in the edge detection unit 103 may be divided into two states according to the value of the output signal DO[7] of the latch circuit 11, and the state of the switch 1021 in the data selection unit 102 may be divided into two states according to the value of the output signal DO[3] and the value of the output signal DO[7] of the latch circuit 11. In other words, each state of the data processing of the data processing circuit 100 may be divided into four states according to the state of the switch 1021 in the data selection unit 102 and the state of the switch 1032 in the edge detection unit 103. Also, from these four states, each of sixteen states in the multi-phase clock DU[7:0] can be identified.

For example, in state No 11 illustrated in FIGS. 2A and 3A, the two switches 1021 in the data selection unit 102 are "low"="0" and the switch 1032 in the edge detection unit 103 is "high"=" " based on the output signal DO[3]="1" and the output signal DO[7]="1" of the latch circuit 11. Accordingly, the data selection unit 102 connects the readout line OLO[1:0] to the edge detection unit 103, and the edge detection unit 103 outputs the clock FCLK indicating the timing of the falling edge of the multi-phase clock DU included in the signal of the connected readout line OLO[1:0]. Accordingly, the digital generation unit 104 outputs the digital signal DOUT[3:0]="1011" ("11" in decimal notation).

The data processing circuit 100 of the first embodiment includes the edge detection unit 103 as described above. Accordingly, the operation state of the data processing circuit 100 may be divided into two states: a state when the switch 1032 in the edge detection unit 103 is "high"="1" and a state when the switch 1032 is "low"="0," as illustrated in FIG. 4, and a total of sixteen states of multi-phase clocks DU[7:0] input to the data processing circuit 100 may be isolated into sets of eight states. Accordingly, in the data processing circuit 100 of the first embodiment, the number of latch circuits 11 of the latch portion 101 can be reduced to 8, which is a half of 16 which is the number of latch circuits 91 in the latch portion 901 included in the conventional data processing circuit 900 illustrated in FIG. 20. Accordingly, the conventional data processing circuit 900 illustrated in FIG. 20 includes thirty switches corresponding to any one of the readout switch signals SW1 and SW2 whereas the data processing circuit 100 of the first embodiment includes twelve switches, which is a reduction by eighteen switches.

The data processing circuit 100 of the first embodiment includes the data selection unit 102. Accordingly, the operation state of the data processing circuit 100 may be divided into two states: a state when the two switches 1021 in the data selection unit 102 are "high"="1" and a state when the switches 1021 are "low"="0," as illustrated in FIG. 4, and the respective operation states of the data processing circuit 100 divided into two states by including the edge detection unit 103 may also be isolated into sets of four states. Accordingly, in the data processing circuit 100 of the first embodiment, the latch circuits 11 in the latch portion 101, whose number has been reduced to 8, can be divided into two latch unit groups 1011 each including four latch circuits, and the latch portion 101 may output only the 4-bit output signal DO latched in the latch circuits 11 included in any one of the latch unit groups 1011. Accordingly, in the conventional data processing circuit 900 illustrated in FIG. 20, the fifteen readout switch signals SW1 and the fifteen readout switch signals SW2 are necessary whereas, in the data processing circuit 100 of the first embodiment, the number of readout switch signals SW1 and the number of readout switch signals SW2 can be reduced by 12 and three readout switch signals SW1 and three readout switch signals SW2 are necessary.

Accordingly, in the data processing circuit 100 of the first embodiment, for example, if the clock is converted to a master clock MCLK, all 4 bits of the output signal DO can be read in a time corresponding to 11 clocks, as illustrated in FIGS. 3A and 3B. Accordingly, in the data processing circuit 100 of the first embodiment, a time corresponding to 34 clocks can be shortened in comparison with the time corresponding to 45 clocks, which is a time necessary for the conventional data processing circuit 900 illustrated in FIG. 20 to read all bits of the output signal DO[15:0].

Figure 20:
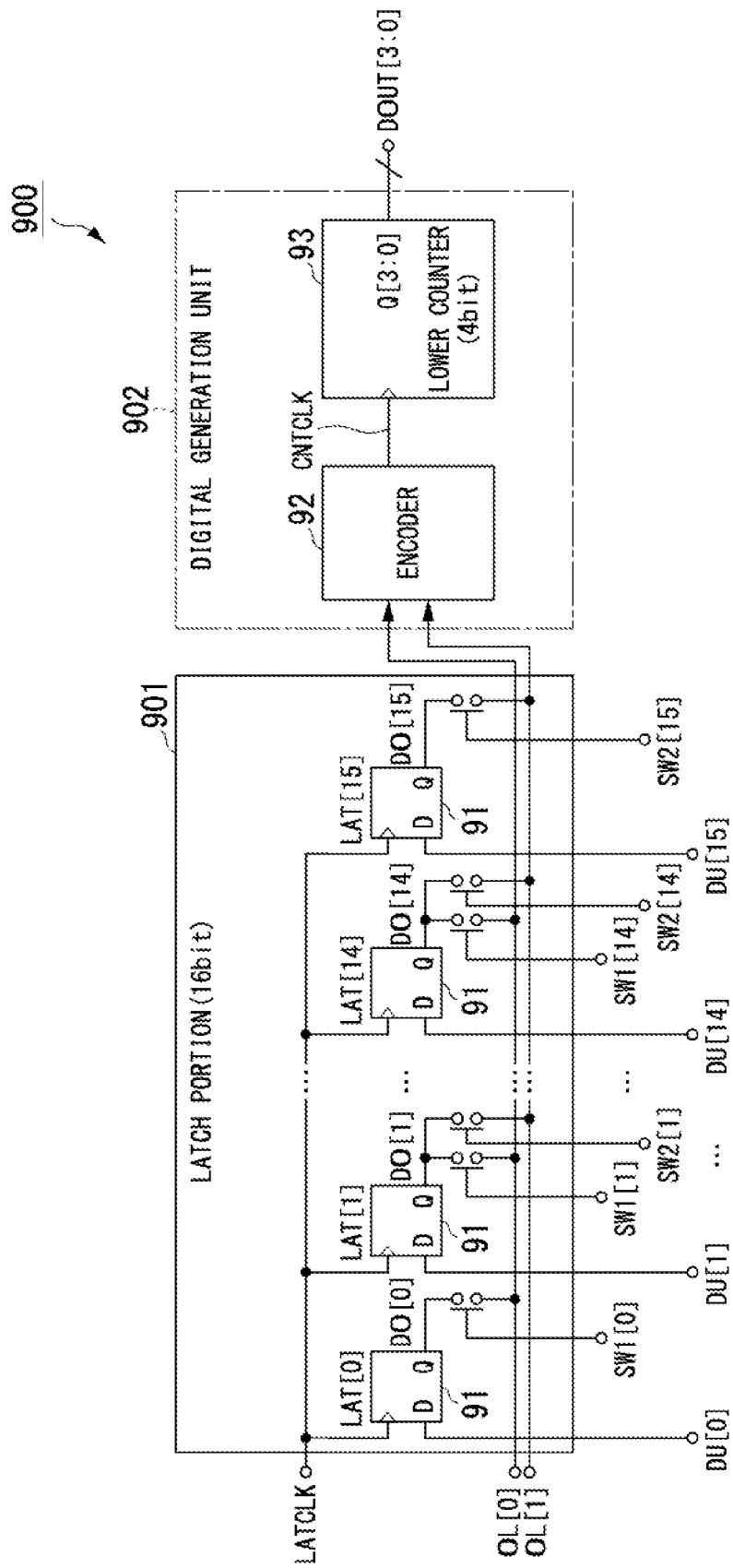
FIG. 20 is a block diagram illustrating a schematic configuration of a data processing circuit included in a conventional A/D conversion circuit.
Figure 21:
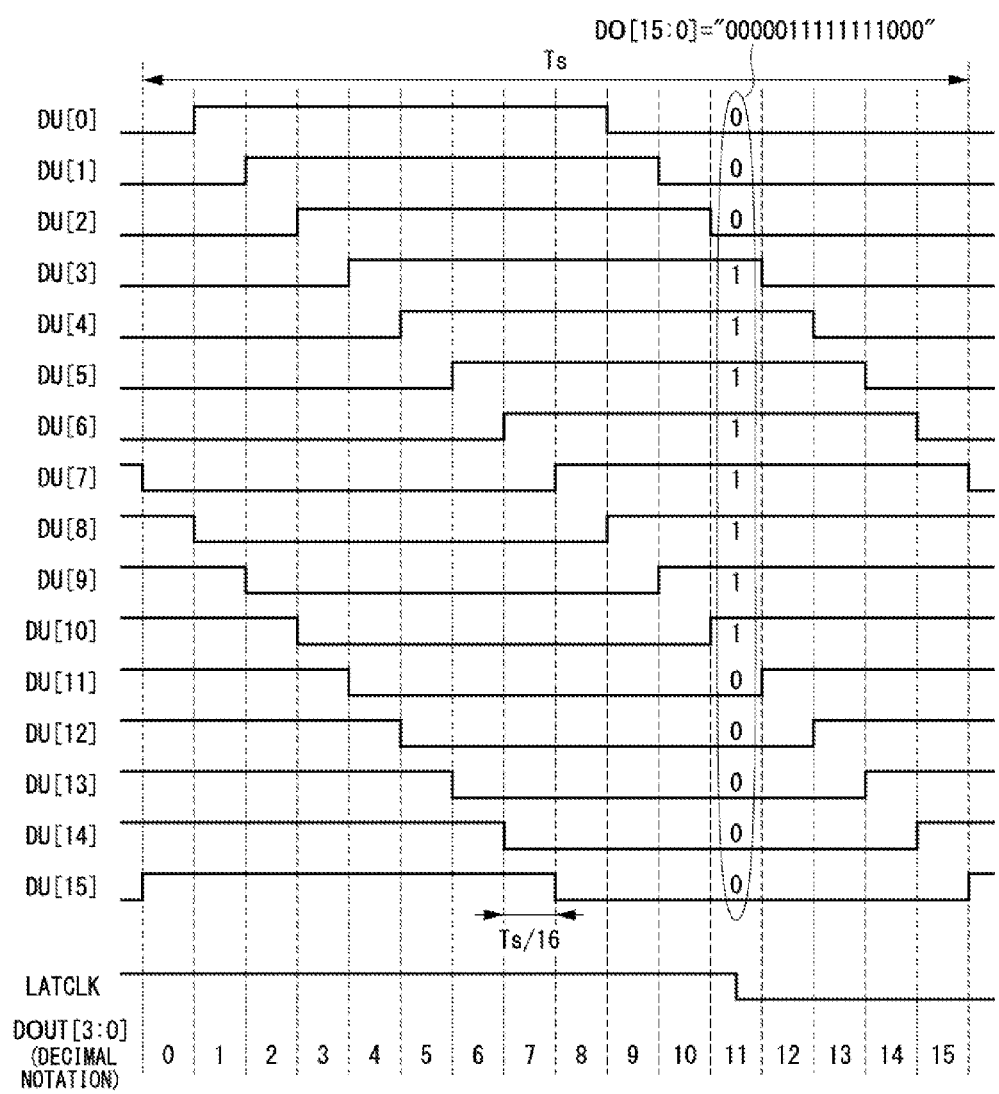
FIG. 21 is a timing chart illustrating an example of a timing of a multi-phase clock and a latch clock input to the data processing circuit included in the conventional A/D conversion circuit.
Figure 22:
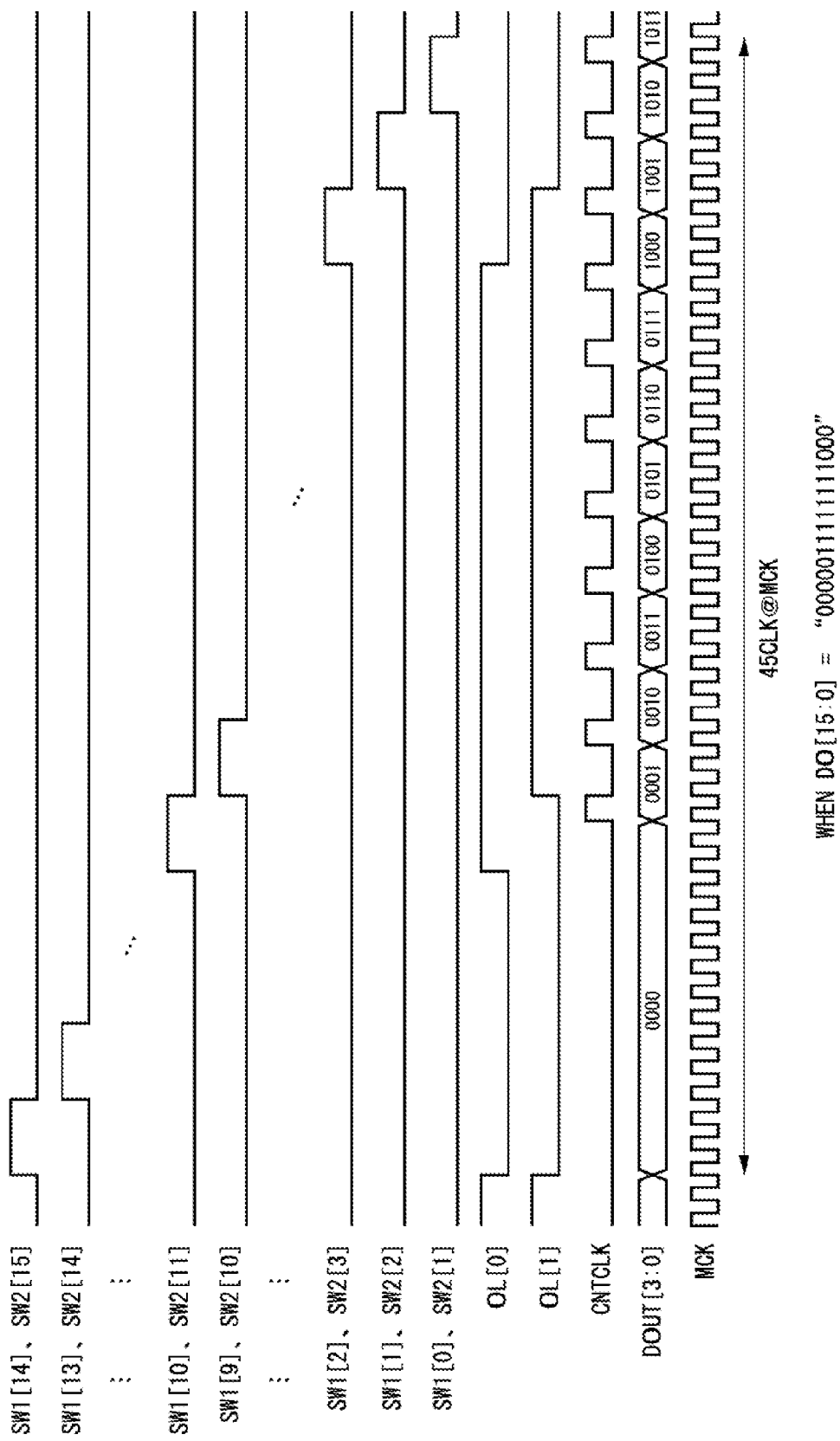
FIG. 22 is a timing chart illustrating an example of a timing of an operation of binarizing a state of a phase of the multi-phase clock in the data processing circuit included in the conventional A/D conversion circuit.

Thus, in the data processing circuit 100 of the first embodiment, it is possible to shorten a data processing time in comparison with the conventional data processing circuit 900 without sacrificing performance of outputting the 4-bit digital signal DOUT[3:0] indicating a total of sixteen states of phases of the multi-phase clock DU input to the data processing circuit 100, similar to the conventional data processing circuit 900 illustrated in FIG. 20. In the data processing circuit 100 of the first embodiment, it is possible to reduce a circuit scale of the data processing circuit 100 itself in comparison with the conventional data processing circuit 900 since it is possible to reduce the number of latch circuits 11 and the number of readout switch signals SW1 and SW2 as described above.

In the data processing circuit 100 of the first embodiment, upper 2 bits (digital signal DOUT[3:2]) of the 4-bit digital signal DOUT[3:0] can be determined based on the signal output from the latch portion 101 or the operational result of the logic operation. Accordingly, in the data processing circuit 100 of the first embodiment, the number of bits of the lower counter 14 counting the number of instances of "high" of the count clock CNTCLK can be reduced by 2 bits relative to 4 bits of the conventional data processing circuit 900. Accordingly, in the data processing circuit 100 of the first embodiment, it is possible to change the lower counter 14 from a 4-bit counter to a 2-bit counter and to reduce a circuit scale or power consumption of the data processing circuit 100 itself in comparison with the conventional data processing circuit 900.

Second Embodiment

Figure 5:
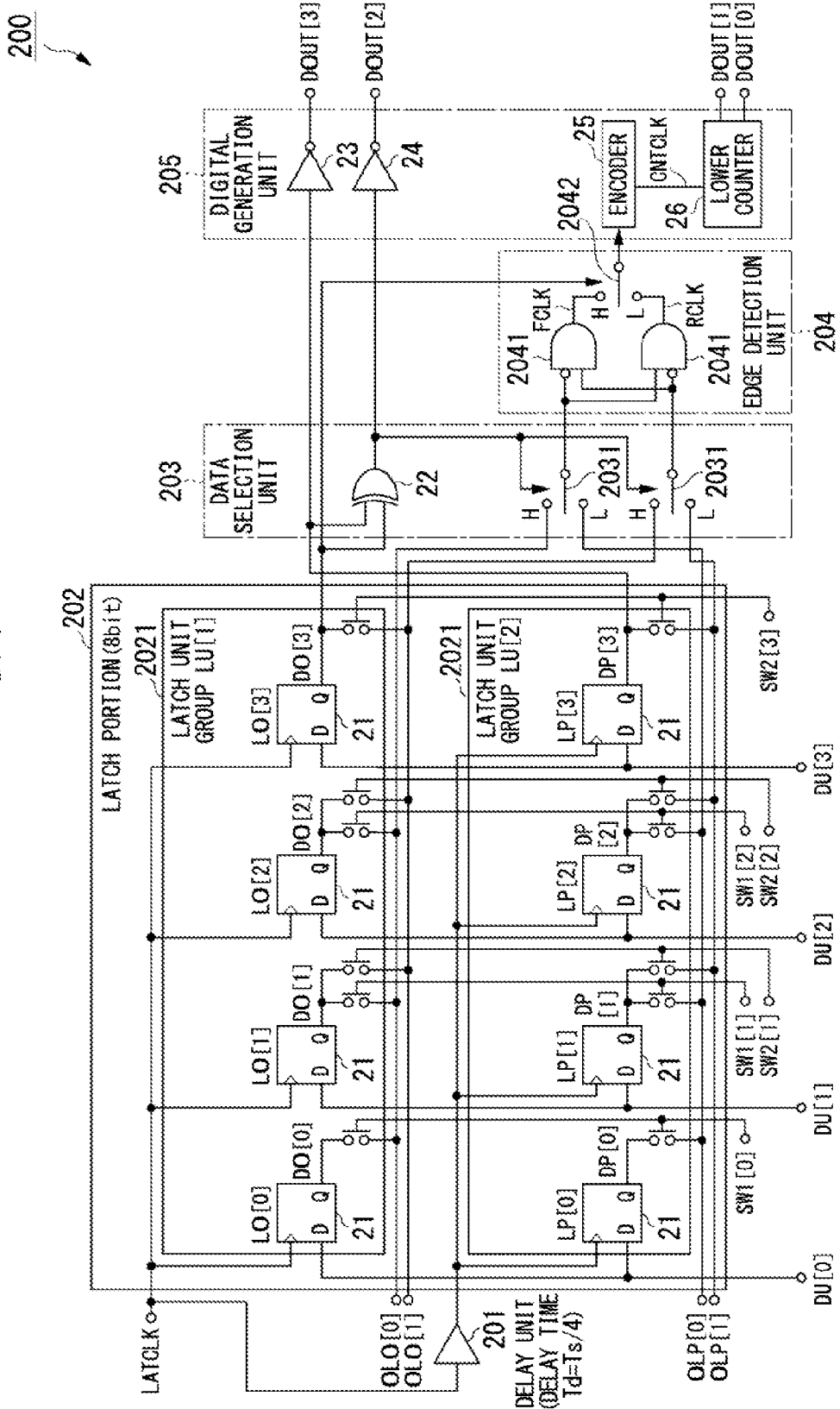
FIG. 5 is a block diagram illustrating a schematic configuration of the data processing circuit in a second embodiment of the present invention.

Next, a second embodiment of the present invention will be described. FIG. 5 is a block diagram illustrating a schematic configuration of a data processing circuit in the second embodiment. A data processing circuit 200 illustrated in FIG. 5 includes a delay unit 201, a latch portion 202, a data selection unit 203, an edge detection unit 204, and a digital generation unit 205. The data processing circuit 200 illustrated in FIG. 5 is a data processing circuit that holds states of phases of a multi-phase clock DU of four phases in the latch portion 202 at a predetermined timing, for example, a timing at which a comparator (not illustrated) has completed a comparison process using two latch unit groups and digitizes the held states of the phases of the multi-phase clock DU using the digital generation unit 205 to generate and output a binarized 4-bit digital signal DOUT[3:0].

The data processing circuit 200 illustrated in FIG. 5 is a data processing circuit that generates and outputs the binarized 4-bit digital signal DOUT[3:0] using two latch unit groups, similar to the data processing circuit 100 of the first embodiment illustrated in FIG. 1. However, in addition to the components of the data processing circuit 100 of the first embodiment, the data processing circuit 200 illustrated in FIG. 5 includes the delay unit 201 in order to generate the 4-bit digital signal DOUT[3:0] from the states of the phases of the multi-phase clock DU of four phases, unlike the data processing circuit 100 of the first embodiment.

The delay unit 201 is a circuit that generates a latch clock DLYCLK obtained by delaying a latch clock LATCLK by a certain delay time Td, which is determined in advance, and outputs the generated latch clock DLYCLK to the latch portion 202. The delay time Td by which the delay unit 201 delays the latch clock LATCLK is determined based on the number of latch unit groups included in the latch portion 202, the number of latch circuits included in each latch unit group, and the number of states indicated by the digital signal output by the data processing circuit 200. A detailed description of a method of determining the delay time Td will be described below. In the data processing circuit 200 of the second embodiment, when a period of a clock signal of each phase of the multi-phase clock DU is a period Ts, the delay time Td is set so that Td=Ts/4.

The latch portion 202 is a circuit that latches (holds) the states of the clock signals of the respective phases of the multi-phase clock DU of four phases, and includes, as latch unit groups, two (n=2) latch unit groups 2021 each including four latch circuits (latch units) 21. The latch portion 202 includes switch(es) corresponding to each latch circuit 21 in order to read the state of the clock signal of each phase of the multi-phase clock DU of four phases latched in each latch circuit 21 included in the latch portion 202. In FIG. 5, "LU" is given as a reference sign of the latch unit group 2021, "LO" or "LP" is given as a reference sign of the latch circuit 21, and a bit of each of the latch unit groups 2021 and the latch circuit 21 is indicated by a number in brackets ("[ ]") subsequent to each reference sign. More specifically, the latch portion 202 includes a latch unit group LU[1] and a latch unit group LU[2], the latch unit group LU[1] includes four latch circuits LO[0], LO[1], . . . , LO[3], and the latch unit group LU[2] includes four latch circuits LP[0], LP[1], . . . , LP[3]. Each bit of the latch circuit LO[3:0] and the latch circuit LP[3:0] corresponds to a phase of the multi-phase clock DU[3:0] of four phases. For example, the latch circuit LO[2] and the latch circuit LP[2] correspond to a multi-phase clock DU[2] of a third phase of the multi-phase clock DU.

Each latch circuit 21 in the latch unit group 2021 latches a state of "high" or "low" of the clock signal of a phase of the corresponding multi-phase clock DU at a timing of a falling edge of the latch clock LATCLK or the latch clock DLYCLK. More specifically, the respective latch circuits LO[0], LO[1] . . . , LO[3] in the latch unit group LU[1] latch states of high or low of the multi-phase clocks DU[0], DU[1], . . . , DU[3] at the timing of the falling edge of the latch clock LATCLK. The respective latch circuits LP[0], LP[1], . . . , LP[3] in the latch unit group LU[2] latch states of high or low of the multi-phase clocks DU [0], DU[1], . . . , DU[3] at the timing of the falling edge of the latch clock DLYCLK.

Also, each latch circuit LO[3:0] in the latch unit group LU[1] sequentially outputs an output signal DO[3:0] indicating the latched state of the clock signal of each phase of the multi-phase clock DU to a readout line OLO[1:0] according to a timing of corresponding readout switch signals SW1 [2:0] and SW2 [3:1]. Each latch circuit LP[3:0] in the latch unit group LU[12] sequentially outputs an output signal DP[3:0] indicating the latched state of the clock signal of each phase of the multi-phase clock DU to a readout line OLP[1:0] according to a timing of the corresponding readout switch signals SW1 [2:0] and SW2 [3:1].

Here, a method of determining the delay time Td by which the delay unit 201 delays the latch clock LATCLK will be described. The delay time Td is determined based on the number of latch unit groups 2021 included in the latch portion 202, the number of latch circuits 21 included in each latch unit group 2021, and the number of states indicated by a digital signal output by the data processing circuit 200, as described above. The delay time Td is set to a time obtained by delaying the period of the multi-phase clock DU by a value obtained by dividing the number of latch circuits 21 included in the latch unit group 2021 by the number of states indicated by the digital signal DOUT[3:0]. Also, the latch clocks DLYCLK sequentially delayed by the set delay time Td are prepared by the number of latch unit groups 2021 included in the latch portion 202 minus 1 stage. Accordingly, the latch clocks corresponding to the number of latch unit groups 2021 included in the latch portion 202 are prepared together with the latch clock LATCLK.

In the data processing circuit 200 of the second embodiment, since the number of latch unit groups 2021 included in the latch portion 202 is 2, the number of latch circuits 21 included in each latch unit group 2021 is 4, and the data processing circuit 200 outputs the 4-bit digital signal DOUT [3:0], the number of states indicated by the digital signal DOUT[3:0] is 16. Therefore, the delay time Td is Td=Ts×4/16=Ts/4. In the data processing circuit 200 of the second embodiment, the latch clock DLYCLK delayed by the delay time Td=Ts/4 is prepared by the number of latch unit groups 2021 included in the latch portion 202 minus 1 stage, i.e., 2−1=1 stage.

The data selection unit 203 is a circuit which selects any one of a signal of any 2 bits of the output signal DO[3:0]

sequentially output to the readout line OLO[1:0] and a signal of any 2 bits of the output signal DP[3:0] sequentially output to the readout line OLP[1:0] from the respective latch unit groups 2021 included in the latch portion 202. The data selection unit 203 includes an EXOR circuit 22 that performs an EXOR operation, and two switches 2031. The data selection unit 203 outputs a 2-bit output signal of any one of the output signal DO[3:0] of the latch circuit 21 in the latch unit group LU[1] and the output signal DP[3:0] of each latch circuit 21 in the latch unit group LU[2] to the edge detection unit 204 by selecting one of the readout line OLO[1:0] and the readout line OLP[1:0].

The selection of the output signal DO or the output signal DP output to the edge detection unit 204 by the data selection unit 203 is performed based on values of the output signal DO[3] of the latch circuit LO[3] in the latch unit group LU[1] and the output signal DP[3] of the latch circuit LP[3] in the latch unit group LU[2]. More specifically, the EXOR circuit 22 performs the EXOR operation of the value of the output signal DO[3] and the value of the output signal DP[3], and each switch 2031 selects the readout line OLO or the readout line OLP to be connected to the edge detection unit 204 based on a result of the EXOR operation. Also, when an operational result of the EXOR circuit 22 is "high." namely when the value of the output signal DO[3] and the value of the output signal DP[3] are different values, the readout line OLO[1:0] is connected to the edge detection unit 204, and when the operational result of the EXOR circuit 22 is "low," namely, when the value of the output signal DO[3] and the value of the output signal DP[3] are the same value, the readout line OLP[1:0] is connected to the edge detection unit 204.

In other words, the data selection unit 203 outputs the held state of any one of the multi-phase clock DU[3:0] at a timing of the falling edge of LATCLK and the multi-phase clock DU[3:0] at a timing of the falling edge of DLYCLK to the edge detection unit 204 according to states of the multi-phase clock DU[3] latched at a timing of the falling edge of the latch clock LATCLK and the multi-phase clock DU[3] latched at a timing of the falling edge of the multi-phase clock DLYCLK delayed by the delay time Td (=Ts/4) from the latch clock LATCLK. That is, the data selection unit 203 outputs the state of the phase of the multi-phase clock DU[3:0] at a timing of the falling edge of LATCLK to the edge detection unit 204 when states of the multi-phase clock DU[3] at a timing of the falling edge of LATCLK and the multi-phase clock DU[3] at a timing of the falling edge of DLYCLK are different states, and outputs the state of the phase of the multi-phase clock DU[3:0] at a timing of the falling edge of DLYCLK to the edge detection unit 204 when states of the multi-phase clock DU[3] at a timing of the falling edge of LATCLK and the multi-phase clock DU[3] at a timing of the falling edge of DLYCLK are the same state.

The data selection unit 203 outputs the result of the EXOR circuit 22 performing the EXOR operation of the value of the output signal DO[3] of the latch circuit LO[3] in the latch unit group LU[1] and the value of the output signal DP[3] of the latch circuit LP[3] in the latch unit group LU[2] to the digital generation unit 205.

The edge detection unit 204 is a circuit that detects a timing of a rising edge and a falling edge of the multi-phase clock DU based on the signal of the readout line OLO[1:0] or the readout line OLP[1:0] connected to the data selection unit 203, and includes two AND gates 2041 that perform an OR operation, and a switch 2042. The edge detection unit 204 outputs any one of a signal indicating a timing of the rising edge of the multi-phase clock DU and a signal indicating a timing of the falling edge of the multi-phase clock DU, which are included in the output signal DO[3:0] or the output signal DP[3:0] input from the data selection unit 203, to the digital generation unit 205 based on the value of the output signal DO[3] of the latch circuit LO[3] in the latch unit group LU[1].

More specifically, the respective AND gates 2041 generate a clock RCLK indicating the timing of the rising edge of the multi-phase clock DU and a clock FCLK indicating a timing of the falling edge of the multi-phase clock DU based on the signal of the connected readout line OLO[1:0] or the signal of the connected readout line OLP[1:0]. Also, the switch 2042 selects any one of the clock RCLK and the clock FCLK based on the value of the output signal DO[3] of the latch circuit LO[3] in the latch unit group LU[1], and outputs the selected clock to the digital generation unit 205. In other words, when the value of the output signal DO[3] is "low," the edge detection unit 204 outputs the clock RCLK generated based on the rising edge of the multi-phase clock DU included in the output signal DO[3:0] or the output signal DP[3:0] to the digital generation unit 205. When the value of the output signal DO[3] is "high," the edge detection unit 204 outputs the clock FCLK generated based on the falling edge of the multi-phase clock DU included in the output signal DO[3:0] or the output signal DP[3:0] to the digital generation unit 205.

The digital generation unit 205 is a circuit that binarizes the state of the phase of the multi-phase clock DU at a predetermined timing, based on the signal indicating a timing of the rising edge or the falling edge of the multi-phase clock DU input from the edge detection unit 204 to generate the 4-bit digital signal DOUT[3:0] and includes, for example, a NOT circuit 23 and a NOT circuit 24 that invert a logic, an encoder 25, and a lower counter 26. In the digital generation unit 205 illustrated in FIG. 5, the digital signal DOUT[3] is generated by inverting a logic of the output signal DP[3] output from the latch portion 202 using the NOT circuit 23, and the digital signal DOUT[2] is generated by inverting a logic of the result of the EXOR operation of the EXOR circuit 22 input from the data selection unit 203 using the NOT circuit 24. The digital signal DOUT[1:0] is generated by the encoder 25 and the lower counter 26.

The encoder 25 includes a general logic circuit, and generates a count clock CNTCLK to be counted by the lower counter 26 according to the signal indicating the timing of the rising edge or the falling edge of the multi-phase clock DU input from the edge detection unit 204.

The lower counter 26 generates the binarized digital signal DOUT[1:0] of 2 bits by counting the number of instances of "high" of the count clock CNTCLK. The encoder 25 and the lower counter 26 differ from the conventional data processing circuit (e.g., the encoder 92 and the lower counter 93 illustrated in FIG. 20) in the number of bits of the generated digital signal DOUT, but perform the same operation as the conventional data processing circuit.

Through such a configuration, the data processing circuit 200 generates and outputs the binarized 4-bit digital signal DOUT[3:0] by digitizing the states of the phases of the multi-phase clock DU of four phases.

While the configuration when the digital generation unit 205 generates the digital signal DOUT[1:0] using the encoder 25 and the lower counter 26 has been shown in the data processing circuit 200 of the second embodiment, a configuration for generating the digital signal DOUT[1:0] is not limited to the configuration described above and the digital signal DOUT[1:0] may be generated by any configuration or method.

Figure 6A:
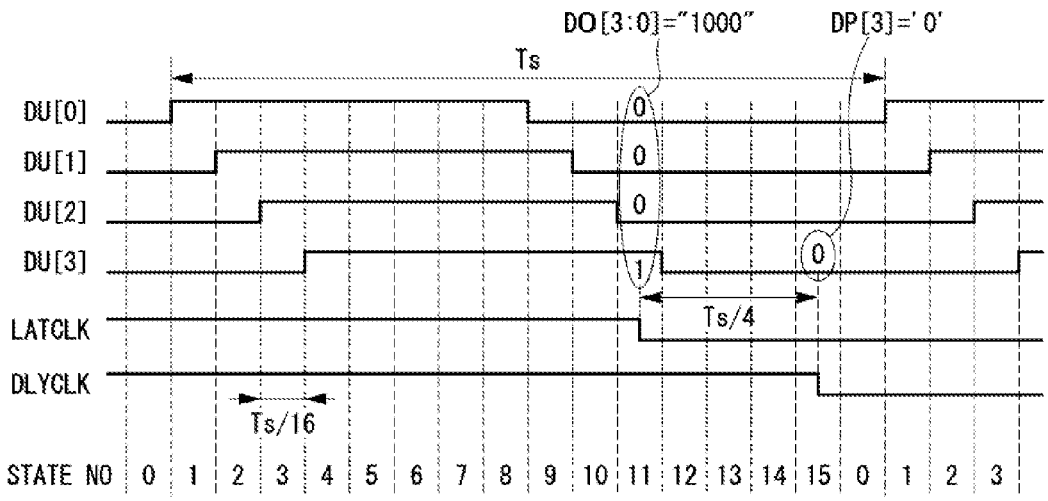
FIG. 6A is a timing chart illustrating an example of a timing of a multi-phase clock and a latch clock input to the data processing circuit of the second embodiment.
Figure 6B:
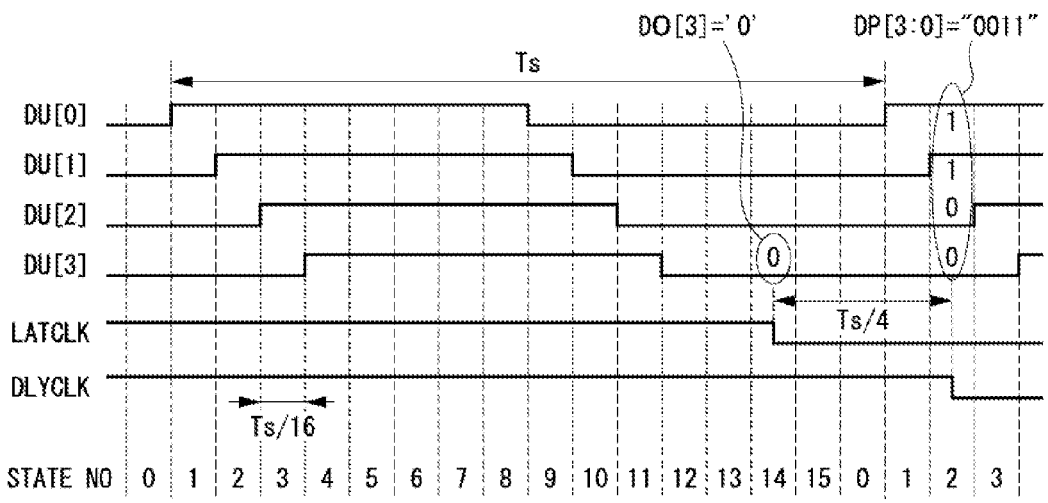
FIG. 6B is a timing chart illustrating an example of a timing of a multi-phase clock and a latch clock input to the data processing circuit of the second embodiment.
Figure 7B:
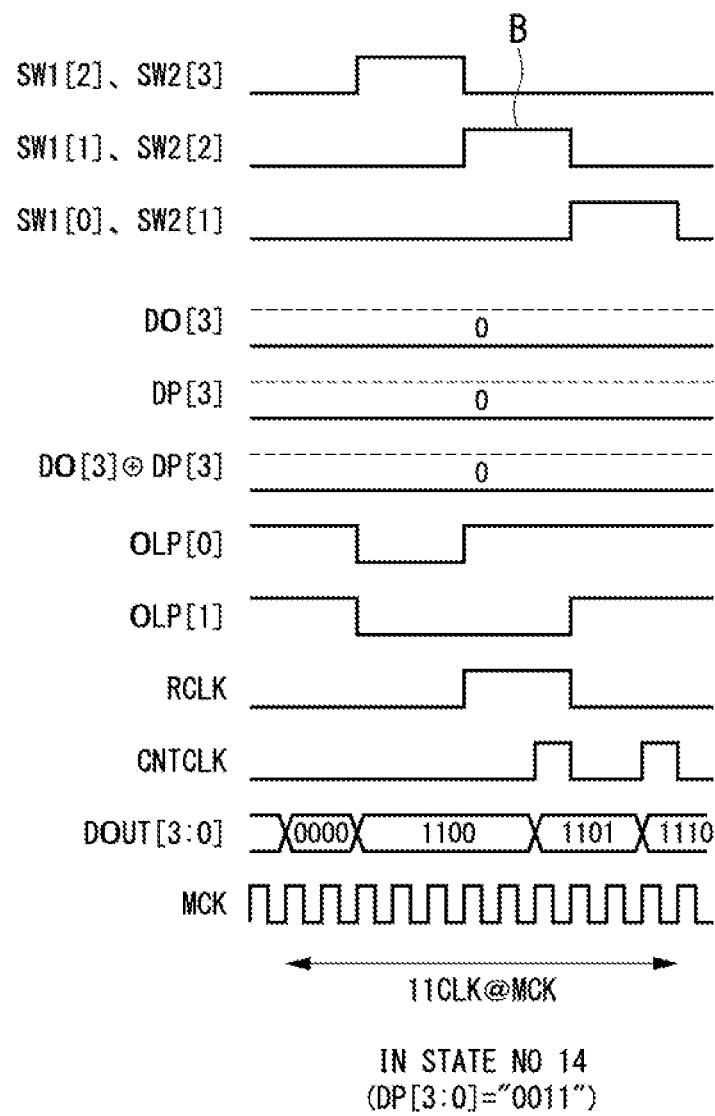
FIG. 7B is a timing chart illustrating an example of a timing of an operation of binarizing a state of a phase of the multi-phase clock in the data processing circuit of the second embodiment.

Next, a data processing method when the data processing circuit 200 of the second embodiment generates the digital signal DOUT[3:0] will be described. FIGS. 6A and 6B are timing charts illustrating an example of timings of the multi-phase clock DU and the latch clocks LATCLK and DLYCLK input to the data processing circuit 200 of the second embodiment. In FIGS. 6A and 6B, an example of the multi-phase clock DU[3:0] of four phases having a phase difference of Ts/116 when a period of a clock signal of each phase of the multi-phase clock DU is a period Ts is illustrated. FIGS. 7A and 7B are timing charts illustrating an example of a timing of an operation of binarizing the states of the phases of the multi-phase clock DU in the data processing circuit 200 of the second embodiment.

In FIGS. 6A and 6B, state No indicating a state of a phase of the multi-phase clock DU of each phase is illustrated to distinguish a total of sixteen states of "high" or "low" of the multi-phase clock DU[3:0] generated by varying the period by Ts/16. The state of the phase of the multi-phase clock DU is repeated as state No=0, 1, 2, . . . 14, 15, 0, 1, 2, . . . over time. The same state No corresponding to state No illustrated in FIGS. 6A and 6B is illustrated in FIGS. 7A and 7B.

Each latch circuit LO[3:0] in the latch unit group LU[1] latches the state of the clock signal of each phase of the corresponding multi-phase clock DU at a timing at which the latch clock LATCLK is inverted (a timing of a falling edge of the latch clock LATCLK), as illustrated in FIGS. 6A and 613. Then, the latch clock DLYCLK is inverted at a timing delayed by Ts/4 from the timing at which the latch clock LATCLK is inverted. Also, each latch circuit LP[3:0] in the latch unit group LU[2] latches the state of the clock signal of each phase of the corresponding multi-phase clock DU at a timing at which the latch clock DLYCLK is inverted (a timing of the falling edge). Also, the data selection unit 203 selects any one of the readout line OLO[1:0] and the readout line OLP[1:0] to be connected to the edge detection unit 204 based on the value of the output signal DO[3] of the latch circuit LO[3] in the latch unit group LU[1] and the value of the output signal DP[3] of the latch circuit LP[3] in the latch unit group LU[2].

A timing at which the latch clock LATCLK is inverted in state No 11 is illustrated in FIG. 6A, and a timing at which the latch clock LATCLK is inverted in state No 14 is illustrated in FIG. 6A. A timing chart of an operation of the data processing circuit 200 corresponding to FIG. 6A is illustrated in FIG. 7A, and a timing chart of an operation of the data processing circuit 200 corresponding to FIG. 6B is illustrated in FIG. 7B.

The value of the output signal DO[3] of the latch circuit LO[3] at a timing at which the latch clock LATCLK is inverted (falls) in state No 11 illustrated in FIG. 6A is "1." The value of the output signal DP[3] of the latch circuit LP[3] at a timing at which the subsequent latch clock DLYCLK is inverted (falls) is "0." Therefore, the EXOR circuit 22 outputs "high"="1" as a result of performing the EXOR operation of the value of the output signal DO[3] and the value of the output signal DP[3], and the respective switches 2031 select the readout line OLO[1:0]. Accordingly, the data selection unit 203 outputs the output signal DO[3:0]="1000" latched in the latch circuit LO[3:0] in the latch unit group LU[1] to the edge detection unit 204. Since the value of the output signal DO[3] of the latch circuit LO[3] at a timing of the falling edge of the latch clock LATCLK is "1," the switch 2042 selects the clock FCLK indicating the timing of the falling edge of the multi-phase clock DLU.

Also, the output signal DO[3:0] is sequentially output by 2 bits to the readout line OLO[1:0] based on the readout switch signals SW1 [2:0] and SW2 [3:1], as illustrated in FIG. 7A. In this case, the AND gate 2041 generating the clock FCLK in the edge detection unit 204 generates the clock FCLK based on the signal of the connected readout line OLO[1:0]. Since the output signal DO[3:0] in state No 11 is "1000," the clock FCLK that becomes "high" when the output signal DO[2] is output to the readout line OLO[0] and the output signal DO[3] is output to the readout line OLO[1] (at a timing A illustrated in FIG. 7A) is generated by the AND gate 2041, as illustrated in FIG. 7A.

Also, the encoder 25 initiates generation of the count clock CNTCLK when the clock FCLK is input. When the output signal DO[3:0]="1000," the encoder 25 generates the count clock CNTCLK that becomes "high" three times before the reading of all bits of the output signal DO[3:0] ends, as illustrated in FIG. 7A.

The lower counter 26 generates the binarized 2-bit digital signal DOUT[1:0]="11" by counting the number of instances of "high" of the count clock CNTCLK. The digital generation unit 205 outputs, as the digital signal DOUT[3]. "1" obtained by inverting a logic of the output signal DP[3]="0" output from the latch portion 202 using the NOT circuit 23, and outputs, as the digital signal DOUT[2], "0" obtained by inverting a logic of "high"="1" output as a result of the EXOR circuit 22 performing the EXOR operation using the NOT circuit 24. Thus, the data processing circuit 200 generates and outputs a digital signal DOUT[3:0]="1011" ("11" in decimal notation) as the 4-bit digital signal obtained by binarizing the states of the phases of the multi-phase clock DU of four phases in state No 11.

In state No 14 illustrated in FIG. 6B, the value of the output signal DO[3] of the latch circuit LO[3] at a timing at which the latch clock LATCLK is inverted (falls) is "0." The value of the output signal DP[3] of the latch circuit LP[3] at a timing at which the subsequent latch clock DLYCLK is inverted (falls) is "0." Therefore, the EXOR circuit 22 outputs "low"="0" as a result of performing the EXOR operation of the value of the output signal DO[3] and the value of the output signal DP[3], and the respective switches 2031 select the readout line OLP[1:0]. Accordingly, the data selection unit 203 outputs the output signal DP[3:0]="0011" latched in the latch circuit LP[3:0] in the latch unit group LU[2] to the edge detection unit 204. Since the value of the output signal DO[3] of the latch circuit LO[3] at a timing of the falling edge of the latch clock LATCLK is "0," the switch 2042 selects the clock RCLK indicating a timing of the rising edge of the multi-phase clock DU.

Also, the output signal DP[3:0] is sequentially output by 2 bits to the readout line OLP[1:0] based on the readout switch signals SW1 [2:0] and SW2 [3:1], as illustrated in FIG. 7B. The AND gate 2041 generating the clock RCLK in the edge detection unit 204 generates the clock RCLK based on a signal of the connected readout line OLP[1:0]. Since the output signal DP[3:0] in state No 14 is "0011," the clock RCLK that becomes "high" when the output signal DP[1] is output to the readout line OLP[0] and the output signal DP[2] is output to the readout line OLP[1] (at a timing B illustrated in FIG. 7B) is generated by the AND gate 2041, as illustrated in FIG. 7B.

Also, the encoder 25 initiates generation of the count clock CNTCLK when the clock RCLK is input, similar to state No 11 illustrated in FIG. 7A. When the output signal DP[3:0]= "0011," the encoder 25 generates the count clock CNTCLK that becomes "high" twice before the reading of all bits of the output signal DP[3:0] ends, as illustrated in FIG. 7B.

The lower counter 26 generates a binarized 2-bit digital signal DOUT[1:0]="10" by counting the number of instances of "high" of the count clock CNTCLK. The digital generation unit 205 outputs, as the digital signal DOUT[3], "1" obtained by inverting a logic of the output signal DP[3]="0" output from the latch portion 202 using the NOT circuit 23, and outputs, as the digital signal DOUT[2], "1" obtained by inverting a logic of "low"="0" output as a result of the EXOR circuit 22 performing the EXOR operation using the NOT circuit 24. Thus, the data processing circuit 200 generates and outputs a digital signal DOUT[3:0]="1110" ("14" in decimal notation) as the 4-bit digital signal obtained by binarizing the states of the phases of the multi-phase clock DU of four phases in state No 14.

Thus, the data processing circuit 200 selects the readout line OLO or the readout line OLP and the clock indicating the timing of the edge of the multi-phase clock DU used to generate the 2-bit digital signal DOUT[1:0], based on the current state of the multi-phase clock DU[3] of the fourth phase in the multi-phase clock DU of four phases and the state delayed by the delay time Td(=Ts/4). Also, in the data processing circuit 200, the digital signal DOUT[3] is obtained by inverting the logic of the current state of the multi-phase clock DU[3] of the fourth phase, the digital signal DOUT[2] is obtained by inverting the logic of the result of the EXOR circuit 22 performing the EXOR operation, and the digital signal DOUT[3] and the digital signal DOUT[2] are combined with the digital signal DOUT[1:0], which are output as the 4-bit digital signal DOUT[3:0] obtained by digitizing (binarizing) the states of the phases of the multi-phase clock DU of four phases.

While the cases of state No 11 and state No 14 have been described above, a total of sixteen digital signals DOUT[3:0] may be output in the data processing of the data processing circuit 200 by considering the same in other state Nos.

Here, the sixteen digital signals DOUT[3:0] generated in the data processing of the data processing circuit 200 will be described. FIG. 8 is a truth table indicating a relationship between the output of the latch circuit 21 and the output of each component included in the data processing circuit 200 of the second embodiment. A relationship among the output signal DO and the output signal DP of the latch circuit 21, a state of the switch 2031 in the data selection unit 203, a state of the switch 2042 in the edge detection unit 204, and the digital signal DOUT[3:0] in each of a total of sixteen states of the multi-phase clock DU[3:0] input to the data processing circuit 200 is illustrated in FIG. 8.

Each of the state of the switch 2031 in the data selection unit 203 and the state of the switch 2042 in the edge detection unit 204 may be divided into two states based on the value of the output signal DO[3] and the value of the output signal DP[3] of the latch circuit 21, as illustrated in FIG. 8. In other words, each state of the data processing in the data processing circuit 200 may be divided into four states based on the state of the switch 2031 in the data selection unit 203 and the state of the switch 2042 in the edge detection unit 204. Also, from these four states, each of the sixteen states in the multi-phase clock DU[3:0] can be identified.

For example, in state No 11 illustrated in FIGS. 6A and 7A, the two switches 2031 in the data selection unit 203 are "high"="1" based on the output signal DO[3]="11" and the output signal DP[3]="0" of the latch circuit 21, and the switch 2042 in the edge detection unit 204 is "high"="1." Accordingly, the data selection unit 203 connects the readout line OLO[1:0] to the edge detection unit 204, and the edge detection unit 204 outputs the clock FCLK indicating the timing of the falling edge of the multi-phase clock DU included in the signal of the connected readout line OLO[1:0]. Accordingly, the digital generation unit 205 outputs the digital signal DOUT[3:0]="1011" ("11" in decimal notation).

As described above, the data processing circuit 200 of the second embodiment includes the edge detection unit 204, similar to the data processing circuit 100 of the first embodiment illustrated in FIG. 1. Accordingly, the operation state of the data processing circuit 200 may be divided into two states: a state when the switch 2042 in the edge detection unit 204 is "high"="1" and a state when the switch 2042 in the edge detection unit 204 is "low"="0," and a total of sixteen states of the multi-phase clock DU[3:0] input to the data processing circuit 200 may be isolated into sets of eight states, as illustrated in FIG. 8, similar to the data processing circuit 100 of the first embodiment. Accordingly, in the data processing circuit 200 of the second embodiment, the number of latch circuits 21 in the latch portion 202 can be reduced to 8, which is a half of the number of latch circuits 91 in the latch portion 901 included in the conventional data processing circuit 900 illustrated in FIG. 20, and the number of switches corresponding to any one of the readout switch signals SW1 and SW2 can be reduced to 12, which is a reduction by 18, similar to the data processing circuit 100 of the first embodiment.

The data processing circuit 200 of the second embodiment includes the data selection unit 203, similar to the data processing circuit 100 of the first embodiment illustrated in FIG. 1. Accordingly, the operation state of the data processing circuit 200 may be divided into two states: states when the two switches 2031 in the data selection unit 203 are "high"="1" and when the two switches 2031 are "low"="0," and may be isolated into four states together with the respective operation states of the data processing circuit 200, which have been divided into the two states by including the edge detection unit 204, as illustrated in FIG. 8, similar to the data processing circuit 100 of the first embodiment. Accordingly, in the data processing circuit 200 of the second embodiment, the latch circuits 21 in the latch portion 202 whose number has been reduced to 8 can be divided into the two latch unit groups 2021 each including four latch circuits, and the latch portion 202 may output only any one of the 4-bit output signal DO and the 4-bit output signal DP latched in the respective latch circuits 21 included in the latch unit group 2021, similar to the data processing circuit 100 of the first embodiment. Accordingly, in the data processing circuit 200 of the second embodiment, each of the numbers of the respective readout switch signals can be reduced to 3, which is a reduction by 12, similar to the data processing circuit 100 of the first embodiment.

Accordingly, in the data processing circuit 200 of the second embodiment, for example, when the clock is converted to a master clock MCLK, all 4 bits of the output signal DO can be read in a time corresponding to 11 clocks, as illustrated in FIGS. 7A and 7B, and a time can be shortened to a time corresponding to 34 clocks in comparison with a time corresponding to 45 clocks necessary in the conventional data processing circuit 900 illustrated in FIG. 20, similar to the data processing circuit 100 of the first embodiment.

The data processing circuit 200 of the second embodiment includes the delay unit 201. Accordingly, the number of phases of the multi-phase clock DU can be 4, which is a half of the eight phases in the data processing circuit 100 of the first embodiment. Accordingly, in the data processing circuit 200 of the second embodiment, it is possible to facilitate generation of the multi-phase clock DU to be input to perform data processing and to support higher-speed data processing in comparison with the data processing circuit 100 of the first embodiment.

Thus, even in the data processing circuit 200 of the second embodiment, it is possible to shorten a data processing time in comparison with the conventional data processing circuit 900 without sacrificing performance of outputting the 4-bit digital signal DOUT indicating a total of sixteen states of phases of the multi-phase clock DU input to the data processing circuit 200, similar to the conventional data processing circuit 900 illustrated in FIG. 20.

In the data processing circuit 200 of the second embodiment, it is possible to reduce the number of latch circuits 21 and the number of readout switch signals SW1 and SW2, and to determine the upper 2 bits (digital signal DOUT[3:2]) of the 4-bit digital signal DOUT[3:0] based on the signal output from the latch portion 202 or the operational result of the logic operation, similar to the data processing circuit 100 of the first embodiment. Accordingly, in the data processing circuit 200 of the second embodiment, it is possible to reduce a circuit scale or power consumption of the data processing circuit 200 itself in comparison with the conventional data processing circuit 900, similar to the data processing circuit 100 of the first embodiment.

Third Embodiment

Figure 9:
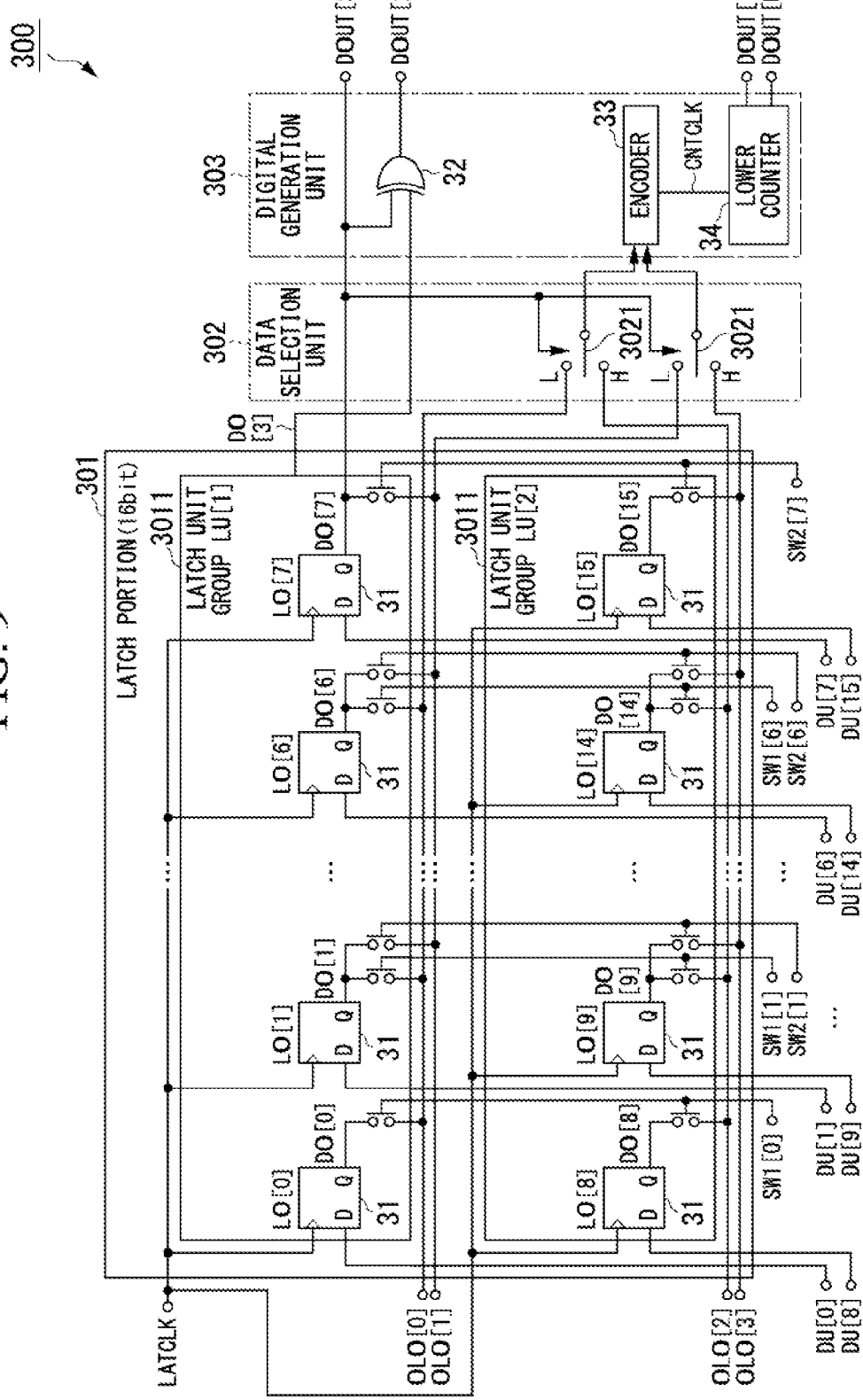
FIG. 9 is a block diagram illustrating a schematic configuration of a data processing circuit of a third embodiment of the present invention.

Next, a third embodiment of the present invention will be described. FIG. 9 is a block diagram illustrating a schematic configuration of a data processing circuit in the third embodiment. A data processing circuit 300 illustrated in FIG. 9 includes a latch portion 301, a data selection unit 302, and a digital generation unit 303. The data processing circuit 300 illustrated in FIG. 9 is a data processing circuit that holds states of phases of a multi-phase clock DU of sixteen phases in the latch portion 301 at a predetermined timing, for example, a timing at which a comparator (not illustrated) has completed a comparison process using two latch unit groups, and digitizes the held state of the phase of the multi-phase clock DU using the digital generation unit 303 to generate and output a binarized 4-bit digital signal DOUT[3:0].

The data processing circuit 300 illustrated in FIG. 9 is a data processing circuit that generates the binarized 4-bit digital signal DOUT[3:0] using the two latch unit groups and outputs the signal, similar to the data processing circuit 100 of the first embodiment illustrated in FIG. 1, and has substantially the same configuration as the data processing circuit 100 of the first embodiment. However, the data processing circuit 300 illustrated in FIG. 9 includes no edge detection unit 103, which is a component included in the data processing circuit 100 of the first embodiment, and includes sixteen latch circuits, similar to the conventional data processing circuit 900 illustrated in FIG. 20, to generate the 4-bit digital signal DOUT[3:0] from states of the phases of the multi-phase clock DU of sixteen phases. Therefore, in the description of the data processing circuit 300 of the third embodiment, only the components and operations different from those of the data processing circuit 100 of the first embodiment will be described and a detailed description of the same components and operations as those of the data processing circuit 100 of the first embodiment are omitted.

The latch portion 301 is a circuit that latches (holds) the state of the clock signal of each phase of the multi-phase clock DU of sixteen phases, and includes, as latch unit groups, two (n=2) latch unit groups 3011 each including eight latch circuits (latch units) 31. The latch portion 301 includes switch(es) corresponding to each latch circuit 31 in order to read the state of the clock signal of each phase of the multi-phase clock DU of sixteen phases latched in each latch circuit 31 included in the latch portion 301. In FIG. 9, "LU" is given as a reference sign of the latch unit group 3011, "LO" is given as a reference sign of the latch circuit 31, and each bit of the latch unit group 3011 and the latch circuit 31 is indicated by a number in "[ ]: brackets" subsequent to each reference sign, similar to the data processing circuit 100 of the first embodiment. Each bit of the latch circuit LO[15:0] corresponds to a phase of the multi-phase clock DU[15:0] of sixteen phases.

Each latch circuit 31 in the latch unit group 3011 latches a state of "high" or "low" of the clock signal of a phase of the corresponding multi-phase clock DU at a timing of a falling edge of a latch clock LATCLK, similar to each latch circuit 11 of the latch portion 101 included in the data processing circuit 100 of the first embodiment. Also, each latch circuit 31 in the latch unit group 3011 sequentially outputs an output signal DO[15:0] indicating the latched state of the phase of the multi-phase clock DL) to any one of the readout lines OLO [3:0] according to a timing of readout switch signals SW1 [6:0] and SW2 [7:1] corresponding to each latch circuit 31. More specifically, the respective latch circuits LO[0], LO[1], . . . , LO[7] in the latch unit group LU[1] latch the states of the corresponding multi-phase clocks DU[0], DU[1], . . . , DU[7], and sequentially output the latched output signals DO[0], DO[1], . . . , DO[7] to the readout lines OLO [0] and OLO[1]. The respective latch circuits LO[8], LO[9], . . . , LO[15] in the latch unit group LU[2] latch the states of the corresponding multi-phase clocks DU[8], DU[9], . . . , DU[15], and sequentially output the latched output signals DO[8], DO[9], . . . , DO[15] to the readout lines OLO[2] and OLO[3].

The data selection unit 302 is a circuit which selects any one of a signal of any 2 bits of the output signal DO[7:0] sequentially output to the readout line OLO[1:0] and a signal of any 2 bits of the output signal DO[15:8] sequentially output to the readout line OLO[3:2] from the respective latch unit groups 3011 included in the latch portion 301. The data selection unit 302 includes two switches 3021. The data selection unit 302 selects any one of the readout line OLO[1:0] and the readout line OLO[3:2] to output an output signal DO of 2 bits of any one of the output signal DO[7:0] of the respective latch circuits 31 in the latch unit group LU[1] and the output signal DO[15:8] of the respective latch circuits 31 in the latch unit group LU[2] to the digital generation unit 303, similar to the data selection unit 102 included in the data processing circuit 100 of the first embodiment.

The selection of the output signal DO to be output to the digital generation unit 303 by the data selection unit 302 is performed based on a value of the output signal DO[7] of the latch circuit LO[7] in the latch unit group LU[1]. More specifically, each switch 1021 selects the readout line OLO to be connected to the digital generation unit 303 based on the value of the output signal DO[7]. Also, when the value of the output signal DO[7] is "low"="0," the readout line OLO[1:0] is connected to the digital generation unit 303, and when the value of the output signal DO[7] is "high"="1," the readout line OLO[3:2] is connected to the digital generation unit 303

In other words, the data selection unit 302 outputs any one of the state of the phase of the multi-phase clock DU[7:0] and the state of the phase of the multi-phase clock DU[15:8] to the digital generation unit 303 according to the state of the multi-phase clock DU[7] latched at a timing of a falling edge of the latch clock LATCLK.

The digital generation unit 303 is a circuit that binarizes the state of the phase of the multi-phase clock DU at a predetermined timing based on a signal of the readout line OLO[1:0] or the readout line OLO[3:2] connected to the data selection unit 302 to generate a 4-bit digital signal DOUT[3:0], and includes, for example, an EXOR circuit 32 that performs an EXOR operation, an encoder 33, and a lower counter 34. In the digital generation unit 303 illustrated in FIG. 9, the digital signal DOUT[3] is generated based on the output signal DO[7] output from the latch portion 301, and the digital signal DOUT[2] is generated based on the result of the EXOR circuit 32 performing the EXOR operation of the value of the output signal DO[3] of the latch circuit LO[3] in the latch unit group LU[1] and the value of the output signal DO[7] of the latch circuit LO[7] in the latch unit group LU[1]. The digital signal DOUT[1:0] is generated by the encoder 33 and the lower counter 34.

The encoder 33 includes a general logic circuit, and generates a count clock CNTCLK to be counted by the lower counter 34 according to the signal of any 2 bits of the output signal DO[15:0] input by the readout line OLO[1:0] or the readout line OLO[3:2], which is selected by the data selection unit 302.

The lower counter 34 generates a binarized 2-bit digital signal DOUT[1:0] by counting the number of instances of "high" of the count clock CNTCLK. The encoder 33 and the lower counter 34 differ from the conventional data processing circuit (e.g., the encoder 92 and the lower counter 93 illustrated in FIG. 20) in the number of bits of the generated digital signal DOUT, but perform the same operation as the conventional data processing circuit.

Through such a configuration, the data processing circuit 300 generates the binarized 4-bit digital signal DOUT[3:0] by digitizing the states of the phases of the multi-phase clock DU of sixteen phases, and outputs the signal.

While the configuration when the digital generation unit 303 generates the digital signal DOUT[1:0] using the encoder 33 and the lower counter 34 has been shown in the data processing circuit 300 of the third embodiment, a configuration used to generate the digital signal DOUT[1:0] is not limited to the configuration described above and the digital signal DOUT[1:0] may be generated using any configuration or method.

Next, a data processing method when the data processing circuit 300 of the third embodiment generates the digital signal DOUT[3:0] will be described. A timing of the multi-phase clock DU or the latch clock LATCLK input to the data processing circuit 300 of the third embodiment and a timing of the operation of binarizing the states of the phases of the multi-phase clock DU in the data processing circuit 300 of the third embodiment may be similarly considered by increasing the bits of the multi-phase clock DU in the respective timing charts of the data processing circuit 100 of the first embodiment illustrated in FIGS. 2A and 2B and FIGS. 3A and 3B. In this case, since the data processing circuit 300 of the third embodiment includes no edge detection unit, a timing of the clock RCLK indicating the timing of the rising edge of the multi-phase clock DU and the clock FCLK indicating a timing of the falling edge of the multi-phase clock DU is not considered. Therefore, a detailed description of the timing of the multi-phase clock DU or the latch clock LATCLK and the timing of the operation of binarizing states of the phases of the multi-phase clock DU in the data processing circuit 300 of the third embodiment is omitted, and sixteen digital signals DOUT[3:0] generated in data processing of the data processing circuit 300 will be described.

FIG. 10 is a truth table indicating a relationship between the output of the latch circuit 31 and the output of each component included in the data processing circuit 300 of the third embodiment. In FIG. 10, a relationship among the output signal DO of the latch circuit 31, a state of the switch 3021 in the data selection unit 302, and the digital signal DOUT[3:0] in each of a total of sixteen states of the multi-phase clocks DU[15:0] input to the data processing circuit 300 is illustrated.

The state of the switch 3021 in the data selection unit 302 may be divided into two states according to the value of the output signal DO[7] of the latch circuit 31, as illustrated in FIG. 10. In other words, each state of data processing in the data processing circuit 300 may be divided into two states according to the state of the switch 3021 in the data selection unit 302. Also, from the two states, the respective sixteen states in the multi-phase clock DU[15:0] may be identified.

For example, in a state No 11, the two switches 3021 in the data selection unit 302 are "high"="1" based on the output signal DO[7]="1" of the latch circuit 31. Accordingly, the data selection unit 302 connects the readout line OLO[3:2] to the digital generation unit 303. Also, the encoder 33 detects a position of the bit of the latch circuit 31 in which there is a timing of the rising edge of the multi-phase clock DU, based on the signal of the readout line OLO[3:2], and initiates generation of the count clock CNTCLK when the encoder 33 has detected the timing of the rising edge of the multi-phase clock DU. Accordingly, the lower counter 34 counts the number of instances of "high" of the count clock CNTCLK, and the digital generation unit 303 outputs the digital signal DOUT[3:0]="1011" ("11" in decimal notation).

As described above, the data processing circuit 300 of the third embodiment does not include the edge detection unit 103 which is the component included in the data processing circuit 100 of the first embodiment, but includes the two latch unit groups 3011 each including eight latch circuits 31 in the latch portion 301, and the digital generation unit 303, similar to the data processing circuit 100 of the first embodiment. Accordingly, the operation state of the data processing circuit 300 may be divided into two states: a state when the two switches 3021 in the data selection unit 302 are "high"="1" and a state when the two switches 3021 in the data selection unit 302 are "low"="0," as illustrated in FIG. 10, and a total of sixteen states of the multi-phase clock DU[15:0] input to the data processing circuit 300 may be isolated into sets of eight states, similar to the data processing circuit 100 of the first embodiment. Accordingly, in the data processing circuit 300 of the third embodiment, the latch portion 301 may output only the output signal DO of 8 bits of any one of the output signal DO[7:0] and the output signal DO[15:8] latched in each latch circuit 31 included in the latch unit group 3011, similar to the data processing circuit 100 of the first embodiment. Thus, in the conventional data processing circuit 900 illustrated in FIG. 20, the fifteen readout switch signals SW1 and the fifteen readout switch signals SW2 are necessary whereas, in the data processing circuit 300 of the third embodiment, the number of readout switch signals SW1 and the number of readout switch signals SW2 can be reduced by 8, and seven readout switch signals SW and seven readout switch signals SW2 are necessary.

Accordingly, in the data processing circuit 300 of the third embodiment, it is possible to shorten a data processing time in comparison with the conventional data processing circuit 900 without sacrificing performance of outputting the 4-bit digital signal DOUT indicating a total of sixteen states of the phases of the multi-phase clock DU input to the data processing circuit 300.

In the data processing circuit 300 of the third embodiment, upper 2 bits (the digital signal DOUT[3:2]) of the 4-bit digital signal DOUT[3:0] can be determined based on the signal output from the latch portion 301 or the operational result of the logic operation. Accordingly, in the data processing circuit 300 of the third embodiment, it is possible to reduce a circuit scale (particularly, a circuit scale of the lower counter 34) or power consumption of the data processing circuit 300 itself in comparison with the conventional data processing circuit 900.

Fourth Embodiment

Figure 11:
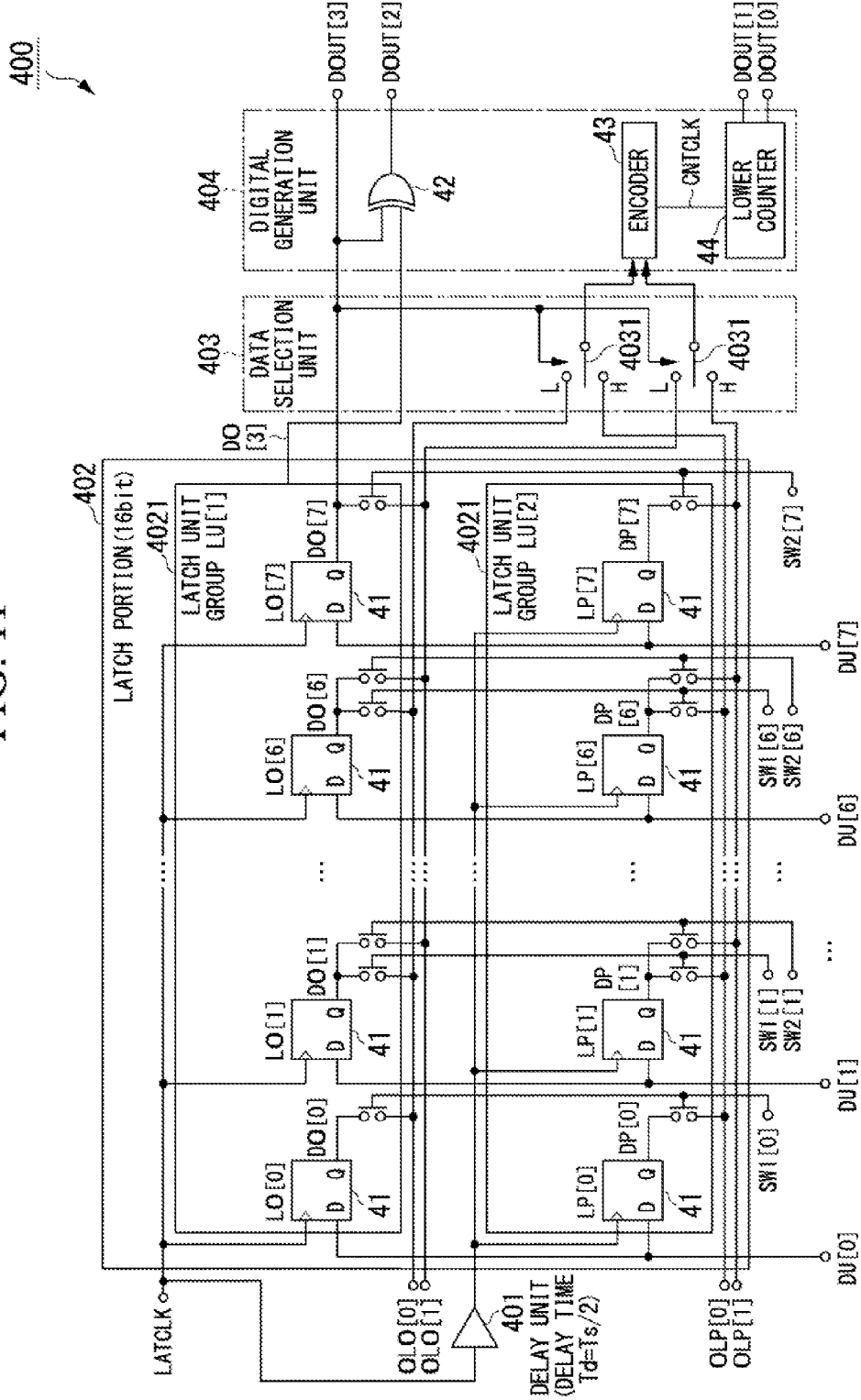
FIG. 11 is a block diagram illustrating a schematic configuration of a data processing circuit of a fourth embodiment of the present invention.

Next, a fourth embodiment of the present invention will be described. FIG. 11 is a block diagram illustrating a schematic configuration of a data processing circuit in the fourth embodiment. A data processing circuit 400 illustrated in FIG. 11 includes a delay unit 401, a latch portion 402, a data selection unit 403, and a digital generation unit 404. The data processing circuit 400 illustrated in FIG. 11 is a data processing circuit that holds states of phases of a multi-phase clock DU of eight phases in the latch portion 402 at a predetermined timing, e.g., a timing at which a comparator (not illustrated) has completed a comparison process using two latch unit groups, and digitizes the held states of the phases of the multi-phase clock DU using the digital generation unit 404 to generate and output a binarized 4-bit digital signal DOUT[3:0].

The data processing circuit 400 illustrated in FIG. 11 is a data processing circuit that generates the binarized 4-bit digital signal DOUT[3:0] using the two latch unit groups and outputs the signal, similar to the data processing circuit 200 of the second embodiment illustrated in FIG. 5, and has substantially the same configuration as the data processing circuit 200 of the second embodiment. However, the data processing circuit 400 illustrated in FIG. 11 does not include the edge detection unit 204 which is the component included in the data processing circuit 200 of the second embodiment, and includes sixteen latch circuits to generate the 4-bit digital signal DOUT[3:0] from states of the phases of the multi-phase clock DU of eight phases, similar to the conventional data processing circuit 900 illustrated in FIG. 20. Therefore, in a description of the data processing circuit 400 of the fourth embodiment, only the components and operations different from those of the data processing circuit 200 of the second embodiment will be described, and a detailed description of the same components and operations as those of the data processing circuit 200 of the second embodiment is omitted.

The delay unit 401 is a circuit that generates a latch clock DLYCLK obtained by delaying a latch clock LATCLK by a certain delay time Td determined in advance and outputs the generated latch clock DLYCLK to the latch portion 402. The delay time Td by which the delay unit 401 delays the latch clock LATCLK is determined based on the number of latch unit groups included in the latch portion 402, the number of latch circuits included in each latch unit group, and the number of states indicated by the digital signal output by the data processing circuit 400, similar to the delay unit 201 included in the data processing circuit 200 of the second embodiment. In the data processing circuit 400 of the fourth embodiment, when a period of the clock signal of each phase of the multi-phase clock DU is a period Ts, the delay time Td is set so that Td=Ts/2.

The latch portion 402 is a circuit that latches (holds) the state of the clock signal of each phase of the multi-phase clock DU of eight phases, and includes, as latch unit groups, two (n=2) latch unit group 4021 each including eight latch circuits (latch units) 41. The latch portion 402 includes switch(es) corresponding to each latch circuit 41 in order to read the state of the clock signal of each phase of the multi-phase clock DU of eight phases latched in each latch circuit 41 included in the latch portion 402. In FIG. 11, "LU" is given as a reference sign of the latch unit group 4021, "LO" or "LP" is given as a reference sign of the latch circuit 41, and a bit of each of the latch unit groups 4021 and the latch circuit 41 is indicated by a number in brackets ("[ ]") subsequent to each reference sign, similar to the data processing circuit 200 of the second embodiment. Each bit of the latch circuit LO[7:0] and the latch circuit LP[7:0] corresponds to a phase of the multi-phase clock DU[7:0] of eight phases.

Each latch circuit 41 in the latch unit group 4021 latches a state of "high" or "low" of the clock signal of a phase of the corresponding multi-phase clock DU at a timing of a falling edge of the latch clock LATCLK or the latch clock DLYCLK, similar to each latch circuit 21 of the latch portion 202 included in the data processing circuit 200 of the second embodiment. Also, each latch circuit 41 in the latch unit group 4021 sequentially outputs the output signal DO[7:0] or the output signal DP[7:0] indicating the latched state of the phase of the multi-phase clock DU to any one of the readout line OLO[1:0] and OLP[1:0] according to a timing of corresponding readout switch signals SW1 [6:0] and SW2 [7:1]. More specifically, each latch circuit LO[7:0] in the latch unit group LU[1] latches the state of the corresponding multi-phase clock DU[7:0] at a timing of a falling edge of the latch clock LATCLK, and sequentially outputs the latched output signal DO[7:0] to the readout line OLO[1:0]. Each latch circuit LP[7:0] in the latch unit group LU[2] latches the state of the corresponding multi-phase clock DU[7:0] at a timing of a falling edge of the latch clock DLYCLK and sequentially outputs the latched output signal DP[7:0] to the readout line OLP[1:0].

Here, the delay time Td by which the delay unit 401 delays the latch clock LATCLK, and the number of delay units 401 will be described. In the data processing circuit 400 of the fourth embodiment, since the number of latch unit groups 4021 included in the latch portion 402 is 2, the number of latch circuits 41 included in each latch unit group 4021 is 8, and the data processing circuit 400 outputs the 4-bit digital signal DOUT[3:0] as described above, the number of states indicated by the digital signal DOUT[3:0] is 16. Therefore, the delay time Td is Td=Ts*8/16=Ts/2 under consideration similar to the delay time Td of the data processing circuit 200 of the second embodiment. In the data processing circuit 400 of the fourth embodiment, the latch clocks DLYCLK delayed by the delay time Td=Ts/2 are prepared by the number of latch unit groups 4021 included in the latch portion 402 minus 1 stage, i.e., 2−1=1 stage.

The data selection unit 403 is a circuit which selects any one of a signal of any 2 bits of the output signal DO[7:0] sequentially output to the readout line OLO[1:0] and a signal of any 2 bits of the output signal DP[7:0] sequentially output to the readout line OLP[1:0] from the respective latch unit groups 4021 included in the latch portion 402. The data selection unit 403 includes two switches 4031. The data selection unit 403 outputs a 2-bit signal of any one of the output signal DO[7:0] of each latch circuit 41 in the latch unit group LU[1] and the output signal DP[7:0] of each latch circuit 41 in the latch unit group LU[2] to the digital generation unit 404 by selecting any one of the readout line OLO[1:0] and the readout line OLP[1:0].

The selection of the output signal DO or the output signal DP to be output to the digital generation unit 404 by the data selection unit 403 is performed based on the value of the output signal DO[7] of the latch circuit LO[7] in the latch unit group LU[1]. More specifically, each switch 4031 selects the readout line OLO or the readout line OLP to be connected to the digital generation unit 404 based on the value of the output signal DO[7]. Also, when the value of the output signal DO[7] is "low"="0," the readout line OLO[1:0] is connected to the digital generation unit 404, and when the value of the output signal DO[7] is "high"="1." the readout line OLP[1:0] is connected to the digital generation unit 404.

In other words, the data selection unit 403 outputs any one of the state of the phase of the multi-phase clock DU[7:0] and the state of the phase of the multi-phase clock DU[7:0] after the delay time Td(=Ts/2) to the digital generation unit 404 based on the state of the multi-phase clock DU[7] latched at a timing of a falling edge of the latch clock LATCLK.

The digital generation unit 404 is a circuit that binarizes the state of the phase of the multi-phase clock DU at a predetermined timing based on the signal of the readout line OLO[1:0] or the readout line OLP[1:0] connected to the data selection unit 403 to generate a 4-bit digital signal DOUT[3:0], and includes, for example, an EXOR circuit 42 that performs an EXOR operation, an encoder 43, and a lower counter 44. In the digital generation unit 404 illustrated in FIG. 11, the digital signal DOUT[3] is generated based on the output signal DO[7] output from the latch portion 402, and the digital signal DOUT[2] is generated by a result of the EXOR circuit 42 performing the EXOR operation of the value of the output signal DO[3] of the latch circuit LO[3] in the latch unit group LU[1] and the value of the output signal DO[7] of the latch circuit LO[7] in the latch unit group LU[1]. The digital signal DOUT[1:0] is generated by the encoder 43 and the lower counter 44.

The encoder 43 includes a general logic circuit, and generates a count clock CNTCLK to be counted by the lower counter 44 according to a signal of 2 bits of any one of the output signal DO[7:0] input by the readout line OLO[1:0] and the output signal DP[7:0] input by the readout line OLP[1:0], which has been selected by the data selection unit 403.

The lower counter 44 generates a binarized 2-bit digital signal DOUT[1:0] by counting the number of instances of "high" of the count clock CNTCLK. The encoder 43 and the lower counter 44 differ from the conventional data processing circuit (e.g., the encoder 92 and the lower counter 93 illustrated in FIG. 20) in the number of bits of the generated digital signal DOUT, but perform the same operation as the conventional data processing circuit.

Through such a configuration, the data processing circuit 400 generates the binarized 4-bit digital signal DOUT[3:0] by digitizing the states of the phases of the multi-phase clock DU of eight phases and outputs the signal.

While the configuration when the digital generation unit 404 generates the digital signal DOUT[1:0] using the encoder 43 and the lower counter 44 has been shown in the data processing circuit 400 of the fourth embodiment, a configuration for generating the digital signal DOUT[1:0] is not limited to the configuration described above and the digital signal DOUT[1:0] may be generated using any configuration or method.

Next, a data processing method when the data processing circuit 400 of the fourth embodiment generates the digital signal DOUT[3:0] will be described. A timing of the multi-phase clock DU and the latch clocks LATCLK and DLYCLK input to the data processing circuit 400 of the fourth embodiment and a timing of an operation of binarizing the states of the phases of the multi-phase clock DU in the data processing circuit 400 of the fourth embodiment may be similarly considered by increasing bits of the multi-phase clock DU in the respective timing charts of the data processing circuit 200 of the second embodiment illustrated in FIGS. 6A and 6B and FIGS. 7A and 7B. In this case, since the data processing circuit 400 of the fourth embodiment includes no edge detection unit, the clock RCLK indicating a timing of the rising edge of the multi-phase clock DU and the clock FCLK indicating a timing of the falling edge of the multi-phase clock DU are not considered. Therefore, a detailed description of the timing of the multi-phase clock DU or the latch clocks LATCLK and DLYCLK and the timing of the operation of binarizing the states of the phases of the multi-phase clock DU in the data processing circuit 400 of the fourth embodiment is omitted, and sixteen digital signals DOUT[3:0] generated in data processing of the data processing circuit 400 will be described.

FIG. 12 is a truth table indicating a relationship between the output of the latch circuit 41 and the output of each component included in the data processing circuit 400 of the fourth embodiment. A relationship among the output signal DO and the output signal DP of the latch circuit 41, a state of the switch 4031 in the data selection unit 403, and a digital signal DOUT[3:0] in each of a total of sixteen states of the multi-phase clock DU[7:0] input to the data processing circuit 400 is illustrated in FIG. 12.

The state of the switch 4031 in the data selection unit 403 may be divided into two states according to the value of the output signal DO[7] of the latch circuit 41, as illustrated in FIG. 12. In other words, each state of data processing in the data processing circuit 400 may be divided into two states based on the state of the switch 4031 in the data selection unit 403. Also, from these two states, the respective sixteen states in the multi-phase clock DU[7:0] can be identified.

For example, in state No 11, the two switches 4031 in the data selection unit 403 is "high"="1" based on the output signal DO[7]="1" of the latch circuit 41. Accordingly, the data selection unit 403 connects the readout line OLP[1:0] to the digital generation unit 404. Also, the encoder 43 detects a position of the bit of the latch circuit 41 in which there is a timing of the rising edge of the multi-phase clock DU, based on the signal of the readout line OLP[1:0], and initiates generation of the count clock CNTCLK when the encoder 43 has detected the timing of the rising edge of the multi-phase clock DU. Accordingly, the lower counter 44 counts the number of instances of "high" of the count clock CNTCLK, and the digital generation unit 404 outputs a digital signal DOUT[3:0]="1011" ("11" in decimal notation).

The data processing circuit 400 of the fourth embodiment do not include the edge detection unit 204, which is the component included in the data processing circuit 200 of the second embodiment illustrated in FIG. 5 as described above, but includes the two latch unit groups 4021 each including eight latch circuits 41 in the latch portion 402, and the digital generation unit 404, similar to the data processing circuit 200 of the second embodiment. Accordingly, operation states of the data processing circuit 400 may be divided into two states: a state when the two switches 4031 in the data selection unit 403 are "high"="1" and a state when the two switches 4031 are "low"="0" as illustrated in FIG. 12, and a total of sixteen states of the multi-phase clock DU[7:0] input to the data processing circuit 400 may be isolated into sets of eight states, similar to the data processing circuit 200 of the second embodiment. Accordingly, in the data processing circuit 400 of the fourth embodiment, the latch portion 402 may output only an output signal of any 8 bits of the output signal DP[7:0] or the output signal DO[7:0] latched in the respective latch circuits 41 included in the latch unit group 4021, similar to the data processing circuit 200 of the second embodiment. Accordingly, in the conventional data processing circuit 900 illustrated in FIG. 20, the fifteen readout switch signals SW1 and the fifteen readout switch signals SW2 are necessary whereas, in the data processing circuit 400 of the fourth embodiment, each of the number of readout switch signals SW1 and the number of readout switch signals SW2 may be 7, which is a reduction by 8.

The data processing circuit 400 of the fourth embodiment includes the delay unit 401. Accordingly, the number of phases of the multi-phase clock DU may be 8, which is a half of the sixteen phases in the conventional data processing circuit 900 illustrated in FIG. 20. Accordingly, in the data processing circuit 400 of the fourth embodiment it is possible to facilitate generation of the multi-phase clock DU to be input to perform data processing and to support higher-speed data processing in comparison with the conventional data processing circuit 900, similar to the data processing circuit 200 of the second embodiment.

Accordingly, in the data processing circuit 400 of the fourth embodiment, it is possible to shorten the data processing time in comparison with the conventional data processing circuit 900 without sacrificing performance of outputting the 4-bit digital signal DOUT indicating a total of sixteen states of phases of the multi-phase clock DU which is input to the data processing circuit 400.

In the data processing circuit 400 of the fourth embodiment, the upper 2 bits (the digital signal DOUT[3:2]) of the 4-bit digital signal DOUT[3:0] can be determined based on the signal output from the latch portion 402 or the operational result of the logic operation. Accordingly, in the data processing circuit 400 of the fourth embodiment, it is possible to reduce a circuit scale (particularly, a circuit scale of the lower counter 44) or power consumption of the data processing circuit 400 itself in comparison with the conventional data processing circuit 900.

Fifth Embodiment

Figure 13:
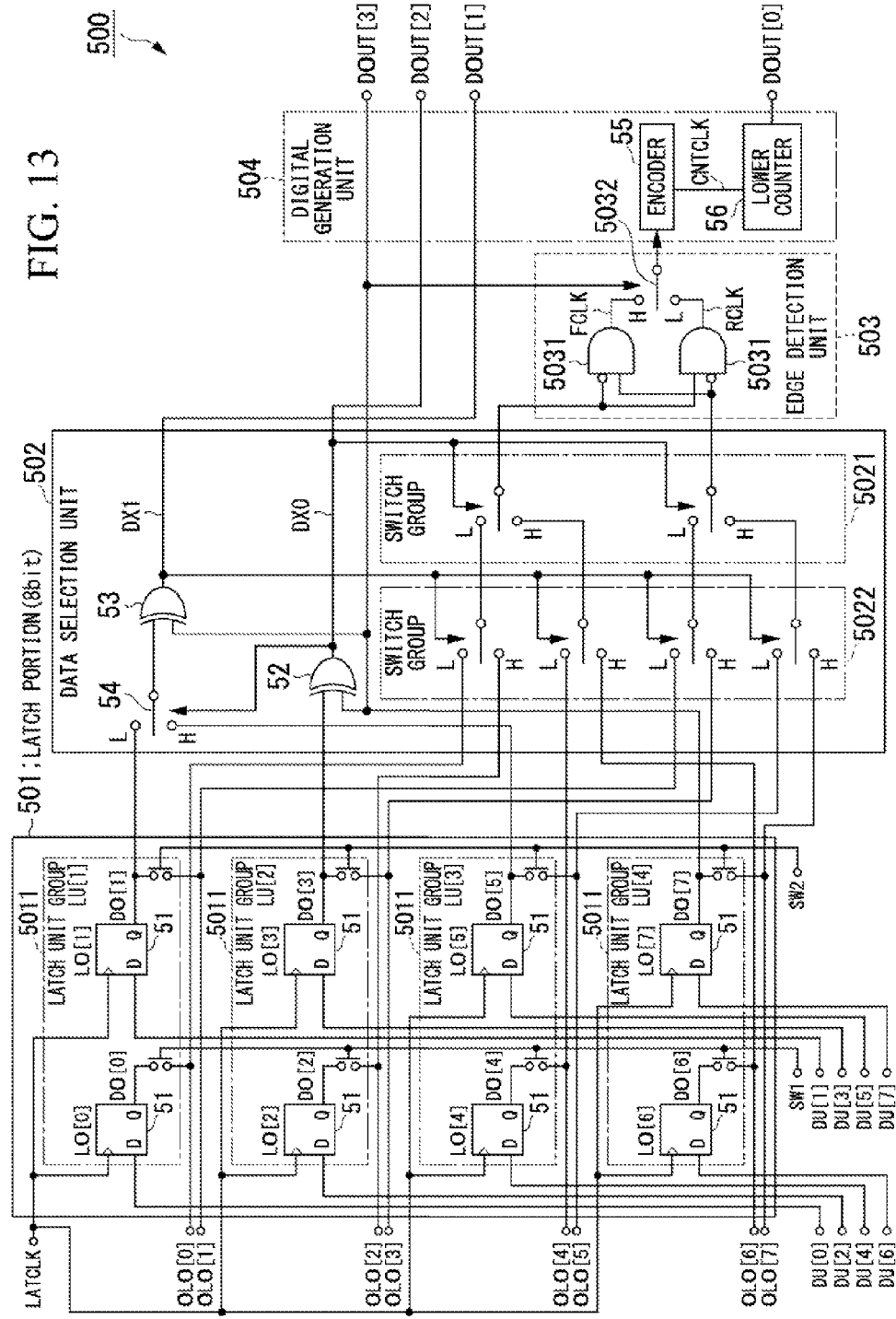
FIG. 13 is a block diagram illustrating a schematic configuration of a data processing circuit of a fifth embodiment of the present invention.

Next, a fifth embodiment of the present invention will be described. FIG. 13 is a block diagram illustrating a schematic configuration of a data processing circuit in the fifth embodiment. A data processing circuit 500 illustrated in FIG. 13 includes a latch portion 501, a data selection unit 502, an edge detection unit 503, and a digital generation unit 504. The data processing circuit 500 illustrated in FIG. 13 is a data processing circuit that holds states of phases of a multi-phase clock DU of eight phases in the latch portion 501 using four latch unit groups at a predetermined timing, e.g., a timing at which a comparator (not illustrated) has completed a comparison process, and digitizing the held states of the phases of the multi-phase clock DU using the digital generation unit 504 to generate and output a binarized 4-bit digital signal DOUT[3:0].

The data processing circuit 500 illustrated in FIG. 13 is a data processing circuit that realizes an operation of generating and outputting the binarized 4-bit digital signal DOUT[3:0] by increasing the number of latch unit groups and using four latch unit groups, similar to the data processing circuit 100 of the first embodiment illustrated in FIG. 1.

The latch portion 501 is a circuit that latches (holds) the state of the clock signal of each phase of the multi-phase clock DU of eight phases, and includes, as latch unit groups, four (n=4) latch unit groups 5011 each including two latch circuits (latch units) 51. The latch portion 501 includes switch(es) corresponding to each latch circuit 51 to read the state of the clock signal of each phase of the multi-phase clock DU of eight phases latched in each latch circuit 51 included in the latch portion 501. In FIG. 13, "LU" is given as a reference sign of the latch unit group 5011, "LO" is given as a reference sign of the latch circuit 51, and each bit of the latch unit group 5011 and the latch circuit 51 is indicated by a number in brackets ("[ ]") subsequent to each reference sign, similar to the data processing circuit 100 of the first embodiment.

More specifically, the latch portion 501 includes a latch unit group LU[1], a latch unit group LU[2], a latch unit group LU[3] and a latch unit group LU[4]. The latch unit group LU[1] includes two latch circuits LO[0] and LO[1], the latch unit group LU[2] includes two latch circuits DO[2] and LO[3], the latch unit group LU[3] includes two latch circuits LO[4] and LO[5], and the latch unit group LU[4] includes two latch circuits LO[6] and LO[7]. Each bit of the latch circuit LO[7:0] corresponds to a phase of the multi-phase clock DU[7:0] of eight phases.

Each latch circuit 51 in the latch unit group 5011 latches a state of "high" or "low" of the clock signal of each phase of the corresponding multi-phase clock DU at a timing of a falling edge of the latch clock LATCLK, similar to each latch circuit 11 of the latch portion 101 included in the data processing circuit 100 of the first embodiment. Also, each latch circuit 51 in the latch unit group 5011 outputs the output signal DO[7:0] indicating the latched state of the phase of the multi-phase clock DU to any one of the readout lines OLO[7:0] according to a timing of the readout switch signals SW1 and SW2 corresponding to each latch circuit 51.

More specifically, the latch circuits LO[0] and LO[1] in the latch unit group LU[1] latch the states of the corresponding multi-phase clocks DU[O] and DU [1] and output the latched output signals DO[0] and DO[1] to the readout lines OLO[0] and OLO[1]. The latch circuits LO[2] and LO[3] in the latch unit group LU[2] latch states of the corresponding multi-phase clocks DU[2] and DU[3] and output the latched output signals DO[2] and DO[3] to the readout lines OLO[2] and OLO[3]. The latch circuits LO[4]1 and LO[5] in the latch unit group LU[3] latch states of the corresponding multi-phase clocks DU[4] and DU[5] and output the latched output signals DO[4] and DO[5] to the readout lines OLO[4] and OLO [5]. The latch circuits LO[6] and LO[7] in the latch unit group LU[4] latch states of the corresponding multi-phase clocks DU[6] and DU[7] and output the latched output signals DO[6] and DO[7] to the readout lines OLO[6] and OLO[7].

The data selection unit 502 is a circuit which selects a signal of any 2 bits of the output signal DO[7:0] that is output from the respective latch unit groups 5011 included in the latch portion 501 to the readout line OLO[7:0], and includes an EXOR circuit 52 and an EXOR circuit 53 that perform an EXOR operation, a switch 54, a switch group 5021 including two switches, and a switch group 5022 including four switches. The data selection unit 502 outputs an output signal DO of any 2 bits of an output signal DO[1:0] of each latch circuit 51 in the latch unit group LU[1], an output signal DO[3:2] of each latch circuit 51 in the latch unit group LU[2], an output signal DO[5:4] of each latch circuit 51 in the latch unit group LU[3] or an output signal DO[7:6] of each latch circuit 51 in the latch unit group LU[4] to the edge detection unit 503 by selecting any one of the readout line OLO[1:0], the readout line OLO[3:2], the readout line OLO[5:4] and the readout line OLO[7:6].

The selection of the output signal DO to be output to the edge detection unit 503 by the data selection unit 502 is performed based on the value of the output signal DO[3] of the latch circuit LO[3] in the latch unit group LU[2], the value of the output signal DO[7] of the latch circuit LO[7] in the latch unit group LU[4], and the value of the output signal DO[1] of the latch circuit LU[1] in the latch unit group LU[1] or the value of the output signal DO[5] of the latch circuit LO[5] in the latch unit group LU[3].

In the configuration of the data selection unit 502 illustrated in FIG. 13, the output signal DO to be output to the edge detection unit 503 is selected by each component performing the following operation. The EXOR circuit 52 performs the EXOR operation of the value of the output signal DO[3] and the value of the output signal DO[7] and outputs a result thereof to the switch 54 and the switch group 5021 as an operational result DX0. The switch 54 selects any one of the output signal DO[1] and the output signal DO[5] based on the operational result DX0 input from the EXOR circuit 52, and outputs the selected output signal DO to the EXOR circuit 53. The EXOR circuit 53 performs the EXOR operation of the value of the output signal DO input from the switch 54 and the value of the output signal DO[7] and outputs a result thereof to the switch group 5022 as an operational result DX1. The switch group 5022 selects any one of the readout line OLO[0] and the readout line OLO[2], any one of the readout line OLO[4] and the readout line OLO[6], any one of the readout line OLO[1] and the readout line OLO[3], and any one of the readout line OLO[5] and the readout line OLO[7] based on the operational result DX1 input from the EXOR circuit 53, and connects each selected readout line OLO to the switch group 5021. The switch group 5021 further selects each readout line OLO connected to the switch group 5022 based on the operational result DX0 input from the EXOR circuit 52 and connects the readout line OLO of any 2 bits of the readout line OLO[1:0], the readout line OLO[3:2], the readout line OLO [5:4], or the readout line OLO[7:6] to the edge detection unit 503.

In other words, when the states of the multi-phase clock DU[3] and the multi-phase clock DU[7] are the same states, the data selection unit 502 output the state of the phase of the multi-phase clock DU[1:0] to the edge detection unit 503 if the states of the multi-phase clock DU[7] and the multi-phase clock DU[1] are the same state, and outputs the state of the phase of the multi-phase clock DU[3:2] to the edge detection unit 503 if the states of the multi-phase clock DU[7] and the multi-phase clock DU[1] are different states. When the states of the multi-phase clock DU[3] and the multi-phase clock D[7] are different states, the data selection unit 502 outputs the state of the phase of the multi-phase clock DU[5:4] to the edge detection unit 503 if the states of the multi-phase clock DU[7] and the multi-phase clock DU[5] are the same state, and outputs the state of the phase of the multi-phase clock DU[7:6] to the edge detection unit 503 if the states of the multi-phase clock DU[7] and the multi-phase clock DU[5] are different states.

The data selection unit 502 outputs each of the operational result DX0 and the operational result DX1 which are results of the EXOR circuit 52 and EXOR circuit 53 performing the EXOR operation to the digital generation unit 504.

The edge detection unit 503 is a circuit that detects a timing of a rising edge and a falling edge of the multi-phase clock DU based on the signal of the readout line OLO connected to the data selection unit 502, and includes two AND gates 5031 that perform an OR operation, and a switch 5032. The edge detection unit 503 outputs any one of a signal indicating a timing of the rising edge of the multi-phase clock DU included in the output signal DO[1:0], the output signal DO[3:2], the output signal DO[5:4] or the output signal DO[7:6] input from the data selection unit 502 and a signal indicating a timing of the falling edge of the multi-phase clock DU to the digital generation unit 504 based on the value of the output signal DO[7] of the latch circuit LO[7] in the latch unit group LU[4].

In other words, in the edge detection unit 503, the switch 5032 selects, based on the value of the output signal DO[7], any one of the clock RCLK and the clock FCLK generated based on the signal of the connected readout line OLO by the respective AND gates 5031, and outputs the selected clock to the digital generation unit 504. That is, the edge detection unit 503 outputs the clock RCLK to the digital generation unit 504 when the value of the output signal DO[7] is "low" and outputs the clock FCLK to the digital generation unit 504 when the value of the output signal DO[7] is "high."

The digital generation unit 504 is a circuit that binarizes the state of the phase of the multi-phase clock DU at a predetermined timing based on the signal indicating the timing of the rising edge or the falling edge of the multi-phase clock DU input from the edge detection unit 503 to generate a 4-bit digital signal DOUT[3:0], and includes, for example, an encoder 55 and a lower counter 56. In the digital generation unit 504 illustrated in FIG. 13, the digital signal DOUT[3] is generated based on the output signal DO[7] output from the latch portion 501, the digital signal DOUT[2] is generated by the operational result DX0 of the EXOR in the EXOR circuit 52 input from the data selection unit 502, and the digital signal DOUT[1] is generated by the operational result DX1 of the EXOR in the EXOR circuit 53 input from the data selection unit 502. The digital signal DOUT[0] is generated by the encoder 55 and the lower counter 56.

The encoder 55 includes a general logic circuit, and generates a count clock CNTCLK to be counted by the lower counter 56 according to the signal indicating a timing of the rising edge or the falling edge of the multi-phase clock DU input from the edge detection unit 503.

The lower counter 56 generates a binarized 1-bit digital signal DOUT[0] by counting the number of instances of "high" of the count clock CNTCLK. The encoder 55 and the lower counter 56 differ from the conventional data processing circuit (e.g., the encoder 92 and the lower counter 93 illustrated in FIG. 20) in the number of bits of the generated digital signal DOUT, but perform the same operation as the conventional data processing circuit.

Through such a configuration, the data processing circuit 500 digitizes the states of the phases of the multi-phase clock DU of eight phases to generate the binarized 4-bit digital signal DOUT[3:0] and output the signal.

The case in which the EXOR circuit 52 and the EXOR circuit 53, the switch 54, the switch group 5021 and the switch group 5022 are included as a configuration in which the data selection unit 502 selects the readout line OLO to be connected to the edge detection unit 503 has been described in the data processing circuit 500 of the fifth embodiment. However, a configuration for selecting the readout line OLO to be connected to the edge detection unit 503 is not limited to the configuration described above and may be any configuration. For example, while in the switch group 5021 and the switch group 5022, the function is realized using six switches that select one output from two inputs, the same function may be realized using two switches that select one output from four inputs.

While the configuration when the digital generation unit 504 generates the digital signal DOUT[0] using the encoder 55 and the lower counter 56 has been shown in the data processing circuit 500 of the fifth embodiment, a configuration for generating the digital signal DOUT[0] is not limited to the configuration described above and the digital signal DOUT[0] may be generated by any configuration or method. For example, a configuration for generating the digital signal DOUT[0] through a logic operation may be used, similar to the digital signal DOUT[3:1].

Figure 14A:
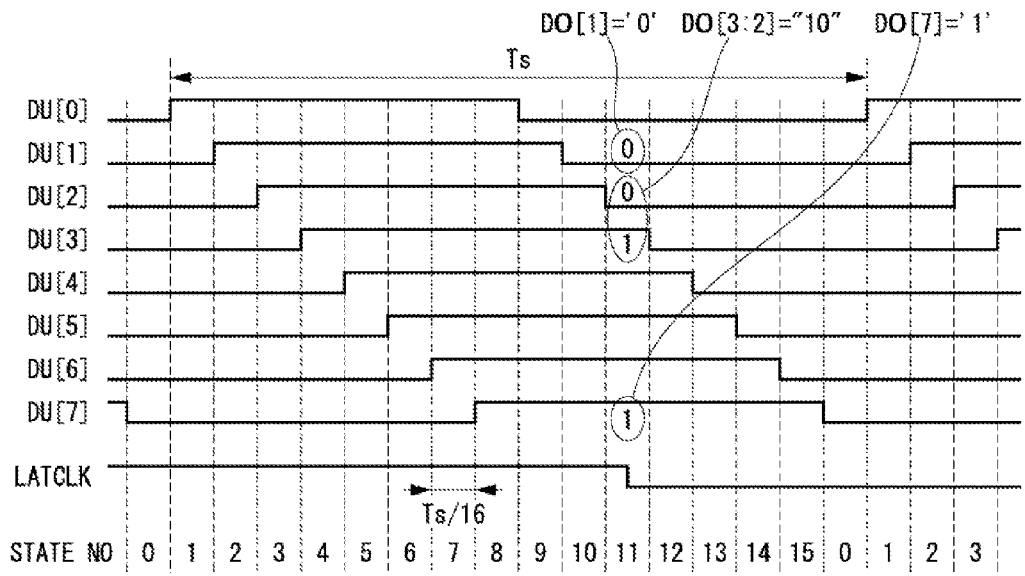
FIG. 14A is a timing chart illustrating an example of a timing of a multi-phase clock and a latch clock input to the data processing circuit of the fifth embodiment.
Figure 14B:
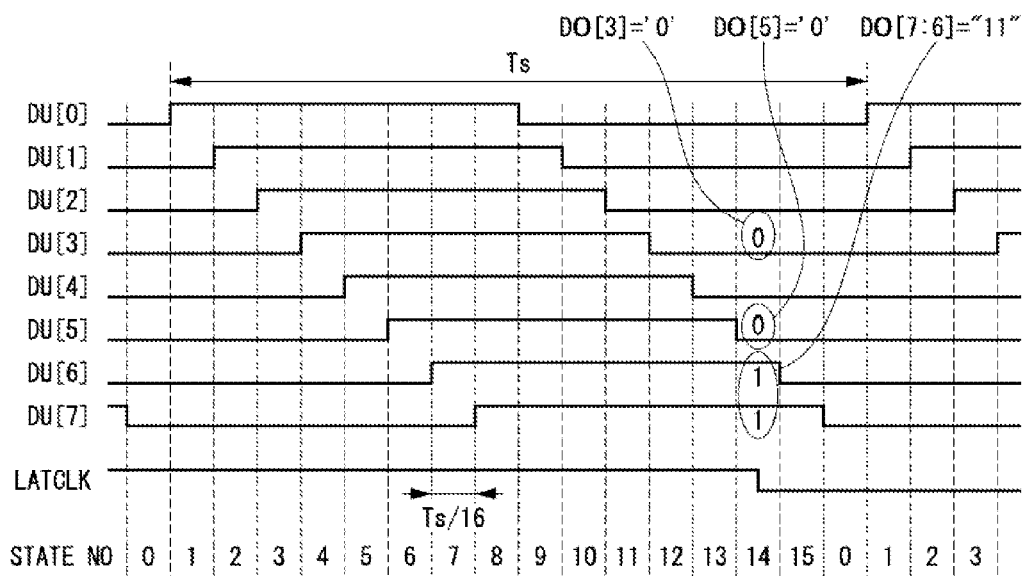
FIG. 14B is a timing chart illustrating an example of a timing of a multi-phase clock and a latch clock input to the data processing circuit of the fifth embodiment.
Figure 15A:
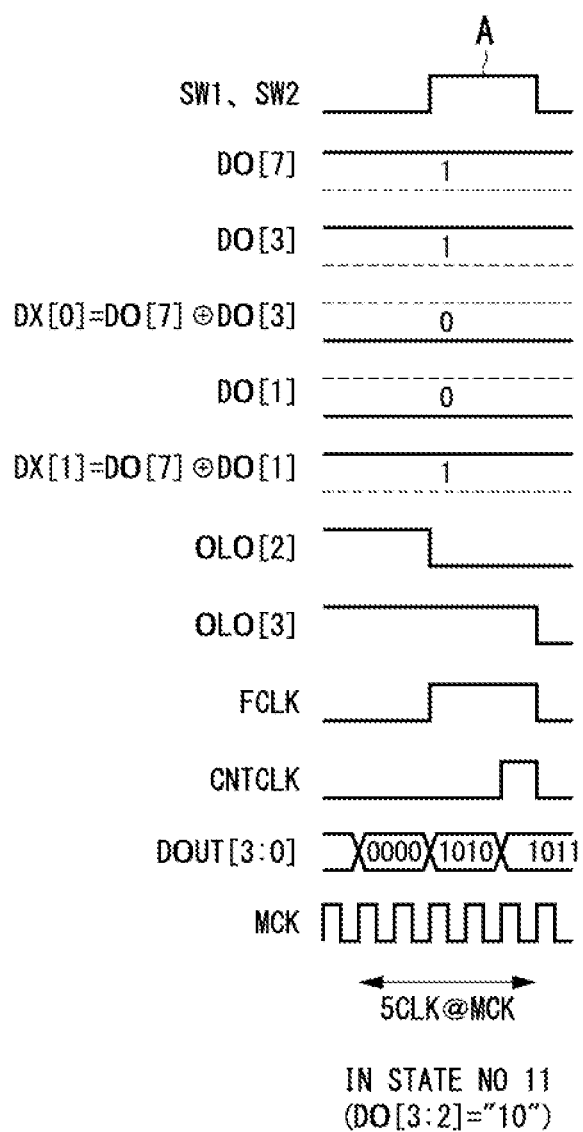
FIG. 15A is a timing chart illustrating an example of a timing of an operation of binarizing a state of a phase of the multi-phase clock in the data processing circuit of the fifth embodiment.
Figure 15B:
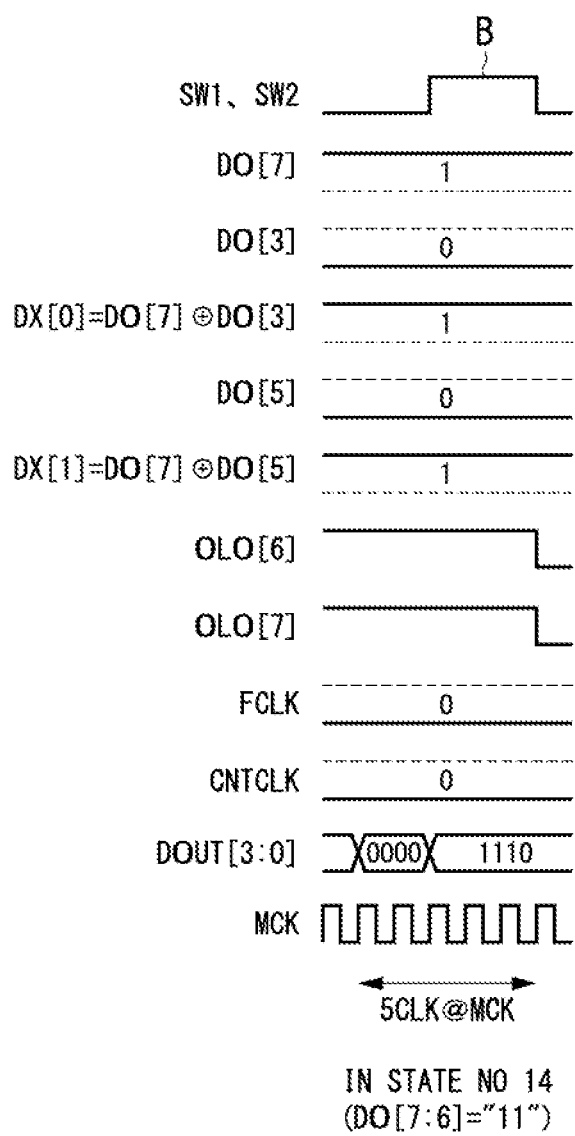
FIG. 15B is a timing chart illustrating an example of a timing of an operation of binarizing a state of a phase of the multi-phase clock in the data processing circuit of the fifth embodiment.

Next, a data processing method when the data processing circuit 500 of the fifth embodiment generates the digital signal DOUT[3:0] will be described. FIGS. 14A and 14B are timing charts illustrating an example of a timing of the multi-phase clock DU and the latch clock LATCLK input to the data processing circuit 500 of the fifth embodiment. In FIGS. 14A and 143, an example of the multi-phase clock DU[7:0] of eight phases having a phase difference of Ts/16 when a period of the clock signal of each phase of the multi-phase clock DU is a period Ts is illustrated. FIGS. 15A and 15B are timing charts illustrating an example of a timing of an operation of binarizing the states of the phases of the multi-phase clock DU in the data processing circuit 500 of the fifth embodiment.

In FIGS. 14A and 14B, state No indicating a state of a phase of the multi-phase clock DU of each phase is illustrated to distinguish a total of sixteen states of "high" or "low" of the multi-phase clock DU[7:0] generated by varying the period by Ts/16.

The state of the phase of the multi-phase clock DU is repeated as state No=0, 1, 2, . . . , 14, 15, 0, 1, 2, . . . over time. The same state No corresponding to state No illustrated in FIGS. 14A and 14B is illustrated in FIGS. 15A and 15B.

Each latch circuit 51 in the latch unit group 5011 latches the state of the clock signal of a phase of the corresponding multi-phase clock DU at a timing at which the latch clock LATCLK is inverted (a timing of a falling edge), as illustrated in FIGS. 14A and 14B. Also, the data selection unit 502 selects any one of the readout line OLO[1:0], the readout line OLO[3:2], the readout line OLO[5:4], and the readout line OLO[7:6] to be connected to the edge detection unit 503 based on the value of the output signal DO[1], the output signal DO[3], the output signal DO[5] and the output signal DO[7].

A timing at which the latch clock LATCLK is inverted in state No 11 is illustrated in FIG. 14A, and a timing at which the latch clock LATCLK is inverted in state No 14 is illustrated in FIG. 14B. A timing chart of the operation of the data processing circuit 500 corresponding to FIG. 14A is illustrated in FIG. 15A, and a timing chart of the operation of the data processing circuit 500 corresponding to FIG. 14B is illustrated in FIG. 15B.

In state No 11 illustrated in FIG. 14A, a value of the output signal DO[3] of the latch circuit LO[3] and a value of the output signal DO[7] of the latch circuit LO[7] at a timing at which the latch clock LATCLK is inverted (falls) are both "1." Therefore, the EXOR circuit 52 outputs "low"="0" to the operational result DX0 as a result of performing the EXOR operation of the value of the output signal DO[3] and the value of the output signal DO[7]. Accordingly, the switch 54 selects the output signal DO[1] and outputs the selected output signal DO[1] to the EXOR circuit 53. A value of the output signal DO[1] of the latch circuit LO[1] at a timing at which the latch clock LATCLK is inverted (falls) is "0." Therefore, the EXOR circuit 53 outputs "high"="1" to the operational result DX1 as a result of performing the EXOR operation of the value of the output signal DO[7] and the value of the output signal DO[1] input from the switch 54. Accordingly, the switch group 5022 selects the readout line OLO[2], the readout line OLO[6], the readout line OLO[3], and the readout line OLO[7], and connects the respective selected readout lines OLO to the switch group 5021. Since the operational result DX0 output by the EXOR circuit 52 is "low"="0," the switch group 5021 selects the readout line OLO[2] and the readout line OLO[3] and connects the selected readout line OLO[3:2] to the edge detection unit 503. Accordingly, the data selection unit 502 outputs the output signal DO[3:2]="10" latched in the latch circuit LO[3:2] in the latch unit group LU[2] to the edge detection unit 503. Since the value of the output signal DO[7] of the latch circuit LO[7] at a timing of the falling edge of the latch clock LATCLK is "1," the switch 5032 selects the clock FCLK indicating the timing of the falling edge of the multi-phase clock DU included in the output signal DO[3:2].

Also, the output signal DO[3:2] is output to the readout line OLO[3:2] based on the readout switch signals SW1 and SW2, as illustrated in FIG. 15A. In this case, the AND gate 5031 generating the clock FCLK in the edge detection unit 503 generates the clock FCLK based on the signal of the connected readout line OLO[3:2]. As illustrated in FIG. 15A, since the output signal DO[3:2] in state No 11 is "10," the clock FCLK that is "high" when the output signal DO[2] is output to the line OLO[2] and the output signal DO[3] is output to the readout line OLO[3] (at a timing A illustrated in FIG. 15A) is generated by the AND gate 5031.

Also, the encoder 55 initiates generation of the count clock CNTCLK when the clock FCLK is input. When the output signal DO[3:0]="10," the encoder 55 generates the count clock CNTCLK that becomes "high" once when the output signal 10[3:2] is read, as illustrated in FIG. 15A.

The lower counter 56 generates the binarized 1-bit digital signal DOUT[0]="1" by counting the number of instances of "high" of the count clock CNTCLK. The digital generation unit 504 outputs the output signal DO[7]="1" output from the latch portion 501 as the digital signal DOUT[3], the operational result DX0="0" of the EXOR in the EXOR circuit 52 input from the data selection unit 502 as the digital signal DOUT[2], and the operational result DX1="1" of the EXOR in the EXOR circuit 53 input from the data selection unit 502 as the digital signal DOUT[1]. Thus, the data processing circuit 500 generates and outputs the digital signal DOUT[3:0]="1011" ("11" in decimal notation) as the 4-bit digital signal obtained by binarizing the states of the phases of the multi-phase clock DU of eight phases in state No 11.

In state No 14 illustrated in FIG. 14B, the value of the output signal DO[3] of the latch circuit LO[3] is "0" and the value of the output signal DO[7] of the latch circuit LO[7] is "1" at a timing of the falling edge of the latch clock LATCLK. Therefore, the EXOR circuit 52 outputs "high"="1" to the operational result DX0 as a result of performing the EXOR operation of the value of the output signal DO[3] and the value of the output signal DO[7]. Accordingly, the switch 54 selects the output signal DO[5] and outputs the selected output signal DO[5] to the EXOR circuit 53. The value of the output signal DO[5] of the latch circuit LO[5] at a timing of the falling edge of the latch clock LATCLK is "0." Therefore, the EXOR circuit 53 outputs "high"="1" to the operational result DX1 as the result of performing the EXOR operation of the value of the output signal DO[7] and the value of the output signal DO[5] input from switch 54. Accordingly, the switch group 5022 selects the readout line OLO[2], the readout line OLO[6], the readout line OLO[3] and the readout line OLO[7], and connects the respective selected readout lines OLO to the switch group 5021. Since the operational result DX0 output by the EXOR circuit 52 is "high"="1," the switch group 5021 selects the readout line OLO[6] and the readout line OLO[7] and connects the selected readout line OLO[7:6] to the edge detection unit 503. Accordingly, the data selection unit 502 outputs the output signal DO[7:6]="11" latched in the latch circuit LO[7:6] in the latch unit group LU[4] to the edge detection unit 503. Since the value of the output signal DO[7] of the latch circuit LO[7] at a timing of the falling edge of the latch clock LATCLK is "1," the switch 5032 selects the clock FCLK indicating a timing of the falling edge of the multi-phase clock DU included in the output signal DO[7:6].

Also, the output signal DO[7:6] is output to the readout line OLO[7:6] based on the readout switch signals SW1 and SW2, as illustrated in FIG. 15B. In this case, the AND gate 5031 generating the clock FCLK in the edge detection unit 503 generates the clock FCLK based on the signal of the connected readout line OLO[7:6]. As illustrated in FIG. 15B, since the output signal DO[7:6] in state No 14 is "11," the clock FCLK that becomes "low" when the output signal DO[6] is output to the readout line OLO[6] and the output signal DO[7] is output to the readout line OLO[7] (at a timing B illustrated in FIG. 15B) is generated by the AND gate 5031.

Also, the encoder 55 initiates generation of the count clock CNTCLK when the clock FCLK is input, similar to state No 11 illustrated in FIG. 15A, but when the output signal DO[7:6]="11," the "high" clock FCLK is not input to the encoder 55. Therefore, in the encoder 55, when the output signal DO[7:6] is read, the count clock CNTCLK does not become "high" once and remains "low," as illustrated in FIG. 15B.

Therefore, a count of the number of instances of "high" of the count clock CNTCLK in the lower counter 56 is 0, and the lower counter 56 generates the binarized 1-bit digital signal DOUT[0]="0." The digital generation unit 504 outputs the output signal DO[7] . . . "1" output from the latch portion 501 as the digital signal DOUT[3], the operational result DX0="1" of the EXOR in the EXOR circuit 52 input from the data selection unit 502 as the digital signal DOUT[2], and the operational result DX1="1" of the EXOR in the EXOR circuit 53 input from the data selection unit 502 as the digital signal DOUT[1]. Thus, the data processing circuit 500 generates and outputs the digital signal DOUT[3:0]="1110" ("14" in decimal notation) as the 4-bit digital signal obtained by binarizing the states of the phases of the multi-phase clock DU of eight phases in state No 14.

Thus, the data processing circuit 500 selects the readout line OLO and the clock indicating the timing of the edge of the multi-phase clock DU used to generate the 1-bit digital signal DOUT[0], based on the state of the multi-phase clock DU[3] of the fourth phase, the state of the multi-phase clock DU[7] of the eighth phase, and the state of the multi-phase clock DU[1] of the second phase or the state of the multi-phase clock DU[5] of the sixth phase in the multi-phase clock DU of eight phases. Also, in the data processing circuit 500, the state of the multi-phase clock DU[7] of the eighth phase is the digital signal DOUT[3], the operational result DX0 of the EXOR circuit 52 performing the EXOR operation is the digital signal DOUT[2], the operational result DX1 of the EXOR circuit 53 performing the EXOR operation is the digital signal DOUT[1], and the digital signal DOUT[3], and the digital signal DOUT[2] and the digital signal DOUT[1] are combined with the digital signal DOUT[0], which are output as the 4-bit digital signal DOUT[3:0] obtained by digitizing (binarizing) the states of the phases of the multi-phase clock DU[7] of the eight phases.

While the cases of state No 11 and state No 14 have been described above, a total of sixteen digital signals DOUT[3:0] can be output in data processing of the data processing circuit 500 by considering the same in other state Nos.

Here, the sixteen digital signals DOUT[3:0] generated in data processing of the data processing circuit 500 will be described. FIG. 16 is a truth table indicating a relationship between the output of the latch circuit 51 and the output of each component included in the data processing circuit 500 of the fifth embodiment. In FIG. 16, a relationship among the output signal DO of the latch circuit 51, the states of the switch 54, the switch group 5021 and the switch group 5022 in the data selection unit 502, the state of the switch 5032 in the edge detection unit 503, and the digital signal DOUT[3:0] in each of a total of sixteen states of the multi-phase clock DU[7:0] input to the data processing circuit 500 is illustrated.

The state of the switch 5032 in the edge detection unit 503 may be divided into two states based on the value of the output signal DO[7] of the latch circuit 51, as illustrated in FIG. 16. The state of the switch 54 in the data selection unit 502 may be divided into two states based on the value of the output signal DO[3] and the value of the output signal DO[7] of the latch circuit 51. The state of the switch group 5021 and the switch group 5022 in the data selection unit 502 may be divided into four states based on the value of the output signal DO[3], the value of the output signal DO[7], and the value of the output signal DO[1] or the value of the output signal DO[5] of the latch circuit 51. In other words, each state of the data processing in the data processing circuit 500 may be divided into eight states based on the state of the switch 5032 in the edge detection unit 503 and each state of the switch 54, the switch group 5021 and the switch group 5022 in the data selection unit 502. Also, from these eight states, each of sixteen states in the multi-phase clock DU[7:0] can be identified.

For example, in state No 11 illustrated in FIGS. 14A and 15A, the switch group 5021 in the data selection unit 502 is "low"="0." the switch group 5022 is "high"="1," and the switch 5032 in the edge detection unit 503 is "high"="1" based on the output signal DO[0]="0," the output signal DO[3]="1" and the output signal DO[7]="1" of the latch circuit 51. Accordingly, the data selection unit 502 connects the readout line OLO[3:2] to the edge detection unit 503, and the edge detection unit 503 outputs the clock FCLK indicating the timing of the falling edge of the multi-phase clock DU included in the signal of the connected readout line OLO[3:2]. Accordingly, the digital generation unit 504 outputs the digital signal DOUT[3:0]="1011" ("11" in decimal notation).

As described above, in the data processing circuit 500 of the fifth embodiment, the number of latch unit groups 5011 has increased in comparison with the data processing circuit 100 of the first embodiment. Accordingly, the operation state of the data processing circuit 500 may be divided into eight states, which are more than those of the data processing circuit 100 of the first embodiment, based on the state of the switch 5032 in the edge detection unit 503 and each state of the switch 54, the switch group 5021 and the switch group 5022 in the data selection unit 502, as illustrated in FIG. 16. Accordingly, a total of sixteen states of the multi-phase clock DU[7:0] to be input to the data processing circuit 500 may be isolated into sets of two states. Therefore, in the data processing circuit 500 of the fifth embodiment, the latch portion 501 may output only an output signal DO of any 2 bits of the output signal DO[1:0], the output signal DO[3:2], the output signal DO[5:4] or the output signal DO[7:6] latched in the respective latch circuits 51 included in the latch unit group 5011. Accordingly, in the data processing circuit 100 of the first embodiment, the three readout switch signals SW1 and the three readout switch signals SW2 are necessary whereas, in the data processing circuit 500 of the fifth embodiment, the number of readout switch signals SW1 and the number of readout switch signals SW2 can be reduced by 2, and one readout switch signal SW1 and one readout switch signal SW2 are necessary.

Accordingly in the data processing circuit 500 of the fifth embodiment, as illustrated in FIGS. 15A and 15B, for example, if the clock is converted into a master clock MCLK, all 2 bits of the output signal DO can be read in a time corresponding to 5 clocks, and a time can be shortened to a time corresponding to 6 clocks in comparison with the time corresponding to 11 clocks, which is a time necessary for the data processing circuit 100 of the first embodiment to read all 4 bits of the output signal DO.

Thus, in the data processing circuit 500 of the fifth embodiment, it is possible to shorten a data processing time in comparison with the conventional data processing circuit 900 without sacrificing performance of outputting the 4-bit digital signal DOUT[3:0] indicating a total of sixteen states of phases of the multi-phase clock DU input to the data processing circuit 500, similar to the conventional data processing circuit 900 illustrated in FIG. 20. In the data processing circuit 500 of the fifth embodiment, since it is possible to reduce the number of latch circuits 51 and the number of readout switch signals SW1 and SW2, it is possible to reduce a circuit scale of the data processing circuit 500 itself in comparison with the conventional data processing circuit 900, similar to the data processing circuit 100 of the first embodiment.

In the data processing circuit 500 of the fifth embodiment, the upper 3 bits (the digital signal DOUT[3:1]) or all bits (the digital signal DOUT[3:0]) in the 4-bit digital signal DOUT [3:0] can be determined based on the signal output from the latch portion 501 or the operational result of the logic operation. Accordingly, in the data processing circuit 500 of the fifth embodiment, the number of bits of the lower counter 56 counting the number of times of "high" of the count clock CNTCLK can be reduced by 3 bits in comparison with the 4 bits of the conventional data processing circuit 900. Alternatively, a configuration in which the lower counter 56 is not included may be adopted. Accordingly, in the data processing circuit 500 of the fifth embodiment, the lower counter 56 can be changed from a 4-bit counter to a 1-bit counter or the edge detection unit 503, the encoder 55 and the lower counter 56 can be omitted, and a circuit scale or power consumption of the data processing circuit 500 itself can be reduced in comparison with the conventional data processing circuit 900.

Sixth Embodiment

Figure 17:
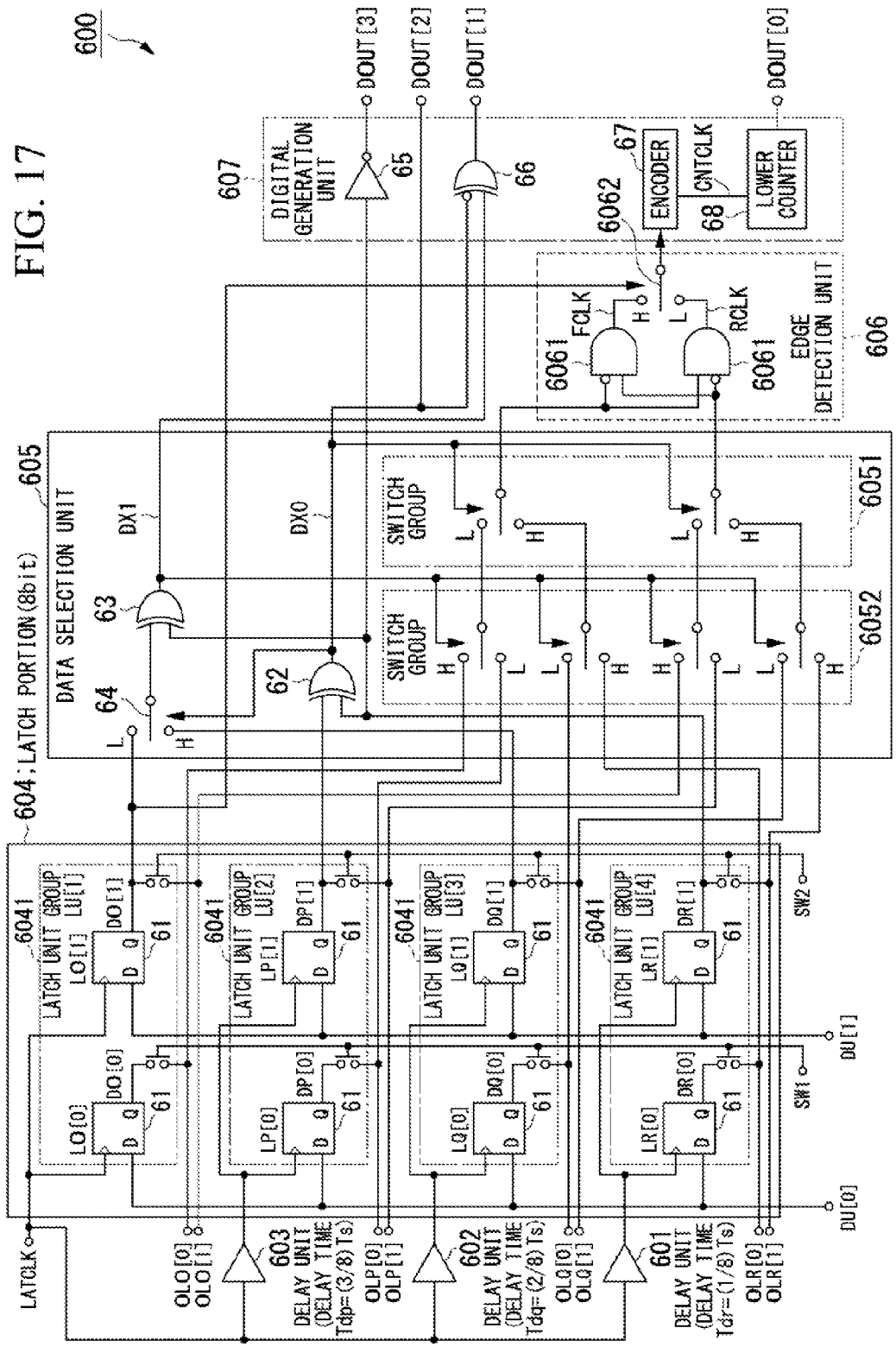
FIG. 17 is a block diagram illustrating a schematic configuration of a data processing circuit in a sixth embodiment of the present invention.

Next, a sixth embodiment of the present invention will be described. FIG. 17 is a block diagram illustrating a schematic configuration of a data processing circuit in the sixth embodiment. A data processing circuit 600 illustrated in FIG. 17 includes a delay unit 601, a delay unit 602, a delay unit 603, a latch portion 604, a data selection unit 605, an edge detection unit 606, and a digital generation unit 607. The data processing circuit 600 illustrated in FIG. 17 is a data processing circuit that holds states of phases of a multi-phase clock DU of 2 phases in the latch portion 604 using four latch unit groups at a predetermined timing, e.g., a timing at which a comparator (not illustrated) has completed a comparison process and digitizes the held states of the phases of the multi-phase clock DU using the digital generation unit 607 to generate a binarized 4-bit digital signal DOUT[3:0] and output the signal.

The data processing circuit 600 illustrated in FIG. 17 is a data processing circuit that realizes an operation of generating and outputting the binarized 4-bit digital signal DOUT[3:0] similar to the data processing circuit 200 of the second embodiment illustrated in FIG. 5, by increasing the number of latch unit groups and using four latch unit groups.

Each of the delay unit 601, the delay unit 602 and the delay unit 603 is a circuit that generates a latch clock DLYCLK obtained by delaying a latch clock LATCLK by a certain delay time Td determined in advance and outputs the generated latch clock DLYCLK to the latch portion 604. The delay time Td by which each of the delay unit 601, the delay unit 602 and the delay unit 603 delays the latch clock LATCLK is determined based on the number of latch unit groups included in the latch portion 604, the number of latch circuits included in each latch unit group, and the number of states indicated by the digital signal output by the data processing circuit 600, similar to the delay unit 201 included in the data processing circuit 200 of the second embodiment. In the data processing circuit 600 of the sixth embodiment, when a period of a clock signal of each phase of the multi-phase clock DU is a period Ts, the delay time Td is Td=Ts/8, and the delay unit 601, the delay unit 602 and the delay unit 603 in which delay times corresponding to three stages corresponding to the number of four latch unit groups included in the latch portion 604 are set, i.e., which generate the latch clock DLYCLK sequentially delayed by the delay time Td, are included.

The latch portion 604 is a circuit that latches (holds) the state of the clock signal of each phase of the multi-phase clock DU of 2 phases, and includes, as latch unit groups, four (n=4) latch unit groups 6041 each including two latch circuits (latch units) 61. The latch portion 604 includes a switch corresponding to each latch circuit 61 in order to read the state of the clock signal of each phase of the multi-phase clock DU of 2 phases latched in each latch circuit 61 included in the latch portion 604. In FIG. 17, "LU" is given as a reference sign of the latch unit group 6041. "LO," "LP," "LQ" or "LR" are given as reference signs of the latch circuits 61, and a bit of each of the latch unit groups 6041 and the latch circuit 61 is indicated by a number in "[ ]: brackets" subsequent to each reference sign, similar to the data processing circuit 200 of the second embodiment.

More specifically, the latch portion 604 includes a latch unit group LU[1], a latch unit group LU[2], a latch unit group LU[3], and a latch unit group LU[4]. The latch unit group LU[1] includes two latch circuits LO[0] and LO[1], the latch unit group LU[2] includes two latch circuits LP[0] and LP[1], the latch unit group LU[3] includes two latch circuits LQ[0] and LQ[1], and the latch unit group LU[4] includes two latch circuits LR[0] and LR[1]. Each hit of the latch circuit LO[1: 0], the latch circuit LP[1:0], the latch circuit LQ[1:0] and the latch circuit LR[1:0] corresponds to a phase of the multi-phase clock DU[1:0] of 2 phases.

Each latch circuit 61 in the latch unit group 6041 latches a state of "high" or "low" of the clock signal of a phase of the corresponding multi-phase clock DLU at a timing of a falling edge of the latch clock LATCLK or a corresponding latch clock DLYCLK, similar to each latch circuit 21 of the latch portion 202 included in the data processing circuit 200 of the second embodiment. Also, each latch circuit 61 in the latch unit group 6041 outputs an output signal DO[1:0], an output signal DP[1:0], an output signal DQ[1:0 or an output signal DR[1:0] indicating the latched states of the phases of the multi-phase clock DU to any one of readout lines OLO[1:0], OLP(1:0]. OLO[1:0] and OLR[1:0] according to a timing of readout switch signals SW1 and SW2 corresponding to each latch circuit 61.

More specifically, the latch circuit LO[1:0] in the latch unit group LU[1] latches the state of the corresponding multi-phase clock DU[1:0], and outputs the latched output signal DO[1:0] to the readout line OLO[1:0]. The latch circuit LP[1: 0] in the latch unit group LU[2] latches the state of the corresponding multi-phase clock DU[1:0] and outputs the latched output signal DP[1:0] to the readout line OLP[1:0]. The latch circuit LQ[1:0] in the latch unit group LU[3] latches the state of the corresponding multi-phase clock DU[1:0] and outputs the latched output signal DQ [1:0] to the readout line OLQ[1:0]. The latch circuit LR[1:0] in the latch unit group LU[4] latches the state of the corresponding multi-phase clock DU[1:0] and outputs the latched output signal DR[1:0] to the readout line OLR[1:0].

Here, the delay time Td by which each of the delay unit 601, the delay unit 602 and the delay unit 603 delays the latch clock LATCLK will be described. In the data processing circuit 600 of the sixth embodiment, since the number of latch unit groups 6041 included in the latch portion 604 is 4, the number of latch circuits 61 included in each latch unit group 6041 is 2, and the data processing circuit 600 outputs the 4-bit digital signal DOUT[3:0] as described above, the number of states indicated by the digital signal DOUT[3:0] is 16. Therefore, the delay time Td is Td=Ts×2/16=Ts/8 under consideration similar to the delay time Td of the data processing circuit 200 of the second embodiment. Also, the latch clocks DLYCLK sequentially delayed by the set delay time Td (=Ts/

8) are prepared by the number of latch unit groups 6041 included in the latch portion 604 minus 1 stage. i.e., 4−1=3 stages.

In the data processing circuit 600 of the sixth embodiment, the delay unit 601 is a delay unit of a first stage and corresponds to the latch circuit LR[1:0], the delay unit 602 is a delay unit of a second stage and corresponds to the latch circuit LQ[1:0], and the delay unit 603 is a delay unit of a third stage and corresponds to the latch circuit LP[1:0]. Therefore, in the data processing circuit 600 of the sixth embodiment, a delay time Tdr of the first stage of the delay unit 601 corresponding to the latch circuit LR[1:0] is 1 stage×Ts/8=(⅛) Ts. A delay time Tdq of the second stage of the delay unit 602 corresponding to the latch circuit LQ[1:0] is 2 stages×Ts/8= (2/8) Ts. A delay time Tdp of the third stage of the delay unit 603 corresponding to the latch circuit LP[1:0] is 3 stages×Ts/8=(3/8) Ts.

The data selection unit 605 is a circuit which selects a signal of 2 bits of any one of the output signal DO[1:0] output to the readout line OLO[1:0], the output signal DP[1:0] output to the readout line OLP[1:0], the output signal DQ [1:0] output to the readout line OLQ[1:0] and the output signal DR[1:0] output to the readout line OLR[1:0] from the respective latch unit groups 6041 included in the latch portion 604. The data selection unit 605 includes an EXOR circuit 62 and an EXOR circuit 63 that perform an EXOR operation, a switch 64, a switch group 6051 including two switches, and a switch group 6052 including four switches. The data selection unit 605 outputs an output signal of any 2 bits of the output signal DO [1:0] of each latch circuit 61 in the latch unit group LU[1], the output signal DP [1:0] of each latch circuit 61 in the latch unit group LU[2], the output signal DQ [1:0] of each latch circuit 61 in the latch unit group LU[3] or the output signal DR[1:0] of each latch circuit 61 in the latch unit group LU[4] by selecting any one of the readout line OLO[1:0], the readout line OLP[1:0], the readout line OLQ[1:0] and the readout line OLR[1:0].

The selection of the output signal DO, DP, DQ or DR to be output to the edge detection unit 606 by the data selection unit 605 is performed based on a value of the output signal DP[1] of the latch circuit LP[1] in the latch unit group LU[2], a value of the output signal DR[1] of the latch circuit LR[1] in the latch unit group LU[4], a value of the output signal DO[1] of the latch circuit LO[1] in the latch unit group LU[1] or a value of the output signal DQ [1] of the latch circuit LQ[1] in the latch unit group LU[3].

In the configuration of the data selection unit 605 illustrated in FIG. 17, the output signal DO, DP, DQ or DR to be output to the edge detection unit 606 is selected by the respective components performing the following operation. The EXOR circuit 62 performs the EXOR operation of the value of the output signal DP[1] and the value of the output signal DR[1] and outputs a result thereof to the switch 64 and the switch group 6051 as an operational result DX0. The switch 64 selects any one of the output signal DO[1] and the output signal DQ [1] based on the operational result DX0 input from the EXOR circuit 62, and outputs the selected output signal to the EXOR circuit 63. The EXOR circuit 63 performs the EXOR operation of the value of the output signal input from the switch 64 and the value of the output signal DR[1] and outputs a result thereof to the switch group 6052 as an operational result DX1. The switch group 6052 selects any one of the readout line OLO[0] and the readout line OLP[0], any one of the readout line OLQ[0] and the readout line OLR[0], any one of the readout line OLO[1] and the readout line OLP[1], and any one of the readout line OLQ[1] and the readout line OLR[1] to connect the respective selected readout lines to the switch group 6051 based on the operational result DX1 input from the EXOR circuit 63. The switch group 6051 further selects each of the readout lines connected to the switch group 6052 to connect the readout line of any 2 bits of the readout line OLO[1:0], the readout line OLP[1:0], the readout line OLQ[1:0] and the readout line OLR[1:0] to the edge detection unit 606, based on the operational result DX0 input from the EXOR circuit 62.

The data selection unit 605 outputs each of the operational result DX0 and the operational result DX1 which are results of performing the EXOR operation in the EXOR circuit 62 and the EXOR circuit 63 to the digital generation unit 607.

The edge detection unit 606 is a circuit that detects a timing of a rising edge and a falling edge of the multi-phase clock DU based on the signal of any one of the readout lines OLO. OLP, OLQ and OLR connected to the data selection unit 605, and includes two AND gates 6061 that perform an OR operation, and a switch 6062. The edge detection unit 606 outputs any one of a signal indicating a timing of the rising edge of the multi-phase clock DU included in the output signal DO[1:0], the output signal DP[1:0], the output signal DQ [1:0] or the output signal DR[1:0] input from the data selection unit 605 and a signal indicating a timing of the falling edge of the multi-phase clock DU to the digital generation unit 607 based on the value of the output signal DO[1] of the latch circuit LO[1] in the latch unit group LU[1].

In other words, in the edge detection unit 606, the switch 6062 selects, based on the value of the output signal DO[1], any one of the clock RCLK and the clock FCLK] generated by the respective AND gates 6061 based on the signal of any one of the connected readout lines OLO, OLP, OLQ and OLR, and outputs the selected clock to the digital generation unit 607. In other words, the edge detection unit 606 outputs the clock FCLK to the digital generation unit 607 when the value of the output signal DO[1] is "low" and outputs the clock RCLK to the digital generation unit 607 when the value of the output signal DR[1] is "high."

The digital generation unit 607 is a circuit that binarizes the state of the phase of the multi-phase clock DU at a predetermined timing to generate a 4-bit digital signal DOUT[3:0] based on the signal indicating the timing of the rising edge or the falling edge of the multi-phase clock DU input from the edge detection unit 606, and includes, for example, a NOT circuit 65 that inverts a logic, an EXOR circuit 66 that performs an EXOR operation, an encoder 67, and a lower counter 68. In the digital generation unit 607 illustrated in FIG. 17, the digital signal DOUT[3] is generated by inverting a logic of the output signal DR[1] output from the latch portion 604 using the NOT circuit 65, and the digital signal DOUT[2] is generated by the operational result DX0 input from the data selection unit 605. The digital signal DOUT[1] is generated by performing an EXOR operation of a value obtained by inverting the operational result DX0 input from the data selection unit 605 and a value of the operational result DX1 using the EXOR circuit 66. The digital signal DOUT[0] is generated by the encoder 67 and the lower counter 68.

The encoder 67 includes a general logic circuit, and generates a count clock CNTCLK to be counted by the lower counter 68 according to the signal indicating the timing of the rising edge or the falling edge of the multi-phase clock DU input from the edge detection unit 606.

The lower counter 68 generates a binarized 1-bit digital signal DOUT[0] by counting the number of instances of "high" of the count clock CNTCLK. The encoder 67 and the lower counter 68 differ from the conventional data processing circuit (e.g., the encoder 92 and the lower counter 93 illustrated in FIG. 20) in the number of bits of the generated digital signal DOUT, but perform the same operation as the conventional data processing circuit.

Through such a configuration, the data processing circuit 600 generates the binarized 4-bit digital signal DOUT[3:0] by digitizing the states of the phases of the multi-phase clock DU of 2 phases.

The case in which the EXOR circuit 62, the EXOR circuit 63, the switch 64, the switch group 6051, and the switch group 6052 are included as a configuration in which the data selection unit 605 selects the readout line to be connected to the edge detection unit 606 has been described in the data processing circuit 600 of the sixth embodiment. However, a configuration of selecting the readout line OLO to be connected to the edge detection unit 606 is not limited to the configuration described above and may be any configuration. For example, in the switch group 6051 and the switch group 6052, a function is realized using the six switches each selecting one output from two inputs, but a configuration for realizing the same function using two switches each selecting one output from four inputs may be adopted.

While the configuration when the digital generation unit 607 generates the digital signal DOUT[0] using the encoder 67 and the lower counter 68 has been shown in the data processing circuit 600 of the sixth embodiment, a configuration for generating the digital signal DOUT[0] is not limited to the configuration described above and the digital signal DOUT[0] may be generated using any configuration or method. For example, a configuration for generating the digital signal DOUT[0] through a logic operation, similar to the digital signal DOUT[3:1], may be adopted.

Next, a data processing method when the data processing circuit 600 of the sixth embodiment generates the digital signal DOUT[3:0] will be described. A timing of the multi-phase clock DU and the latch clocks LATCLK and DLYCLK input to the data processing circuit 600 of the sixth embodiment and a timing of the operation of binarizing the states of the phases of the multi-phase clock DU in the data processing circuit 600 of the sixth embodiment may be considered similarly to the respective timing charts of the data processing circuit 200 of the second embodiment illustrated in FIGS. 6A and 6B and FIGS. 7A and 7B. Therefore, a detailed description of the timing of the multi-phase clock DU and the latch clocks LATCLK and DLYCLK and the timing of the operation of binarizing the states of phases of the multi-phase clock DU in the data processing circuit 600 of the sixth embodiment is omitted and the sixteen digital signals DOUT[3:0] generated in data processing of the data processing circuit 600 will be described.

FIG. 18 is a truth table indicating a relationship between the output of the latch circuit 61 and the output of each component included in the data processing circuit 600 of the sixth embodiment. In FIG. 18, a relationship among the output signal DO, the output signal DP, the output signal DQ and the output signal DR of the latch circuit 61, states of the switch 64, the switch group 6051 and the switch group 6052 in the data selection unit 605, a state of the switch 6062 in the edge detection unit 606, and the digital signal DOUT[3:0] in each of a total of sixteen states of the multi-phase clock DU[1:0] input to the data processing circuit 600 is illustrated.

The states of the switch 6062 in the edge detection unit 606 may be divided into two states based on the value of the output signal DO[1] of the latch circuit 61, as illustrated in FIG. 18. The states of the switch 64 in the data selection unit 605 may be divided into two states based on the value of the output signal DP[1] and the value of the output signal DR[1] of the latch circuit 61. The states of the switch group 6051 and the switch group 6052 in the data selection unit 605 may be divided into four states based on the value of the output signal DP[1], the value of the output signal DR[1] and the value of the output signal DO[1] or the value of the output signal DQ[1] of the latch circuit 61. In other words, each state of data processing in the data processing circuit 600 may be divided into eight states based on the state of the switch 6062 in the edge detection unit 606 and each state of the switch 64, the switch group 6051 and the switch group 6052 in the data selection unit 605. Also, from these eight states, the respective sixteen states in the multi-phase clock DU[1:0] can be identified.

For example, in state No 11, the switch group 6051 and the switch group 6052 in the data selection unit 605 are "low"="0" and the switch 6062 in the edge detection unit 606 is "low"="0" based on the output signal DO[1]="0," the output signal DP[1]="0," and the output signal DR[1]="0" of the latch circuit 61. Accordingly, the data selection unit 605 connects the readout line OLP[1:0] to the edge detection unit 606, and the edge detection unit 606 outputs the clock RCLK indicating the timing of the rising edge of the multi-phase clock DU included in the signal of the connected readout line OLP[1:0]. Accordingly, the digital generation unit 607 outputs the digital signal DOUT[3:0]; "1011" ("11" in decimal notation).

As described above, in the data processing circuit 600 of the sixth embodiment the number of latch unit groups 6041 is greater in comparison with the data processing circuit 200 of the second embodiment. Accordingly, the operation state of the data processing circuit 600 may be divided into eight states, which are more than those of the data processing circuit 200 of the second embodiment, based on the state of the switch 6062 in the edge detection unit 606 and each state of the switch 64, the switch group 6051 and the switch group 6052 in the data selection unit 605, as illustrated in FIG. 18. Accordingly, a total of sixteen states of the multi-phase clock DU[11:0] input to the data processing circuit 600 may be divided into sets of two states. Therefore, in the data processing circuit 600 of the sixth embodiment, the latch portion 604 may output only the output signal DO of any 2 bits of the output signal DO[1:0], the output signal DP[1:0], the output signal DQ[1:0] or the output signal DR[1:0] latched in the respective latch circuits 61 included in in the latch unit group 6041. Thus, in the data processing circuit 200 of the second embodiment, the three readout switch signals SW1 and the three readout switch signals SW2 are necessary whereas, in the data processing circuit 600 of the sixth embodiment, the number of readout switch signals SW1 and the number of readout switch signals SW2 can be reduced by 2, and one readout switch signal SW1 and one readout switch signal SW2 are necessary.

Accordingly, in the data processing circuit 600 of the sixth embodiment, an output signal of any 2 bits of the output signal DO, the output signal DP, the output signal DQ or the output signal DR can be read in a time shorter than the time necessary for the data processing circuit 200 of the second embodiment to read all 4 bits of the output signal DO or the output signal DP, and a data processing time can be shortened.

The data processing circuit 600 of the sixth embodiment includes the delay unit 601, the delay unit 602 and the delay unit 603. Accordingly, the number of phases of the multi-phase clock DU can be reduced to 2, which is ¼ of eight phases in the data processing circuit 500 of the fifth embodiment. Accordingly, in the data processing circuit 600 of the sixth embodiment, it is possible to facilitate generation of the multi-phase clock DU to be input to perform data processing and to support higher-speed data processing in comparison with the data processing circuit 500 of the fifth embodiment.

Thus, in the data processing circuit 600 of the sixth embodiment, it is possible to shorten a data processing time in comparison with the conventional data processing circuit 900 without sacrificing performance of outputting the 4-bit digital signal DOUT[3:0] indicating a total of sixteen states of the phases of the multi-phase clock DU input to the data processing circuit 600, similar to the conventional data processing circuit 900 illustrated in FIG. 20. In the data processing circuit 600 of the sixth embodiment, since it is possible to reduce the number of latch circuits 61 and the number of readout switch signals SW1 and SW2, it is possible to reduce a circuit scale of the data processing circuit 600 itself in comparison with the conventional data processing circuit 900, similar to the data processing circuit 200 of the second embodiment.

In the data processing circuit 600 of the sixth embodiment, upper 3 bits (the digital signal DOUT[3:1]) or all bits (the digital signal DOUT[3:0]) of the 4-bit digital signal DOUT [3:0] can be determined based on the signal output from the latch portion 604 or the operational result of the logic operation. Accordingly, in the data processing circuit 600 of the sixth embodiment, the number of bits of the lower counter 68 counting the number of instances of "high" of the count clock CNTCLK can be reduced by 3 in comparison with 4 bits of the conventional data processing circuit 900. Alternatively, a configuration in which the lower counter 68 is not included may be adopted. Accordingly, in the data processing circuit 600 of the sixth embodiment, the lower counter 68 can be changed from a 4-bit counter to a 1-bit counter or the edge detection unit 606, the encoder 67 and the lower counter 68 can be omitted, and a circuit scale or power consumption of the data processing circuit 600 itself can be reduced in comparison with the conventional data processing circuit 900.

As described above, in the data processing circuits of the first to sixth embodiments, a plurality of latch unit groups including the latch circuits included in the latch portion are configured. Also, the output signal indicating the state of the clock signal of each phase of the multi-phase clock DU can be read only from the latch circuit in any one of the latch unit groups by selecting the latch unit group. Accordingly, it is possible to shorten a time necessary for reading of the output signal used for the generation of the digital signal. Accordingly, in the data processing circuits of the first to sixth embodiments, it is possible to shorten a data processing time in comparison with a conventional data processing circuit in a state in which the same resolution as that of the digital signal generated by the conventional data processing circuit is secured.

It is possible to realize the A/D conversion circuit with high-speed analog-to-digital conversion in a state in which precision of the analog-to-digital conversion in the A/D conversion circuit is kept the same by adopting any one of the data processing circuits of the first to sixth embodiments in the A/D conversion circuit. It is possible to realize a higher-speed solid-state imaging device by including, in the solid-state imaging device, the A/D conversion circuit adopting any one of the data processing circuits of the first to sixth embodiments.

Seventh Embodiment

Figure 19:
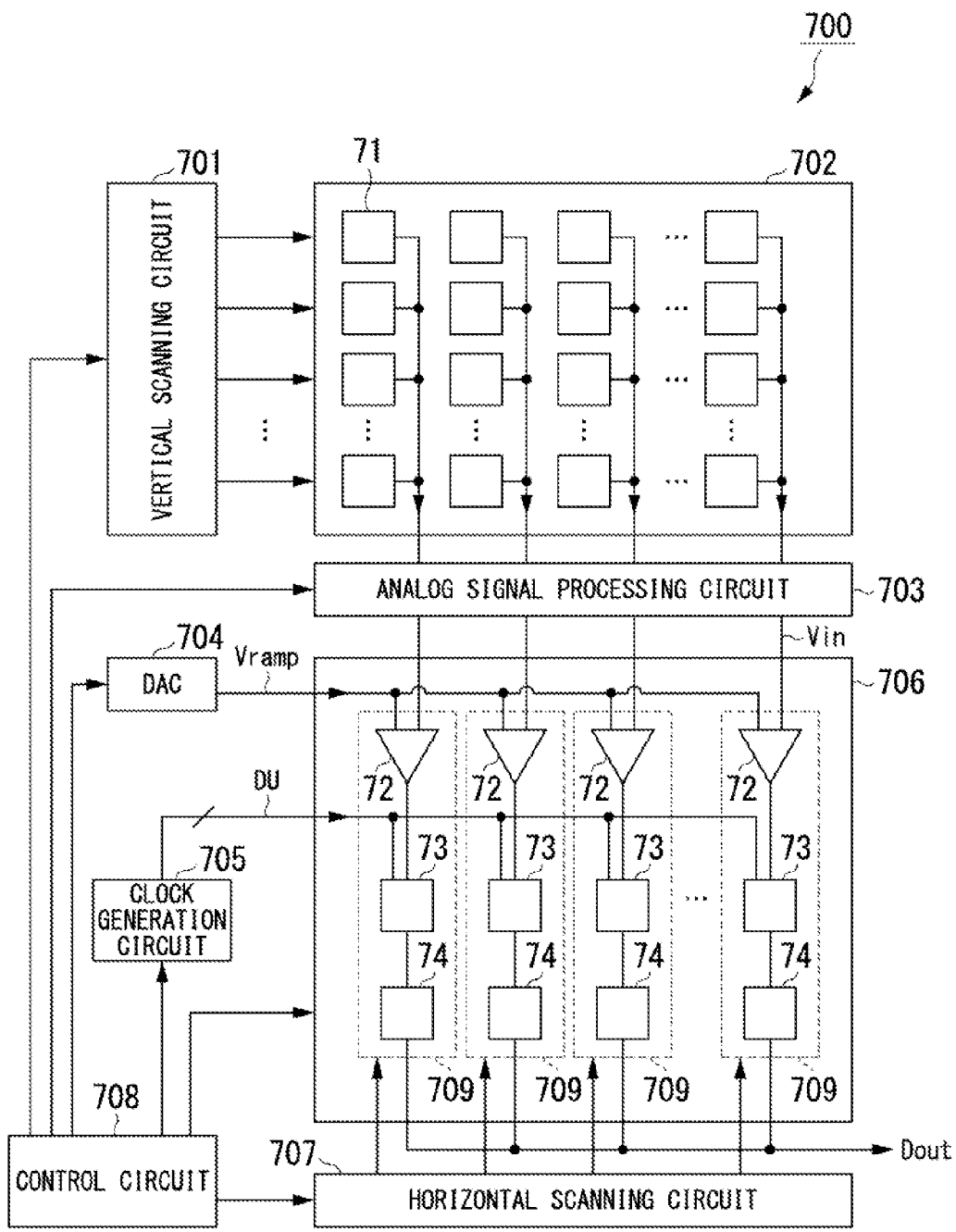
FIG. 19 is a block diagram illustrating a schematic configuration of a solid-state imaging device which includes an A/D conversion circuit including the data processing circuit in the embodiment of the present invention.

Next, a seventh embodiment of the present invention will be described. FIG. 19 is a block diagram illustrating a schematic configuration of a solid-state imaging device that includes an A/D conversion circuit including the data processing circuit in the embodiment of the present invention. A solid-state imaging device 700 illustrated in FIG. 19 includes a vertical scanning circuit 701, a pixel array unit 702, an analog signal processing circuit 703, a reference signal generation unit (hereinafter referred to as a "DAC") 704, a clock generation circuit 705, a column A/D) conversion circuit 706, a horizontal scanning circuit 707, and a control circuit 708.

The solid-state imaging device 700 removes a noise of an analog signal Vin output from each pixel 71 in the pixel array unit 702 using the analog signal processing circuit 703, performs analog-to-digital conversion using each analog-to-digital converter (hereinafter referred to as an "A/D conversion circuit") 709 included in the column A/D conversion circuit 706, and then sequentially outputs a conversion result as a digital signal Dout.

The vertical scanning circuit 701 selects the pixels 71 in the pixel array unit 702 in units of rows of the pixel array unit 702 according to a control signal input from the control circuit 708, and causes a photoelectric conversion signal generated by each pixel 71 of the selected row to be output to the analog signal processing circuit 703. In the following description, a period from selection of any row of the pixel array unit 702 to selection of a next row is referred to as a "horizontal period."

The pixel array unit 702 is a pixel array in which a plurality of pixels 71 are arranged two-dimensionally, i.e. in a row direction and a column direction. Each of the pixels 71 includes a photodiode, and the photodiode included in each pixel 71 generates a photoelectric conversion signal according to an amount of light incident within a certain accumulation time. Also, the pixel array unit 702 outputs the photoelectric conversion signal generated by the selected pixel 71 to the analog signal processing circuit 703 according to the selection of the vertical scanning circuit 701.

The analog signal processing circuit 703 performs noise removal to remove a reset noise and a 1/f noise from the photoelectric conversion signal input from the pixel array unit 702 according to a control signal input from the control circuit 708, and then amplifies the photoelectric conversion signal after the noise removal. The analog signal processing circuit 703 outputs the amplified photoelectric conversion signal (pixel signal) to the column A/D conversion circuit 706 as the analog signal Vin.

The DAC 704 generates a ramp wave Vramp which is a reference signal (analog signal) whose voltage value varies (increases or decreases) at a certain rate over time in each horizontal period according to a control signal input from the control circuit 708. Also, the DAC 704 outputs the generated ramp wave Vramp to the column A/D conversion circuit 706.

The clock generation circuit 705 generates a multi-phase clock DU used when the column A/D conversion circuit 706 performs analog-to-digital conversion. Also, the clock generation circuit 705 outputs the generated multi-phase clock DU to the column A/D conversion circuit 706.

The column A/D conversion circuit 706 includes a plurality of A/D conversion circuits 709 having the same configuration, each A/D conversion circuit includes a comparator 72, a digital signal generation circuit 73, and a memory 74, and the number of A/D conversion circuits is equal to the number of columns of the pixel array unit 702. Each A/D conversion circuit 709 corresponding to a column of the pixel array unit 702 performs analog-to-digital conversion on the analog signal Vin input in each horizontal period according to the control signal input from the control circuit 708, and sequentially outputs the digital signal Dout according to the size of the analog signal Vin.

The comparator 72 performs a comparison process of a voltage value of the analog signal Vin input from the analog signal processing circuit 703 and a voltage value of the ramp wave Vramp input from the DAC 704. In the comparison process of the comparator 72, a latch clock LATCLK indicating that the voltage value of the analog signal Vin and the voltage value of the ramp wave Vramp match, i.e., that the comparator 72 has completed the comparison process, is output at a timing at which the voltage values are the same value.

The digital signal generation circuit 73 generates the digital signal obtained by digitizing (binarizing) a time from a timing of an initial value of the ramp wave Vramp to a timing at which the comparison process is completed. The digital signal generation circuit 73 includes an upper counter (not illustrated) and a data processing circuit (not illustrated). The upper counter generates a signal of upper bits in the digital signal to be generated by the digital signal generation circuit 73. The data processing circuit generates a signal of lower bits in the digital signal to be generated by the digital signal generation circuit 73. The data processing circuit is any one of the data processing circuit 100 of the first embodiment, the data processing circuit 200 of the second embodiment, the data processing circuit 300 of the third embodiment, the data processing circuit 400 of the fourth embodiment, the data processing circuit 500 of the fifth embodiment and the data processing circuit 600 of the sixth embodiment.

The memory 74 holds the digital signal obtained by digitization in the digital signal generation circuit 73 and outputs the held digital signal as the digital signal Dout generated according to a size of the analog signal Vin input from the analog signal processing circuit 703.

The horizontal scanning circuit 707 selects the digital signal Dout subjected to the analog-to-digital conversion by the respective A/D conversion circuit 709 included in the column A/D conversion circuit 706, in units of rows of the pixel array unit 702, and sequentially outputs the selected digital signal Dout as the digital signal Dout corresponding to the amount of light incident on the solid-state imaging device 700.

Through such a configuration, in the solid-state imaging device 700, the analog signal processing circuit 703 performs various signal processing on the photoelectric conversion signal generated by each pixel 71 in the pixel array unit 702 to acquire the analog signal Vin. Then, the column A/D conversion circuit 706 performs the analog-to-digital conversion on the acquired analog signal Vin in units of rows to generate the digital signal Dout. Also, as the horizontal scanning circuit 707 sequentially outputs the digital signal Dout generated by the column A/D conversion circuit 706 every row, thereby outputting the digital signal Dout corresponding to all the pixels 71 in the pixel array unit 702.

As described above, in the solid-state imaging device 700 of the seventh embodiment, any one of the data processing circuits of the first to sixth embodiments is included as a data processing circuit that generates the signal of the lower bits of the digital signal Dout, in the digital signal generation circuit 73 in each A/D conversion circuit 709 included in the column A/D conversion circuit 706. Accordingly, the digital signal generation circuit 73 in each A/D conversion circuit 709 can generate the signal of the lower bits of digital signal Dout in a data processing time shorter than a conventional one in a state in which the same resolution as in a conventional one is secured, and the A/D conversion circuit 709 can shorten a time necessary for analog-to-digital conversion. Accordingly, in the solid-state imaging device 700 of the seventh embodiment, it is possible to shorten a time of data processing of generating the digital signal Dout corresponding to the amount of light incident on all the pixels 71 in comparison with a conventional solid-state imaging device including, in each column, an A/D conversion circuit adopting the conventional data processing circuit 900 illustrated in FIG. 20.

While the case in which a plurality of A/D conversion circuits 709 having the same configuration are arranged by the number of columns of the pixel array unit 702 in the column A/D conversion circuit 706 has been described in the solid-state imaging device 700 of the seventh embodiment, the arrangement of the A/D conversion circuits 709 included in the solid-state imaging device 700 is not limited to the arrangement of the solid-state imaging device 700 of the seventh embodiment. For example, a configuration in which one A/D conversion circuit 709 is arranged for a plurality of columns of the pixel array unit 702 may be adopted. In this case as well, it is possible to shorten a time for data processing of generating the digital signal Dout corresponding to the amount of light incident on all the pixels 71, similar to the solid-state imaging device 700 of the seventh embodiment.

As described above, according to the mode for carrying out the present invention, it is possible to shorten a time necessary for reading of the output signal used for generation of the digital signal by configuring a plurality of latch unit groups each including a plurality of latch circuits (latch units) included in the latch portion of the data processing circuit and selecting any one of the latch unit groups when the digital signal is generated. Accordingly, in the mode for carrying out the present invention, it is possible to shorten a time for data processing of generating the digital signal.

It is possible to shorten a time of data processing of the analog-to-digital conversion in the A/D conversion circuit by adopting the data processing circuit of the present invention in the A/D conversion circuit. It is possible to shorten the time for data processing of generating the digital signal corresponding to the amount of light incident on all the pixels 71 of the solid-state imaging device by including, in the solid-state imaging device, the A/D conversion circuit adopting the data processing circuit of the present invention.

In the present embodiment, the case in which the data processing circuit generates the 4-bit digital signal indicating sixteen states of phases of the multi-phase clock has been described. However, the number of bits of the digital signal generated by the data processing circuit is not limited to the mode for carrying out the present invention and the concept of the present invention may be applied even when the data processing circuit generates a digital signal having a different number of bits.

In the present embodiment the example of the configuration of the solid-state imaging device 700 having the configuration in which the analog signal processing circuit 703 amplifies the photoelectric conversion signal after performing the noise removal on the photoelectric conversion signal input from the pixel array unit 702, and outputs the amplified photoelectric conversion signal to the column A/D conversion circuit 706 as the analog signal Vin has been described. However, the configuration of solid-state imaging device 700 is not limited to the mode for carrying out the present invention, and the concept of the present invention may be applied even in a solid-state imaging device having a configuration in which the pixel array unit 702 or each pixel 71 in the pixel array unit 702 outputs, to the column A/D conversion circuit 706, a photoelectric conversion signal subjected to noise removal and amplification as the analog signal Vin.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A data processing circuit that holds a state of a clock signal of each phase of an input multi-phase clock at a timing of an input latch clock, the multi-phase clock including clock signals of a plurality of phases sequentially shifted at certain intervals determined in advance, and generates a digital signal obtained by digitizing the states of the phases of the multi-phase clock at a timing at which the latch clock is input, the data processing circuit comprising:
a latch portion including n latch unit groups (n is an integer of a power of 2) including the same number and a plurality of latch units, each latch unit holding the state of the clock signal of the corresponding phase of the multi-phase clock and outputting an output signal indicating the held state of the clock signal;
a data selection unit that acquires the output signal output by at least one of the latch units in at least one of the latch unit groups included in the latch portion, and selects the latch unit group holding the states of the clock signals of a plurality of consecutive phases used for generation of the digital signal based on the acquired output signal; and
a digital generation unit that generates the digital signal based on the respective output signals output from the respective latch units included in the latch unit group selected by the data selection unit.

2. The data processing circuit according to claim 1, further comprising:
an edge detection unit that detects a timing of an edge at which the state of the clock signals of two adjacent phases in the multi-phase clock changes from a first state to a second state based on the respective output signals indicating the states of the clock signals of a plurality of consecutive phases sequentially output from the respective latch units included in the latch unit group selected by the data selection unit, and outputs a signal indicating the detected timing of the edge,
wherein the digital generation unit generates the digital signal based on the signal indicating the timing of the edge output from the edge detection unit.

3. The data processing circuit according to claim 1, wherein, in the latch portion,
the predetermined latch unit group holds the states of some of the clock signals of a plurality of consecutive phases in the multi-phase clock, and
the latch unit group different from the predetermined latch unit group holds states of the clock signals of the plurality of consecutive phases from the clock signals of the phases subsequent to the clock signal most delayed in phase whose state is held in the latch unit of a last stage included in the predetermined latch unit group.

4. The data processing circuit according to claim 2, wherein, in the latch portion,
the predetermined latch unit group holds the states of some of the clock signals of a plurality of consecutive phases in the multi-phase clock, and
the latch unit group different from the predetermined latch unit group holds states of the clock signals of the plurality of consecutive phases from the clock signals of the phases subsequent to the clock signal most delayed in phase whose state is held in the latch unit of a last stage included in the predetermined latch unit group.

5. The data processing circuit according to claim 3, wherein:
n is 2,
the latch portion includes a first latch unit group and a second latch unit group,
the first latch unit group holds states of one half of the clock signals of the plurality of consecutive phases in the multi-phase clock, and
the second latch unit group holds states of the other half of the clock signals of the plurality of consecutive phases in the multi-phase clock.

6. The data processing circuit according to claim 4, wherein:
n is 2,
the latch portion includes a first latch unit group and a second latch unit group,
the first latch unit group holds states of one half of the clock signals of the plurality of consecutive phases in the multi-phase clock, and
the second latch unit group holds states of the other half of the clock signals of the plurality of consecutive phases in the multi-phase clock.

7. The data processing circuit according to claim 1, further comprising:
(n−1) delay units that sequentially delay the latch clock by a certain delay time determined in advance based on the number of latch units included in the latch unit group and the number of states of phases of the multi-phase clock generated by the data processing circuit.

8. The data processing circuit according to claim 2, further comprising:
(n−1) delay units that sequentially delay the latch clock by a certain delay time determined in advance based on the number of latch units included in the latch unit group nd the number of states of phases of the multi-phase clock generated by the data processing circuit.

9. The data processing circuit according to claim 7, wherein, in the latch portion,
a first of the latch unit groups holds the states of the clock signals of all phases of the multi-phase clock at a timing of the latch clock, and
a second of the latch unit groups holds the states of the clock signals of all phases of the multi-phase clock at a timing of the latch clock delayed by the delay unit.

10. The data processing circuit according to claim 8, wherein, in the latch portion,
a first of the latch unit groups holds the states of the clock signals of all phases of the multi-phase clock at a timing of the latch clock, and
a second of the latch unit groups holds the states of the clock signals of all phases of the multi-phase clock at a timing of the latch clock delayed by the delay unit.

11. The data processing circuit according to claim 9, wherein:
n is 2,
the delay unit includes a first delay unit, and
when the delay time is Td,
the latch portion includes a first latch unit group and a second latch unit group,
the first latch unit group holds states of the clock signals of all phases of the multi-phase clock at a timing of the latch clock, and
the second latch unit group holds the states of the clock signals of all phases of the multi-phase clock at a timing of the latch clock delayed by Td by the first delay unit.

12. The data processing circuit according to claim 10, wherein:
n is 2,
the delay unit includes a first delay unit, and
when the delay time is Td,
the latch portion includes a first latch unit group and a second latch unit group,
the first latch unit group holds states of the clock signals of all phases of the multi-phase clock at a timing of the latch clock, and
the second latch unit group holds the states of the clock signals of all phases of the multi-phase clock at a timing of the latch clock delayed by Td by the first delay unit.

13. The data processing circuit according to claim 9, wherein:
n is 4,
the delay unit includes a first delay unit a second delay unit and a third delay unit, and
when the delay time is Td,
the latch portion includes a first latch unit group, a second latch unit group, a third latch unit group and a fourth latch unit group,
the first latch unit group holds the states of the clock signals of all phases of the multi-phase clock at a timing of the latch clock,
the second latch unit group holds the states of the clock signals of all phases of the multi-phase clock at a timing of the latch clock delayed by Td by the first delay unit,
the third latch unit group holds the states of the clock signals of all phases of the multi-phase clock at a timing of the latch clock delayed by 2Td by the second delay unit, and
the fourth latch unit group holds the states of the clock signals of all phases of the multi-phase clock at a timing of the latch clock delayed by 3Td by the third delay unit.

14. The data processing circuit according to claim 10, wherein:
n is 4,
the delay unit includes a first delay unit, a second delay unit and a third delay unit, and
when the delay time is Td,
the latch portion includes a first latch unit group, a second latch unit group, a third latch unit group and a fourth latch unit group,
the first latch unit group holds the states of the clock signals of all phases of the multi-phase clock at a timing of the latch clock,
the second latch unit group holds the states of the clock signals of all phases of the multi-phase clock at a timing of the latch clock delayed by Td by the first delay unit,
the third latch unit group holds the states of the clock signals of all phases of the multi-phase clock at a timing of the latch clock delayed by 2Td by the second delay unit, and
the fourth latch unit group holds the states of the clock signals of all phases of the multi-phase clock at a timing of the latch clock delayed by 3Td by the third delay unit.

15. A solid-state imaging device comprising:
a pixel unit in which a plurality of pixels are arranged in a two-dimensional matrix form, the pixels outputting photoelectric conversion signals corresponding to an amount of incident light;
a reference signal generation unit that generates a reference signal decreasing or increasing at a certain rate over time;
a clock generation unit that generates a multi-phase clock including clock signals of a plurality of phases sequentially shifted at certain intervals determined in advance; and
an analog-to-digital converter arranged in each column or plurality of columns of the pixel unit, an analog signal according to the photoelectric conversion signal output from the pixel of the corresponding column being input to the analog-to-digital converter every row of the pixel unit,
wherein the analog-to-digital converter includes
a comparison unit that compares the analog signal with the reference signal and outputs a latch clock at a timing at which a voltage value of the analog signal and a voltage value of the reference signal match; and
a data processing circuit that generates a digital signal obtaining by digitizing the states of the phases of the multi-phase clock at a timing at which the latch clock is input, and
the data processing circuit is a data processing circuit that holds a state of the clock signal of each phase of the input multi-phase clock at a timing of the input latch clock, the multi-phase clock including clock signals of a plurality of phases sequentially shifted at certain intervals determined in advance, and generates the digital signal obtained by digitizing the states of the phases of the multi-phase clock at a timing at which the latch clock is input, the data processing circuit comprising:
a latch portion including n latch unit groups (n is an integer of a power of 2) including the same number and a plurality of latch units, each latch unit holding the state of the clock signal of the corresponding phase of the multi-phase clock and outputting an output signal indicating the held state of the clock signal:
a data selection unit that acquires the output signal output by at least one of the latch units in at least one of the latch unit groups included in the latch portion, and selects the latch unit group holding the states of the clock signals of a plurality of consecutive phases used for generation of the digital signal based on the acquired output signal; and
a digital generation unit that generates the digital signal based on the respective output signals output from the respective latch units included in the latch unit group selected by the data selection unit.

* * * * *